United States Patent
Oh et al.

(10) Patent No.: US 11,355,451 B2
(45) Date of Patent: *Jun. 7, 2022

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Ji Hoon Oh, Gyeonggi-do (KR); Dong Hyun Bang, Incheon (KR); Soo Jin Shin, Gyeonggi-do (KR); Young Ik Kwon, Taichung (TW); Tae Kyeong Hwang, Seoul (KR); Min Jae Lee, Chandler, AZ (US); Min Jae Kong, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/002,607

(22) Filed: Aug. 25, 2020

(65) Prior Publication Data

US 2021/0066206 A1     Mar. 4, 2021

Related U.S. Application Data

(63) Continuation-in-part of application No. 16/553,986, filed on Aug. 28, 2019, now Pat. No. 11,004,801.

(51) Int. Cl.
*H01L 23/552* (2006.01)
*H01L 23/31* (2006.01)
(Continued)

(52) U.S. Cl.
CPC .......... *H01L 23/552* (2013.01); *H01L 21/561* (2013.01); *H01L 21/78* (2013.01);
(Continued)

(58) Field of Classification Search
CPC .... H01L 23/552; H01L 23/3128; H01L 21/78
See application file for complete search history.

(56) References Cited

U.S. PATENT DOCUMENTS 6,300,906 B1   10/2001   Rawnick et al.
7,099,686 B2    8/2006   Ro et al.
(Continued)

FOREIGN PATENT DOCUMENTS

CN    110112058 A    8/2019
CN    111834731 A    10/2020
(Continued)

OTHER PUBLICATIONS

International Search Report for Related PCT Application PCT/US2017/054662 filed Sep. 30, 2017 dated Jun. 29, 2018, 3 pages.

*Primary Examiner* — Anthony Ho
(74) *Attorney, Agent, or Firm* — Spectrum IP Law Group LLC

(57) ABSTRACT

In one example, a semiconductor device comprises a substrate comprising a conductive structure, a first electronic component over the substrate, an encapsulant over the substrate and contacting a lateral side of the first electronic component, a shield over the encapsulant and contacting a lateral side of the encapsulant and a portion of a lateral side of the substrate, and a communication structure coupled with the substrate. The substrate comprises a vertical groove side and a horizontal groove side defining a groove in the substrate, wherein a portion of the groove is uncovered by the shield. Other examples and related methods are also disclosed herein.

10 Claims, 45 Drawing Sheets

(51) Int. Cl.
*H01L 23/66* (2006.01)
*H01Q 1/22* (2006.01)
*H01L 21/56* (2006.01)
*H01L 21/78* (2006.01)
*H01L 25/10* (2006.01)

(52) U.S. Cl.
CPC .......... *H01L 23/3128* (2013.01); *H01L 23/66* (2013.01); *H01L 25/105* (2013.01); *H01Q 1/2283* (2013.01)

(56) References Cited

U.S. PATENT DOCUMENTS

| | | |
|---|---|---|
| 7,342,303 B1 | 3/2008 | Berry et al. |
| 7,388,552 B2 | 6/2008 | Mori |
| 7,545,329 B2 | 6/2009 | Gaucher et al. |
| 7,696,930 B2 | 4/2010 | Akkermans et al. |
| 7,965,252 B2 | 6/2011 | Shtrom et al. |
| 8,179,333 B2 | 5/2012 | Rajanish et al. |
| 8,314,749 B2 | 11/2012 | Shtrom et al. |
| 8,525,742 B2 | 9/2013 | Yang |
| 9,093,758 B2 | 7/2015 | Kish et al. |
| 9,287,633 B2 | 3/2016 | Tseng |
| 9,407,012 B2 | 8/2016 | Shtrom et al. |
| 9,461,367 B2 | 10/2016 | Romney et al. |
| 9,692,142 B2 | 6/2017 | Ek et al. |
| 9,698,487 B2 | 7/2017 | Sudo et al. |
| 9,716,316 B2 | 7/2017 | Park et al. |
| 9,819,098 B2 | 11/2017 | Gu et al. |
| 10,135,149 B2 | 11/2018 | Zhou |
| 10,498,025 B2 | 12/2019 | Mizunuma et al. |
| 10,594,019 B2 | 3/2020 | Baks et al. |
| 10,741,932 B2 | 8/2020 | Thai et al. |
| 11,004,801 B2 * | 5/2021 | Oh ........................ H01L 23/552 |
| 2014/0266973 A1 | 9/2014 | Devries et al. |
| 2017/0033009 A1 | 2/2017 | Scanlan et al. |
| 2018/0286816 A1 | 10/2018 | Kitazaki et al. |
| 2018/0286817 A1 | 10/2018 | Kitazaki et al. |
| 2018/0308756 A1 | 10/2018 | Kim et al. |
| 2019/0103682 A1 | 4/2019 | Thai et al. |
| 2019/0115305 A1 | 4/2019 | Lin |
| 2019/0148270 A1 | 5/2019 | Rivera-Marty |
| 2019/0379130 A1 | 12/2019 | Kang et al. |

FOREIGN PATENT DOCUMENTS

| | | |
|---|---|---|
| EP | 1782499 B1 | 9/2013 |
| EP | 3401998 B1 | 5/2020 |
| JP | H07203514 A | 8/1995 |
| JP | 4109629 B2 | 7/2008 |
| JP | 5166070 B2 | 3/2013 |
| JP | 5413921 B2 | 2/2014 |
| JP | 5725571 B2 | 5/2015 |
| KR | 101543648 B1 | 8/2015 |
| TW | I544682 B | 8/2016 |

\* cited by examiner

SEMICONDUCTOR DEVICES AND METHODS OF MANUFACTURING SEMICONDUCTOR DEVICES

CROSS-REFERENCE TO RELATED APPLICATIONS

The application is a continuation-in-part of application Ser. No. 16/553,986 filed Aug. 28, 2018, pending. Said application Ser. No. 16/553,986 is hereby incorporated herein by reference in its entirety.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
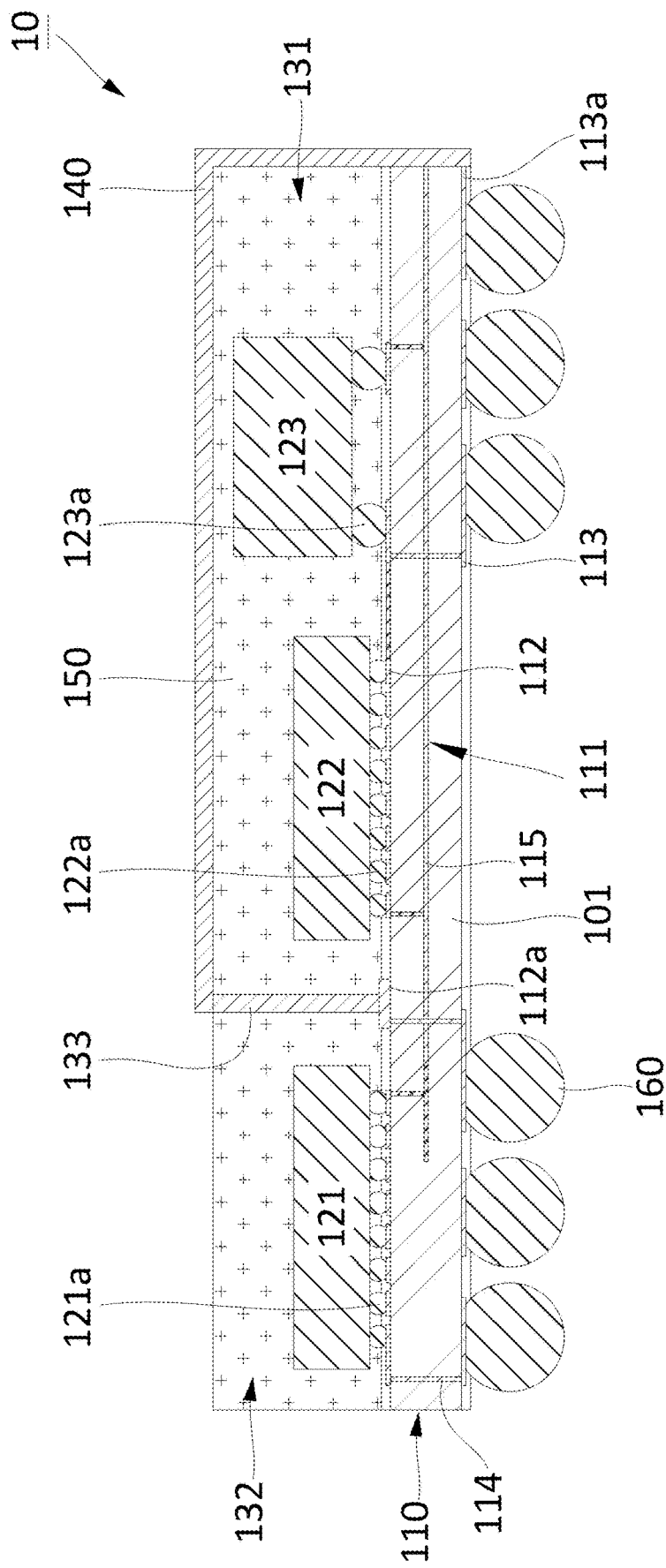
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), z), (x, y, z)\}$.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a substrate, a first electronic component on a top side of the substrate, a second electronic component on the top side of the substrate, an encapsulant on the top side of the substrate, contacting a lateral side of the first electronic component and a lateral side of the second electronic component, a conformal shield on a top side of the encapsulant over the first electronic component and having a side shield contacting a lateral side of the encapsulant, and a compartment wall between the first electronic component and the second electronic component and contacting the conformal shield to define a compartment containing the first electronic component and excluding the second electronic component.

In another example, a method to manufacture a semiconductor device comprises placing a first electronic component on a top side of a substrate, placing a second electronic component on the top side of the substrate, providing an encapsulant on the top side of the substrate, contacting a lateral side of the second electronic component, providing a cover over the first electronic component to define a first compartment containing the first electronic component, providing a conformal shield over the second electronic component to define a second compartment containing the second electronic component, and removing the cover from the first compartment, wherein the first electronic component is unshielded and the second electronic component is shielded by the conformal.

In a further example, a semiconductor device comprises a substrate, a first electronic component on a top side of the substrate, a second electronic component on the top side of the substrate, an encapsulant on the top side of the substrate contacting a lateral side of the first electronic component, and a conformal shield on a top side of the encapsulant over the first electronic component. The conformal shield comprises a first side shield between the first electronic device and the second electronic device and contacting a first lateral side of the encapsulant, and a second side shield contacting a second lateral side of the encapsulant. The conformal shield defines a compartment containing the first electronic device and excluding the second electronic device.

In an additional example, a semiconductor device comprises a substrate comprising a conductive structure, a first electronic component over the substrate, an encapsulant over the substrate and contacting a lateral side of the first electronic component, a shield over the encapsulant and contacting a lateral side of the encapsulant and a portion of a lateral side of the substrate, and a communication structure coupled with the substrate. The substrate comprises a vertical groove side and a horizontal groove side defining a groove in the substrate, wherein a portion of the groove is uncovered by the shield.

In yet another example, a semiconductor device comprises a substrate comprising a conductive structure and having a first side and a second side opposite to the first side, wherein the substrate comprises a groove in the second side at a lateral side of the substrate, a first electronic device over the first side of the substrate, an encapsulant over the first side of the substrate and contacting a lateral side of the electronic device, a shield over the encapsulant and contacting a lateral side of the substrate and coupled with the conductive structure, and a second electronic component external to the shield.

In yet a further example, a method of manufacturing a semiconductor device, comprises providing a substrate comprising a first side and a second side, and a conductive structure, providing a first electronic component over the first side of the substrate, providing an encapsulant over the substrate and contacting a lateral side of the first electronic component, providing a shield over the encapsulant and contacting a lateral side of the encapsulant and a portion of a lateral side of the substrate, and providing a communication structure coupled with the substrate. The substrate comprises a vertical groove side and a horizontal groove side defining a groove in the substrate, wherein a portion of the groove is uncovered by the shield.

Other examples are included in the present disclosure. Such examples may be found in the figures, in the claims, or in the description of the present disclosure.

FIG. 1 shows a cross-sectional view of an example semiconductor device 10. In the example shown in FIG. 1, semiconductor device 10 can comprise substrate 110, electronic components 121, 122 and 123, compartments 131 and 132, compartment wall 133, conformal shield 140, encapsulant 150, and external interconnects 160.

Substrate 110 can comprise dielectric structure 101 and conductive structure 111. Conductive structure 111 can comprise one or more layers of conductive material defining conductors 112, 113, 112a, 113a, 114, or 115. Dielectric structure 101 can comprise one or more layers of dielectric material stacked with the one or more layers of conductive structure 111. Electronic components 121, 122, and 123 can comprise or be coupled to internal interconnects 121a, 122a, and 123a, respectively, and can be electrically connected on substrate 110. Compartments 131 and 132 can receive respective electronic components 121, 122, 123 and encapsulant 150 on substrate 110. Compartment wall 133 can be interposed between compartments 131 and 132. Conformal shield 140 can be positioned on compartment 131, and can leave compartment 132 exposed. Conformal shield 140 can be on a top side of substrate 110 over electronic component 122 or electronic component 123. Compartment wall 133 can be between electronic component 121 and electronic component 122 and can contact conformal shield 140 to define compartment 131 containing electronic component 122 or electronic component 123 and excluding electronic component 121. Encapsulant 150 can cover electronic components 121, 122, or 123, respectively. In some examples, encapsulant 150 is on the top side of substrate 110 contacting a lateral side of electronic component 121, a lateral side of electronic component 122, or a lateral side of electronic component 123. External interconnects 160 can be connected to the bottom of substrate 110.

Substrate 110, compartments 131 and 132, compartment wall 133, conformal shield 140, encapsulant 150 and external interconnects 160 can be referred to as a semiconductor package, and can protect electronic components 121, 122, and 123 from external elements or environmental exposure. The semiconductor package can provide electrical connection between external devices and external interconnects.

Figure 2A:
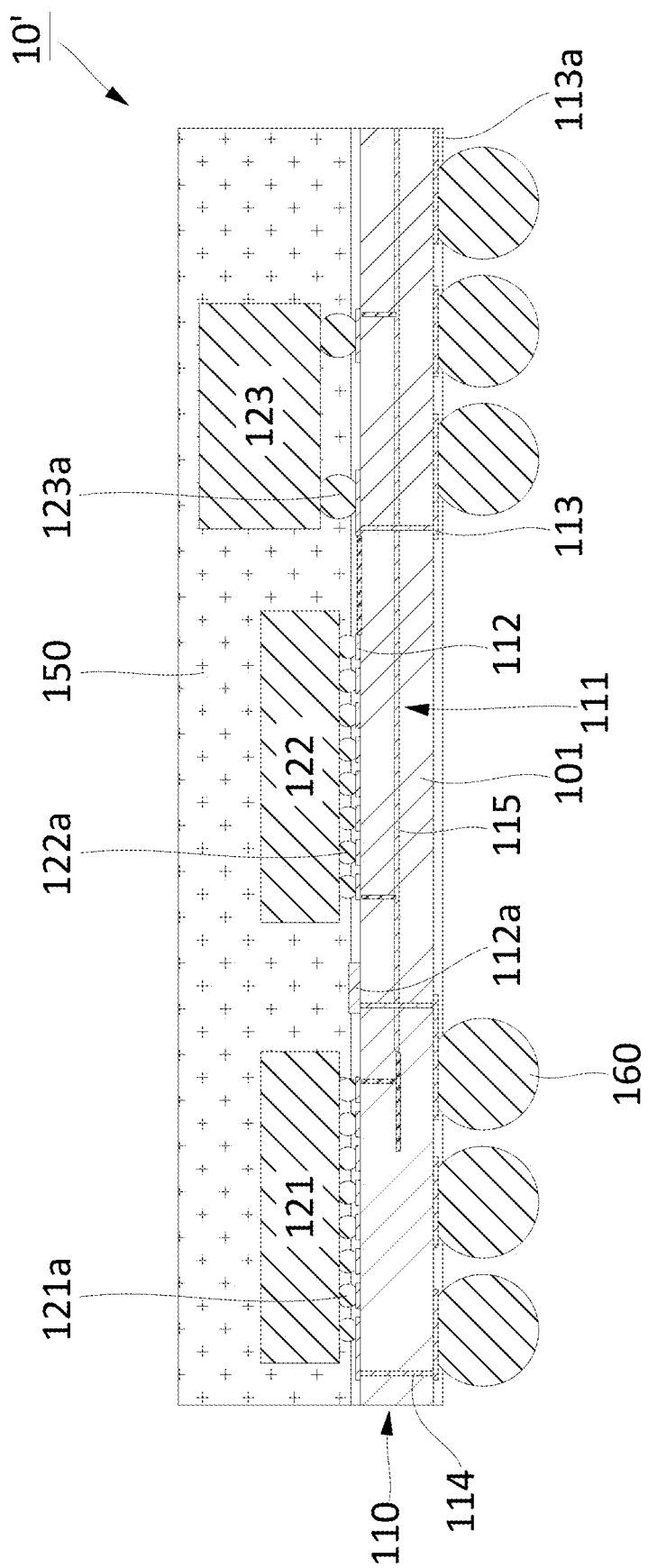
FIGS. 2A to 2J show cross-sectional views of an example method for manufacturing an example semiconductor device.

FIGS. 2A to 2J show cross-sectional views of an example method for manufacturing semiconductor device 10. FIG. 2A shows a cross-sectional view of semiconductor device 10 at an early stage of manufacture.

In the example shown in FIG. 2A, semiconductor device 10' can comprise substrate 110, electronic components 121, 122, and 123, encapsulant 150 and external interconnects 160. Semiconductor device 10' can comprise or be referred to as a full mold type semiconductor device. In some examples, semiconductor device 10' can comprise only electronic components 121 and 122. In some examples, external interconnects 160 can be omitted, or external interconnects 160 can be formed after forming conformal shield 140. In some examples, electronic components 121, 122, or 123 can be placed in the top side of substrate 110, and encapsulant can be provided on the top side of substrate 110 and can contact a lateral side of electronic components 121, 122, or 123.

Substrate 110 can support electronic components 121, 122, or 123 and can electrically connect electronic components 121, 122, or 123 to external devices. Substrate 110 can have a thickness in the range from approximately 0.1 millimeter (mm) approximately 1.2 mm.

In some examples, substrate 110 can be a pre-formed substrate. The pre-formed substrate can be manufactured prior to attachment to electronic components or devices and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In some examples, the pre-formed substrate can be a coreless substrate and omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such a pre-formed substrate can be formed through a semi-additive or modified-semi-additive process.

In some examples, substrate 110 can be a redistribution layer ("RDL") substrate. RDL substrates can comprise one or more dielectric layers and one or more conductive redistribution layers that (a) can be formed layer by layer over electronic components to which the RDL substrate is to be electrically coupled, or (b) can be formed layer by layer over a carrier that can be entirely removed or at least partially removed after the electronic components and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic components, or (b) fan-in electrical traces within the footprint of the electronic components. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or silicon oxynitride (SiON). The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

Electronic components 121, 122, or 123 can be electrically connected to conductors 112 of substrate 110 through internal interconnects 121*a*, 122*a*, or 123*a*, respectively. In some examples, internal interconnects 121*a*, 122*a*, or 123*a* can comprise or be referred to as pads, lands, bumps, pillars or posts coupled between the bottom of electronic components 121, 122, or 123 and substrate 110. In some examples, internal interconnects 121*a*, 122*a*, or 123*a* can be coupled between the top of electronic components 121, 122, 123 and substrate 110, and can comprise or be referred to as wires or wirebonds. Electronic components 121, 122, or 123 can comprise or be referred to as semiconductor dies, semiconductor packages, active devices, or passive devices. In some examples, electronic components 121, 122, or 123 can comprise or be referred to as application specific integrated circuits, RF circuits, Wi-Fi circuits, wireless local area network (WLAN) circuits, Bluetooth circuits, modems, wireless baseband system on chip processors, network processors, logic dies, memories, digital signal processors, power management units, audio processors, application specific integrated circuits, Micro-Electro-Mechanical-System (MEMS) devices, passive devices such as resistors, inductors, capacitors, or diodes, or antenna structures such as an antenna tuning component, a printed antenna, a chip antenna, an antenna module, or an antenna connector for coupling an antenna. Electronic components 121, 122, or 123 can have a thickness in the range from approximately 0.1 mm to approximately 0.8 mm, respectively. In some examples, electronic component 121 can wirelessly communicate signals with external devices, and electronic components 122 or 123 can execute internal applications or instructions.

Encapsulant 150 can encapsulate electronic components 121, 122 and 123 on substrate 110. In some examples, encapsulant 150 can comprise or be referred to as a molding compound, an epoxy resin, or a sealant, with or without filler particles or strands. In some examples, encapsulant 150 can be referred to as a molding part, a sealing part, an encapsulation part, a protection part, a package or a body. In some examples, encapsulant 150 can comprise an organic resin, an inorganic filler, a curing agent, a catalyst, a coupling agent, a coloring agent, or a flame retardant. Molding based on encapsulant 150 can be formed by any of a variety of processes. In some examples, molding parts can be formed by compression molding, transfer molding, liquid-phase encapsulant molding, vacuum lamination, paste printing, or film assist molding. Encapsulant 150 can have a thickness in the range from approximately 0.1 mm to approximately 0.8 mm. Encapsulant 150 can surround electronic components 121, 122, or 123 to protect electronic components 121, 122, or 123 from external elements or environmental exposure.

External interconnects 160 can be electrically connected to substrate 110. In some examples, external interconnects 160 can be electrically connected to conductors 113 provided on a bottom surface of substrate 110. External interconnects 160 can comprise or be referred to as solder balls, solder bumps, conductive balls, copper pillars, copper posts, conductive pillars, or conductive posts. In some examples, volatile flux can be dotted on conductive layer 113 of substrate 110, and external interconnects 160 can be dropped on the dotted flux. Thereafter, the flux is volatized and removed through a reflow process, and external interconnects 160 can be melted to be mechanically/electrically connected to conductive layer 113. Then, external interconnects 160 can be cured by a cooling process and can be fixed to conductive layer 113 mechanically/electrically. In some examples, external interconnects 160 can comprise tin (Sn), silver (Ag), lead (Pb), copper (Cu), Sn—Pb, Sn37—Pb, Sn95—Pb, Sn—Pb—Ag, Sn—Cu, Sn—Ag, Sn—Au, Sn—Bi, Sn—Ag—Cu, or alloys. External interconnects 160 can have a thickness or diameter in the range from approximately 0.15 mm to approximately 0.4 mm, respectively. External interconnects 160 can electrically connect semiconductor device 10 to an external device.

Figure 2B:
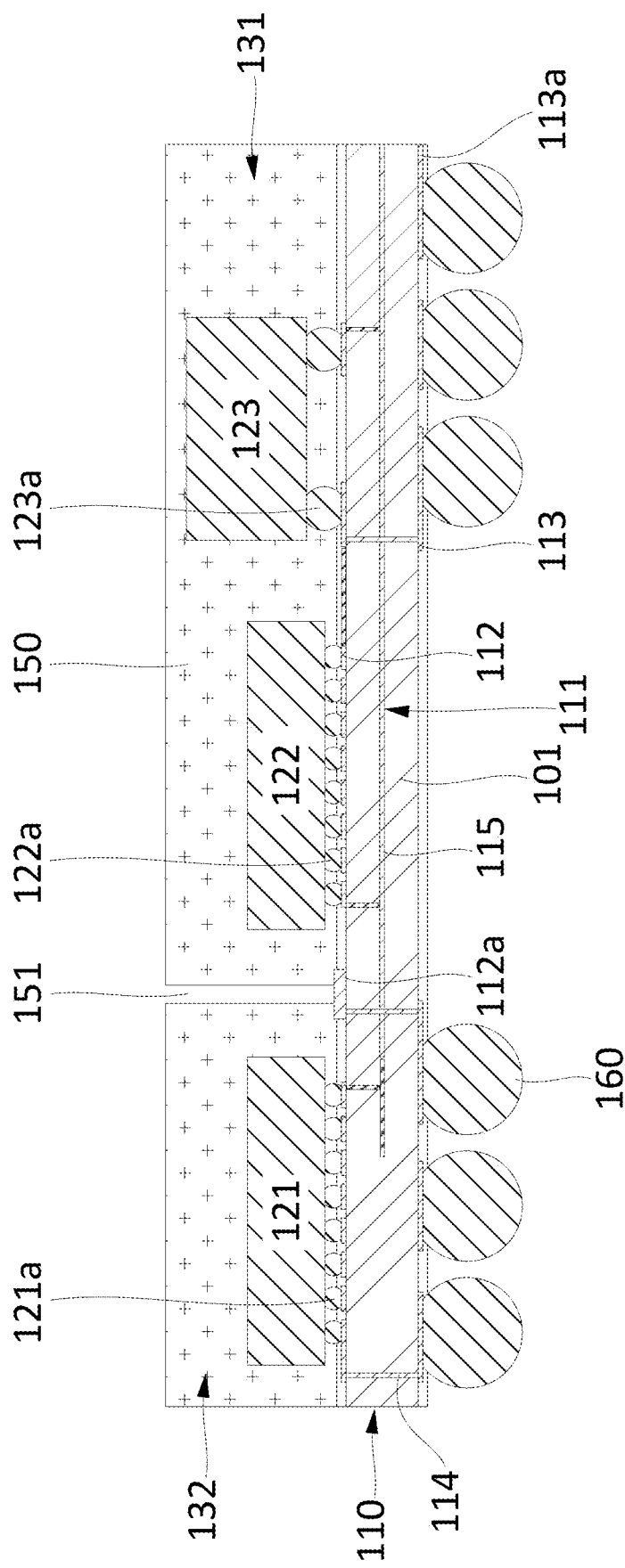

FIG. 2B shows a cross-sectional view of semiconductor device 10 at a later stage of manufacture. In the example shown in FIG. 2B, trench 151 can be formed or provided in encapsulant 150. In some examples, formation or provision of trench 151 can expose conductor 112a (e.g., a grounding conductive pad, trace, or pattern) provided on substrate 110. In some examples, trench 151 can be formed by a mechanical process using a sawing wheel or a laser beam. In some examples, trench 151 can be formed by an etching based chemical process. Trench 151 can comprise or be referred to as recess, opening, groove, or via. Trench 151 can have a width in the range from approximately 0.05 mm to 0.50 mm. Trench 151 can confine compartment wall 133 in a later process. In some examples, formation or provision of trench 151 can define compartments 131 and 132. In some examples, the portion of substrate 110 and encapsulant 150 at one side of trench 151 with electronic component 121 can be defined as compartment 132, and the portion of substrate 110 and encapsulant 150 at the other side of trench 151 with electronic components 1222, 123 can be defined as compartment 131. In some examples, compartments 131 and 132 can be spaced apart from each other by trench 151.

Although FIG. 2B illustrates trench 151 having a substantially rectangular cross section, the illustrated trench 151 is provided as merely one example for a better understanding of the present disclosure. In some examples, trench 151 can have a tapered section configured to gradually narrow downwardly. In some examples, trench 151 can have a section configured to include an upper trench having its width relatively large and its depth relatively shallow, and a lower trench connected to the upper trench to extend downwardly and having its width relatively small and its depth relatively deep compared to the upper trench. In some examples, a compartment wall to be formed within trench 151 can be conform to the cross-section of trench 151.

Figure 2C:
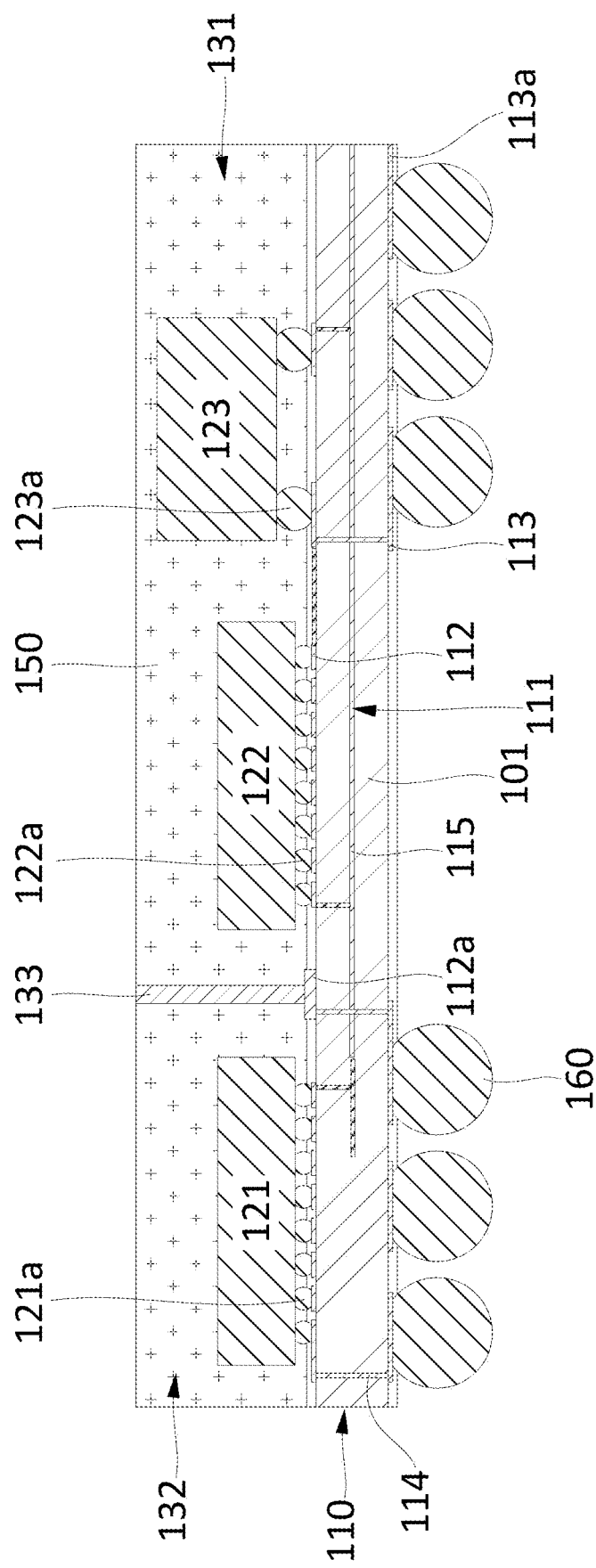

FIG. 2C shows a cross-sectional view of semiconductor device 10 at a later stage of manufacture. In the example shown in FIG. 2C, compartment wall 133 can be formed within trench 151. Compartment wall 133 can comprise or be referred as a filled trench, via, through mold via (TMV), or solder paste. In some examples, trench 151 can be filled with a material to provide compartment wall 133 such that the compartment wall has a contiguous form or structure. Exemplary width and height of compartment wall 133 is are shown in FIG. 2C. Compartment wall 133 can also comprise a depth that can be greater than the width or height shown in FIG. 2C. In some examples, compartment wall 133 can comprise copper (Cu), aluminum (Al), nickel (Ni), palladium (Pd), gold (Au), silver (Ag), chrome (Cr), zinc (Zn), tin (Sn), titanium (Ti), SUS (Fe), carbon black, or alloys. In some examples, a liquid-phase conductive material fills trench 151 and heat or light can then cure the conductive material to form or provide compartment wall 133. In some examples, the conductive material of compartment wall 133 can be provided within trench 151 by sputtering, plating, spray coating, spreading, or plasma deposition. Compartment wall 133 can have a width in the range from approximately 0.05 mm to approximately 0.50 mm. In some examples, compartment wall 133 can be electrically connected later to conformal shield 140 that shields compartment 131.

Figure 2D:
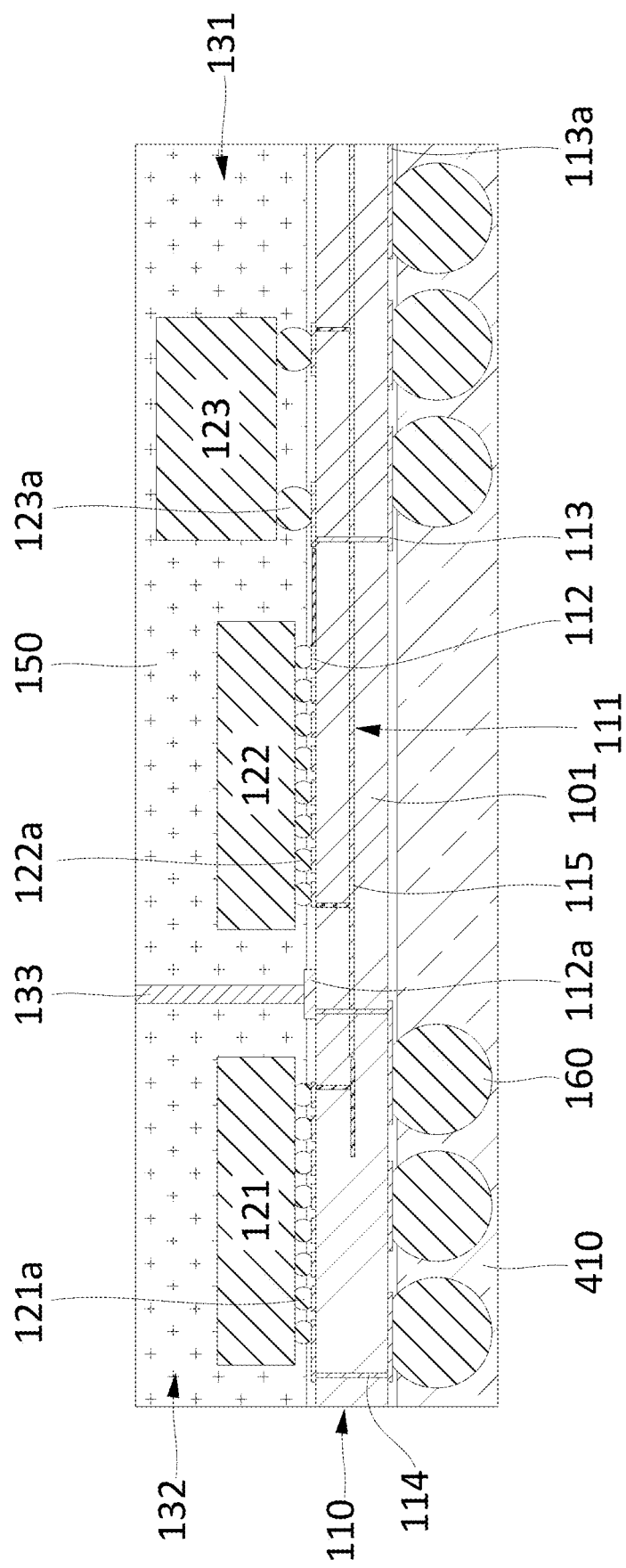

FIG. 2D shows a cross-sectional view of semiconductor device 10 at a later stage of manufacture. In the example shown in FIG. 2D, temporary film 410 can be adhered to substrate 110 and external interconnects 160. Temporary film 410 can comprise or be referred as to temporary adhesive, temporary tape, temporary bonding film, or peelable adhesive. Temporary film 410 can lose its adhesive force by heat, ultra-violet light, a laser beam, or chemical solution in a subsequent process or can be separated from substrate 110 and external interconnects 160 by an external force in a subsequent process. In some examples, temporary film 410 can have a thickness sufficient to enclose external interconnects 160. Temporary film 410 can have a thickness in the range from approximately 0.15 mm to approximately 0.5 mm. In some examples, a side surface of substrate 110, a side surface of encapsulant 150, or a side surface of temporary film 410 can be coplanar. Temporary film 410 can temporarily fix the semiconductor device to a carrier in a subsequent process.

Figure 2E:
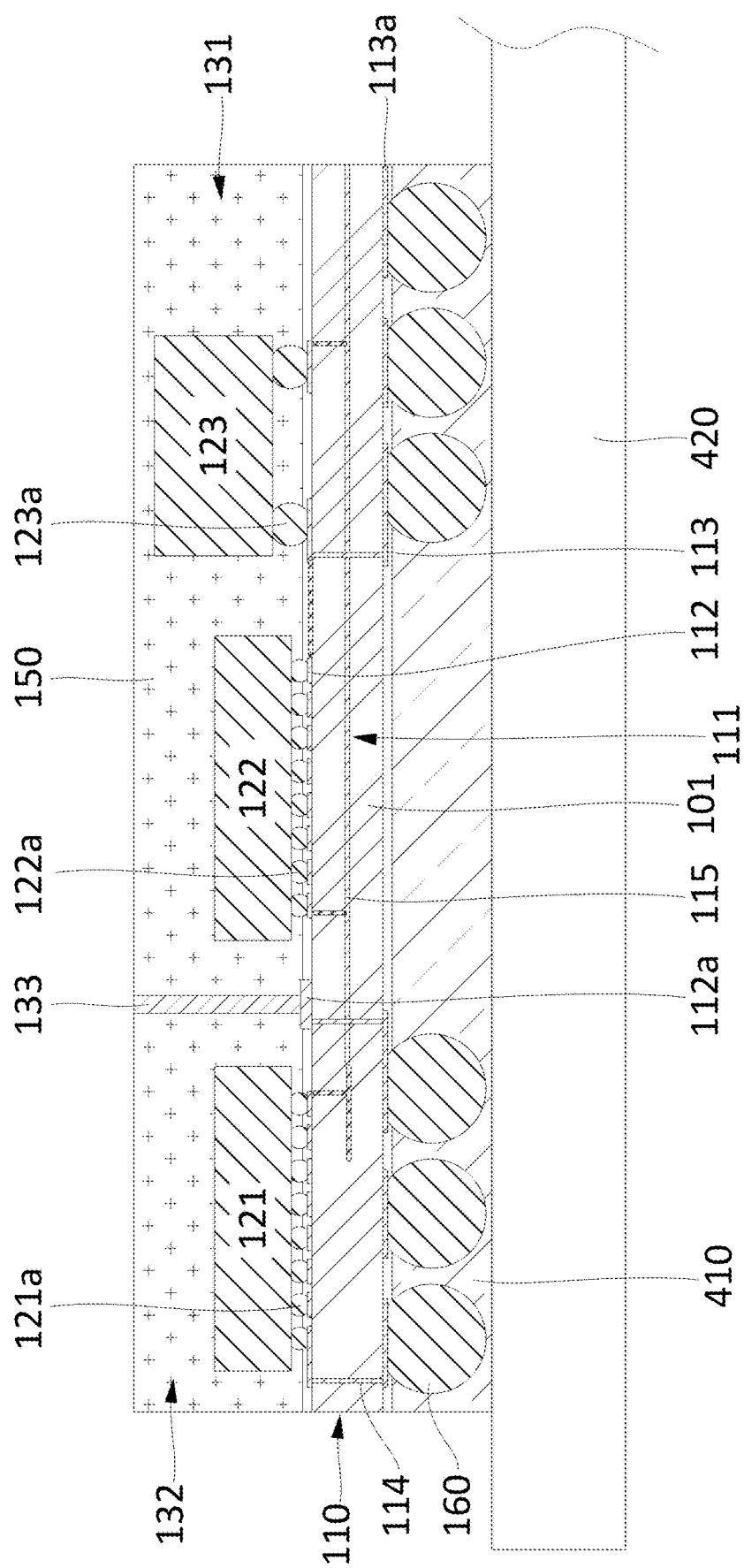

FIG. 2E shows a cross-sectional view of semiconductor device 10 at a later stage of manufacture. In the example shown in FIG. 2E, temporary film 410 can be mounted on carrier 420. In some examples, external interconnects 160 can be adhered to or spaced apart from carrier 420. Carrier 420 can comprise or be referred to as an adhesive film, mounting film, adhesive tape, bonding film, bonding tape, glass plate, or metal plate. In some examples, carrier 420 can comprise a backing film and an adhesive layer formed on a top surface of the backing film. Carrier 420 can have a thickness in the range from approximately 0.15 mm to approximately 1 mm. As substrate 110 is adhered to carrier 420 through temporary film 410, it is possible to prevent warpage of semiconductor device 10 in a subsequent high-temperature heating process. In some examples, multiple substrates 110 are attached to carrier 420, so that the productivity of making semiconductor devices 10 can be improved.

Figure 2F:
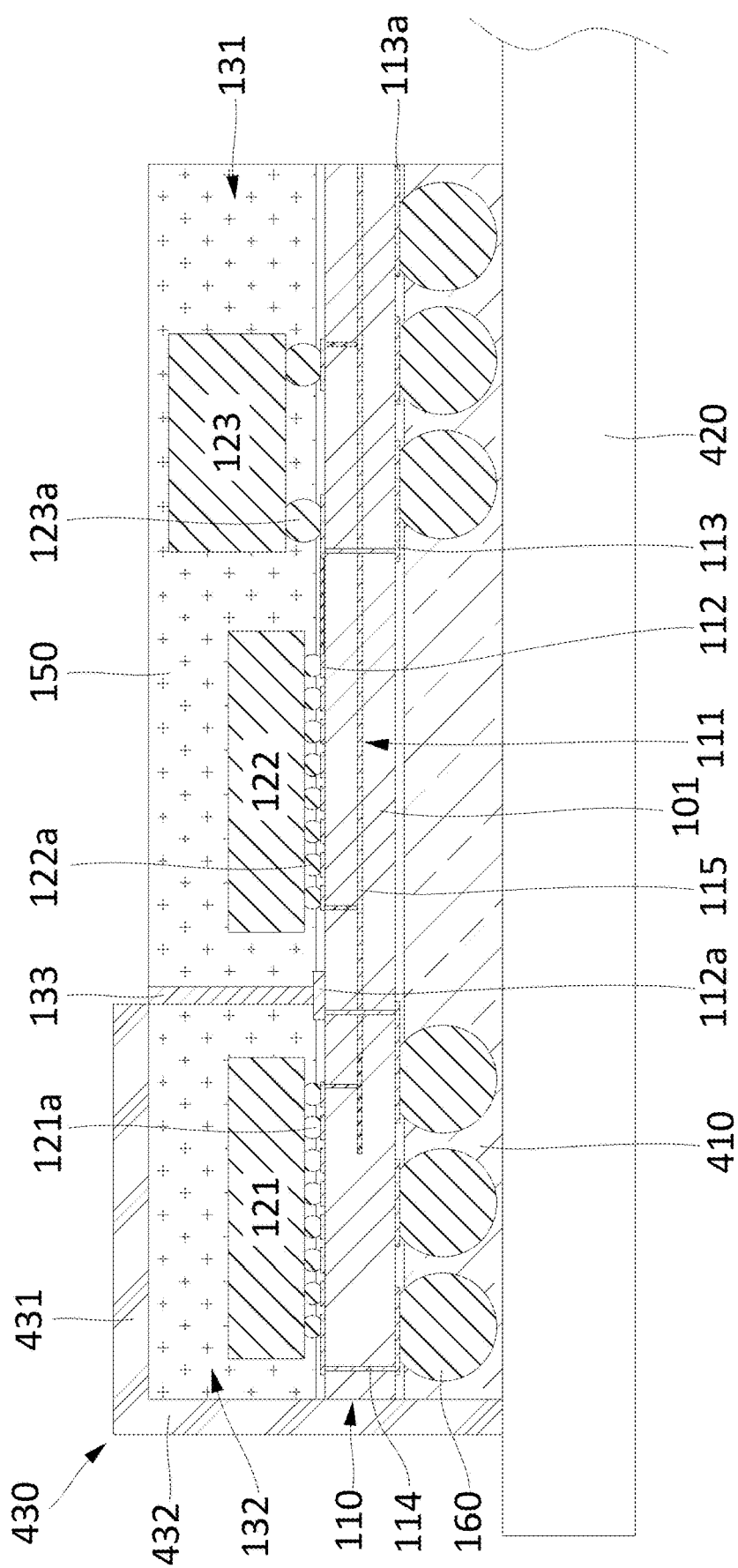

FIG. 2F shows a cross-sectional view of semiconductor device 10 at a later stage of manufacture. In the example shown in FIG. 2F, cover 430 can surround the exposed area of compartment 132, leaving compartment 131 exposed. In some examples, cover 430 can comprise top cover 431 covering a top side of compartment 132, and side cover 432 covering side surfaces of compartment 132, substrate 110 and temporary film 410. Cover 430 can be provided over electronic component 121 to define compartment 132 containing electronic component 121. In some examples, a bottom end of side cover 432 can be coupled to carrier 420. Cover 430 can be referred as to cap, top, or lid. In some examples, cover 430 can comprise metal, plastic, or ceramic. In some examples, cover 430 can be prefabricated and then attached to the compartment 132, substrate 110 and temporary film 410. In some examples, an internal surface of cover 430 can be brought into contact with the top and side surfaces of compartment 132, the side surface of substrate 110 and the side surface of temporary film 410. Cover 430 can have a thickness in the range from approximately 0.1 mm to approximately 10 mm. Cover 430 can prevent the conformal shield 140 from being formed on the surface of the compartment 132 during the process of forming the conformal shield 140. In some examples, compartment wall 133 can remain exposed from cover 430.

Figure 2G:
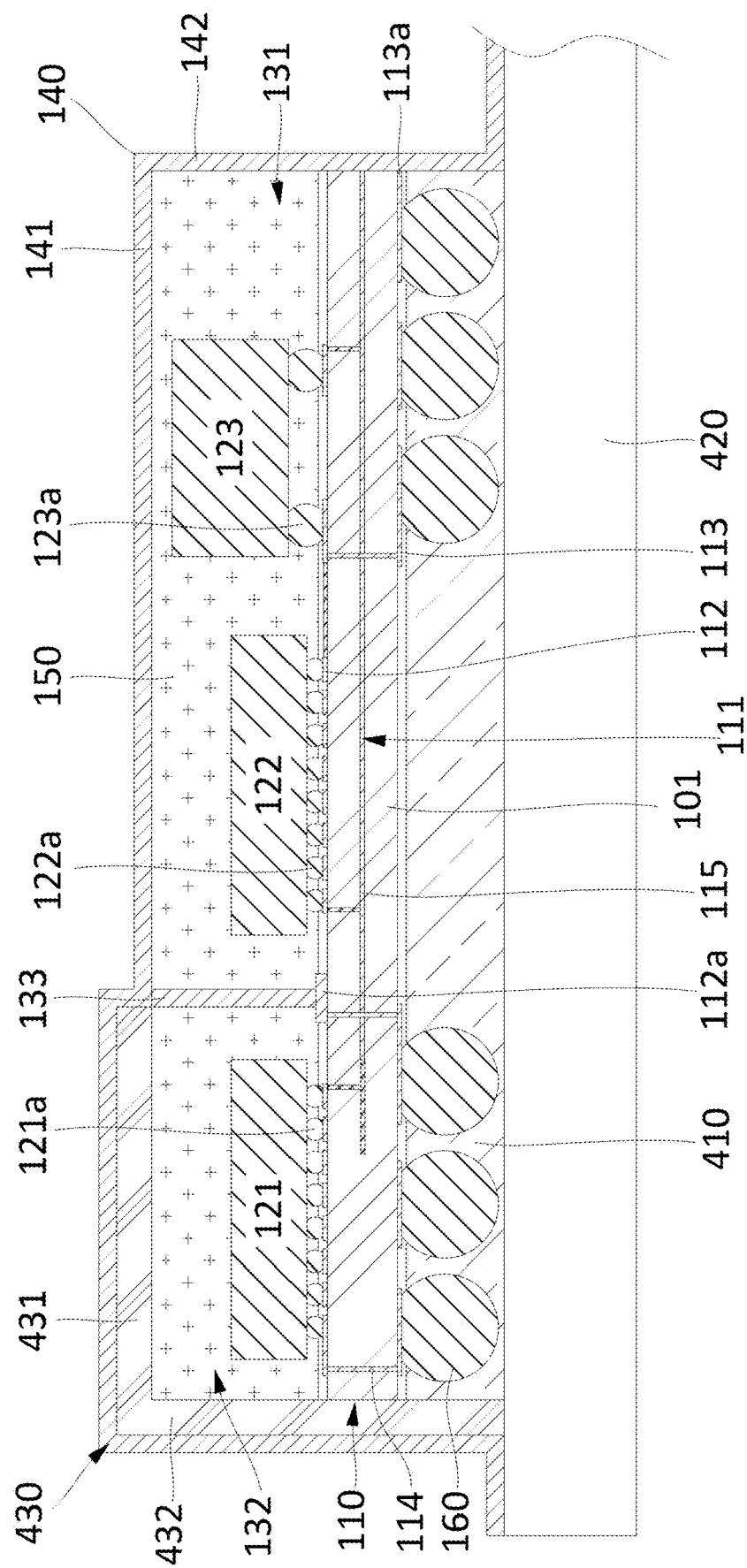

FIG. 2G shows a cross-sectional view of semiconductor device 10 at a later stage of manufacture. In the example shown in FIG. 2G, conformal shield 140 can be formed. Conformal shield 140 can be formed on a surface of cover 430 and a surface of compartment 131. Conformal shield 140 can comprise or be referred as to electromagnetic interference (EMI) shield, radio frequency (RF) shield, or conformal coating. Conformal shield 140 can conforms to the contours of the exposed portions of compartment wall 133, of substrate 110, or of encapsulant 150 at compartment 131. In some examples, conformal shield 140 can comprise top shield 141 formed on top side of compartment 131 and side shield 142 formed on side surface of compartment 131. Side shield 142 can contact a lateral side of encapsulant 150.

In some examples, conformal shield 140 can be formed on top and side surfaces of compartment 131, side surface of substrate 110, and side surface of temporary film 410. Conformal shield 140 can be provided over electronic component 122 or electronic component 123 to define compartment 142 containing electronic component 122 or electronic component 123. In some examples, conformal shield 140 can be electrically connected directly or indirectly to compartment wall 133. In some examples, conformal shield 140 can be electrically connected directly or indirectly to conductors 112*a* or 113*a* (e.g., grounding conductive pads, traces, patterns) provided on substrate 110. In some examples, conformal shield 140 can be electrically connected directly or indirectly to ground plane conductor 115 provided on substrate 110. In some examples, ground plane conductor 114 can be electrically connected with conformal shield 140 and can cover a majority of the area of compartment 131 under electronic component 122 or electronic component 123.

In some examples, conformal shield 140 can be formed by sputtering, plating, spray coating, or plasma deposition. Conformal shield 140 can thus be formed in-place, thereby differing from a pre-formed metal lid. In some examples, when conformal shield 140 is deposited by sputtering using a target material in a vacuum, sputtering can offer better qualities in view of density, contact resistance, or thin film adhesion than other processes, can easily adjust thickness of conformal shield 140, or can increase yields. In some examples, sputtering can be performed multiple times using the same metal or dissimilar metals. In some examples, plating can be an electroless plating process performed through a chemical reaction without using an external power source. In some examples, plating can be performed such that a metal ion and a reducing agent are simultaneously added to a plating solution to cause continuous reactions to take place through spontaneous reduction reactions. In some examples, electroless plating can be followed by electroplating. In some examples, spray coating can be a coating process using a conductive coating mix produced by mixing conductive powder or flake with a resin, such as, for example, silicone, epoxy, acryl, or polyurethane. Since spray coating is performed while spraying a shielding material in the form of ink containing conductive powder, it can be applied to various types of devices with increased manufacturability. In some examples, spray coating can also be performed multiple times.

In some examples, conformal shield 140 can comprise copper (Cu), aluminum (Al), nickel (Ni), palladium (Pd), gold (Au), silver (Ag), chrome (Cr), zinc (Zn), tin (Sn), titanium (Ti), SUS (Fe), carbon black, or related alloys. In some examples, conformal shield 140 can comprise a resin, such as, for example, silicone, epoxy, acryl or polyurethane, as well as conductive particles. In some examples, conformal shield 140 can have a thickness in the range from approximately 0.003 mm to approximately 0.010 mm. In some examples, conformal shield 140 can have a smaller thickness than compartment wall 133. In some examples, conformal shield 140 can have a thickness in the range from approximately 0.003 mm to approximately 0.010 mm, and compartment wall 133 can have a thickness in the range from approximately 0.05 mm to approximately 0.50 mm.

Electronic components 122 and 123 at compartment 131 can be electromagnetically isolated from an exterior side of compartment 131 by compartment wall 133 and conformal shield 140. In some examples, electronic components 122 and 123 provided at compartment 131 can be electromagnetically isolated from an exterior side of compartment 131 by compartment wall 133, conformal shield 140 and ground plane 115. In some examples, electromagnetic waves generated from electronic components 122 and 123 provided at compartment 131 can be prevented from being radiated to exterior side of compartment wall 133 and conformal shield 140. In some examples, electromagnetic waves generated from electronic components 122 and 123 provided at compartment 131 can be prevented from being radiated to exterior side of compartment wall 133, conformal shield 140 and ground plane 115. In some examples, electromagnetic waves outside compartment wall 133 and conformal shield 140 can be prevented from being radiated to electronic components 122 or 123 at compartment 131. In some examples, electromagnetic waves outside compartment wall 133, conformal shield 140 and ground plane 115 can be prevented from being radiated to electronic components 122 or 123 at compartment 131. Conformal shield 140, conformal wall 133 and ground plane 115 can make electromagnetic waves generated from electronic components 122 or 123 difficult to be radiated to exterior of compartment 131. Conformal shield 140, conformal wall 133, and ground plane 115 can make electromagnetic waves outside compartment 131 difficult to affect electronic components 122 or 123.

Figure 2H:
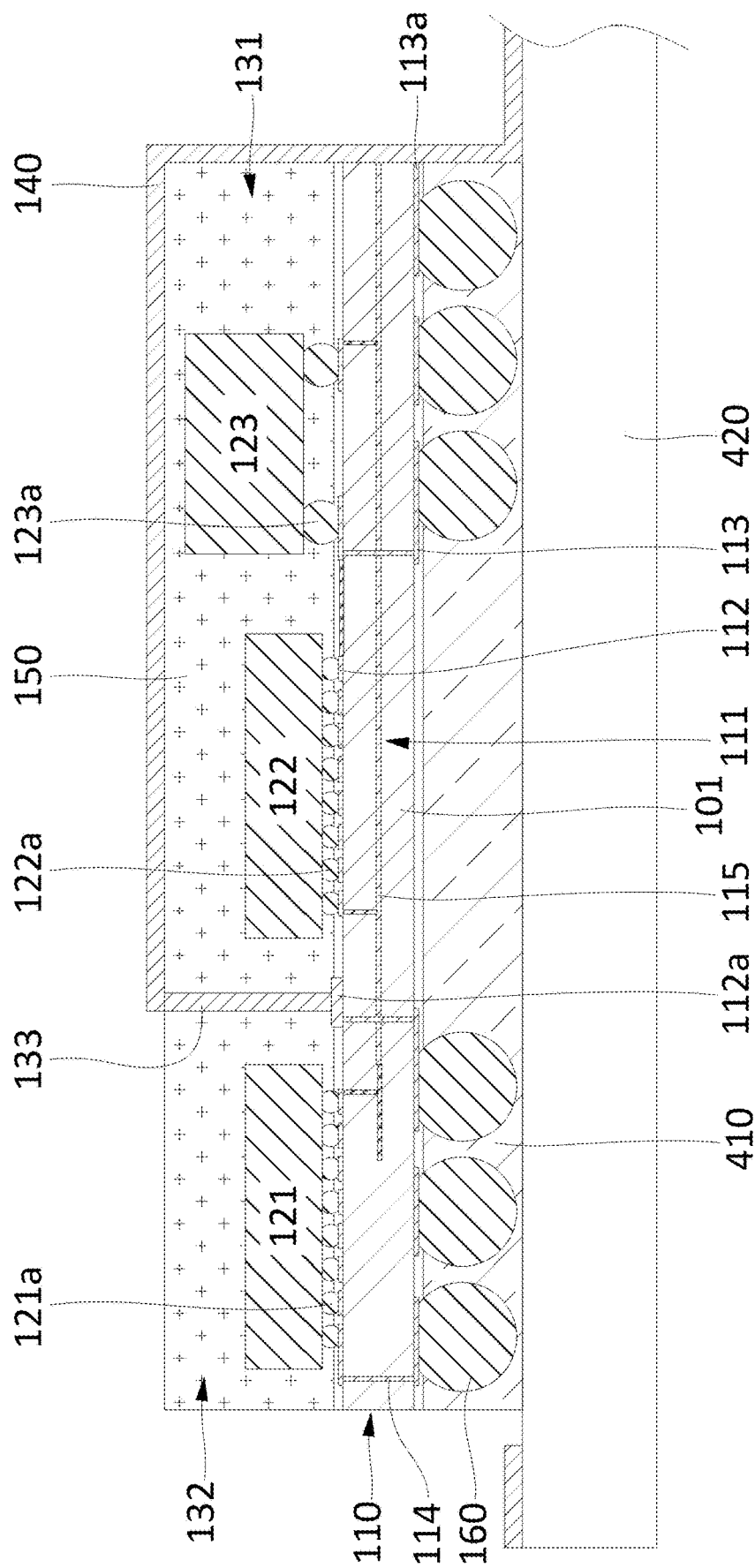

FIG. 2H shows a cross-sectional view of semiconductor device 10 at a later stage of manufacture. In the example shown in FIG. 2H, cover 430 can be removed. In some examples, the bottom end of cover 430 can be separated from carrier 420. Compartment 132 can be exposed, and electronic component 121 positioned within compartment 132 can wirelessly communicate with an external device. Cover 430 can be removed from compartment 132 wherein electronic component 121 is unshielded and electronic component 122 or electronic component 122 are shielded by conformal shield 140. In some examples, electronic component 121 positioned within compartment 132 can freely perform wireless communication with external devices while wireless interference is restricted for electronic components 122 or 123 positioned in compartment 131. In some examples, semiconductor device 10 can comprise electronic component 121 capable of performing wireless communication without having to shield electromagnetic waves, and electronic components 122 or 123 can be shielded from electromagnetic waves.

Figure 2I:
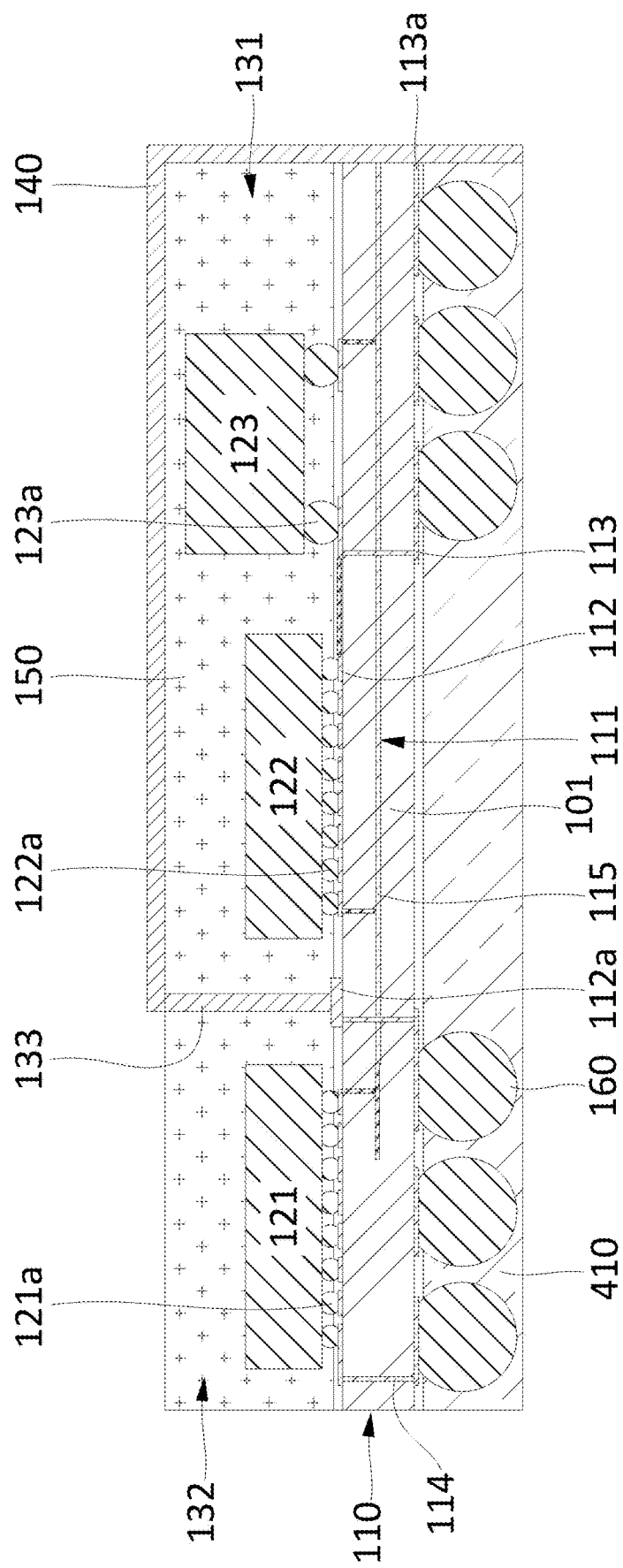

FIG. 2I shows a cross-sectional view of semiconductor device 10 at a later stage of manufacture. In the example shown in FIG. 2I, carrier 420 can be removed. In some examples, while carrier 420 is lifted by a needle and a pick-and-place tool can pick up semiconductor device 10, thereby separating temporary film 410 from carrier 420. In some examples, conformal shield has a bend at the junction of temporary film 410 and carrier 420. When carrier 420 is removed, a portion or region of conformal shield 140 can be removed at the bend along with carrier 420, and a potion or region of conformal shield 140 can remain on a lateral side of temporary film 410.

Figure 2J:
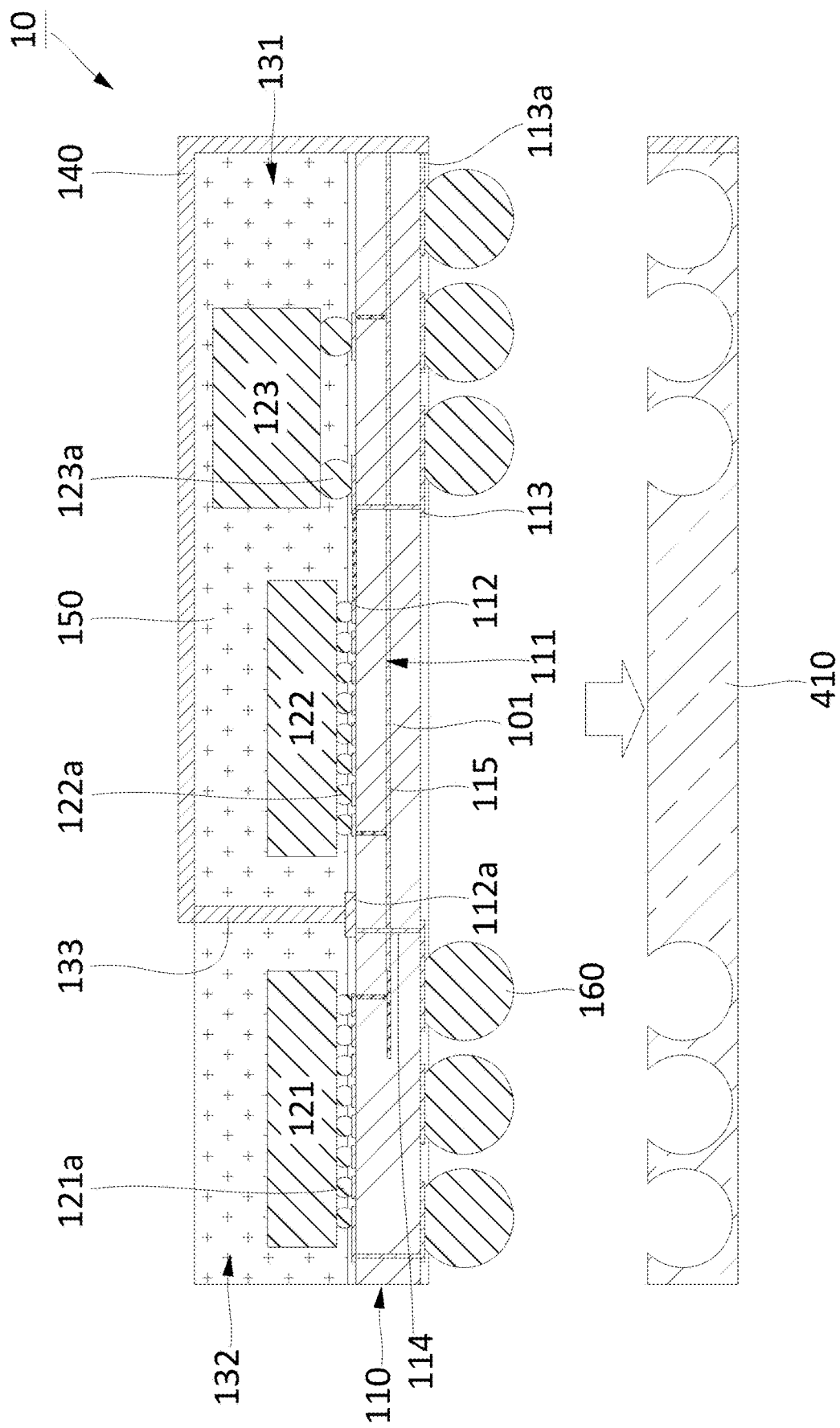

FIG. 2J shows a cross-sectional view of semiconductor device 10 at a later stage of manufacture. In the example shown in FIG. 2J, temporary film 410 can be removed. In some examples, temporary film 410 can be removed from substrate 110 and external interconnects 160 by losing its adhesive force through heat, ultra-violet light, laser beam, or chemical solution or can be separated from substrate 110 and external interconnects 160 by an external force. In some examples, a region of conformal shield 140 formed on side surface of temporary film 410 can also be removed. Conformal shield 140 can remain on top and side surfaces of compartment 131 and side surface of substrate 110. Conformal shield 140 can be connected to conductor 112a at the top of substrate 110 through compartment wall 133, or can be connected to conductor 113a at the side of substrate 110. In some examples, conformal shield 140 can be connected to ground plane 115 at the side of substrate 110, or can be connected to ground plane 115 through conductive via 114.

Semiconductor device 10 can comprise conformal shield 140 formed on a partial region. In some examples, compartment 132 can remain exposed, and compartment 131 can be shielded by compartment wall 133 and conformal shield 140. In some examples, compartment wall 133 and conformal shield 140 can be electrically connected directly or indirectly to grounding conductors 112a, 113a, or to ground plane 115. In some examples, grounding conductors 112a and 113a and ground plane 115 can be electrically connected to external devices through external interconnects 160.

Figure 3A:
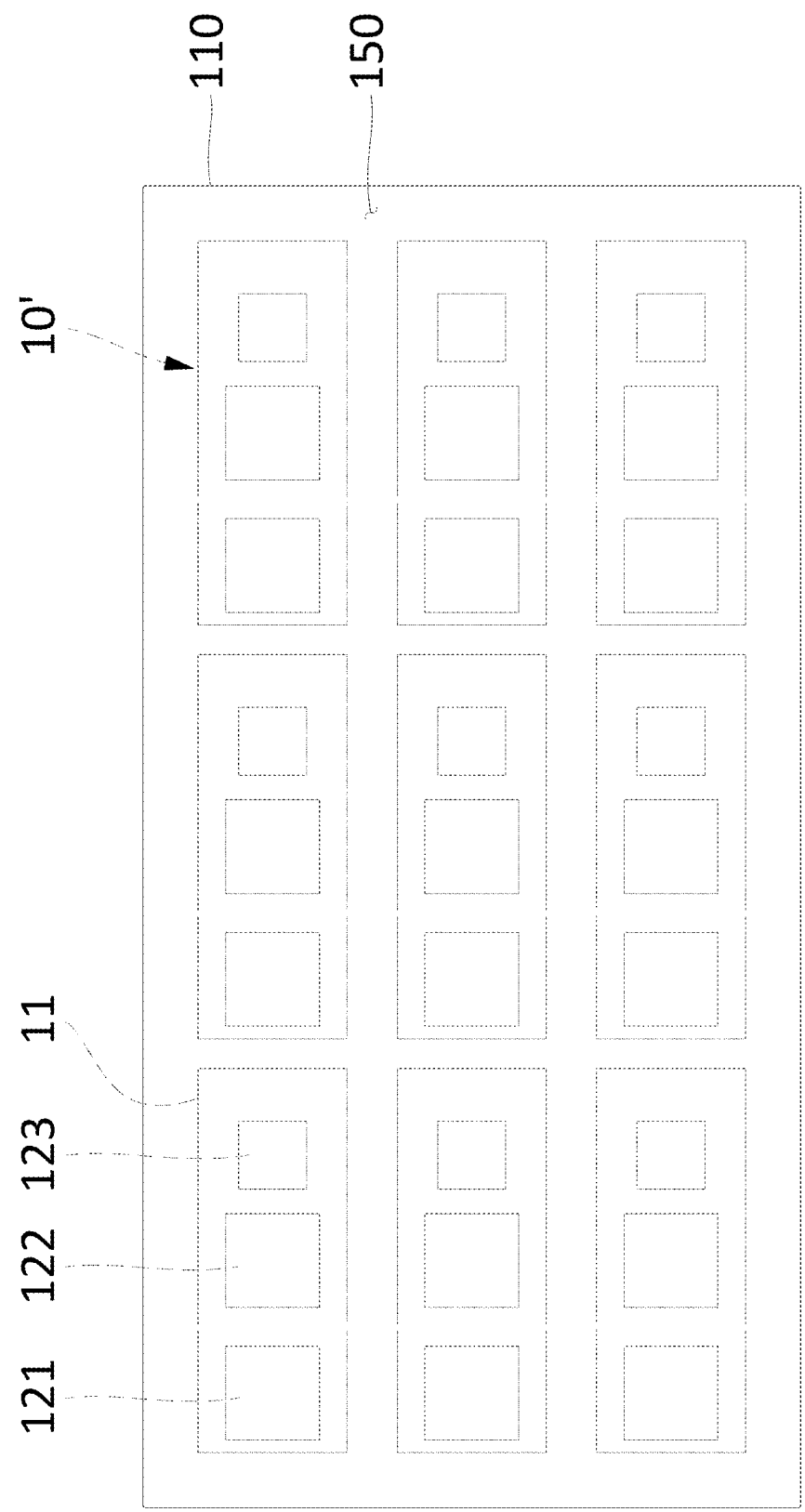
FIGS. 3A to 3C show plan views of an example method for manufacturing an example semiconductor device.
Figure 3B:
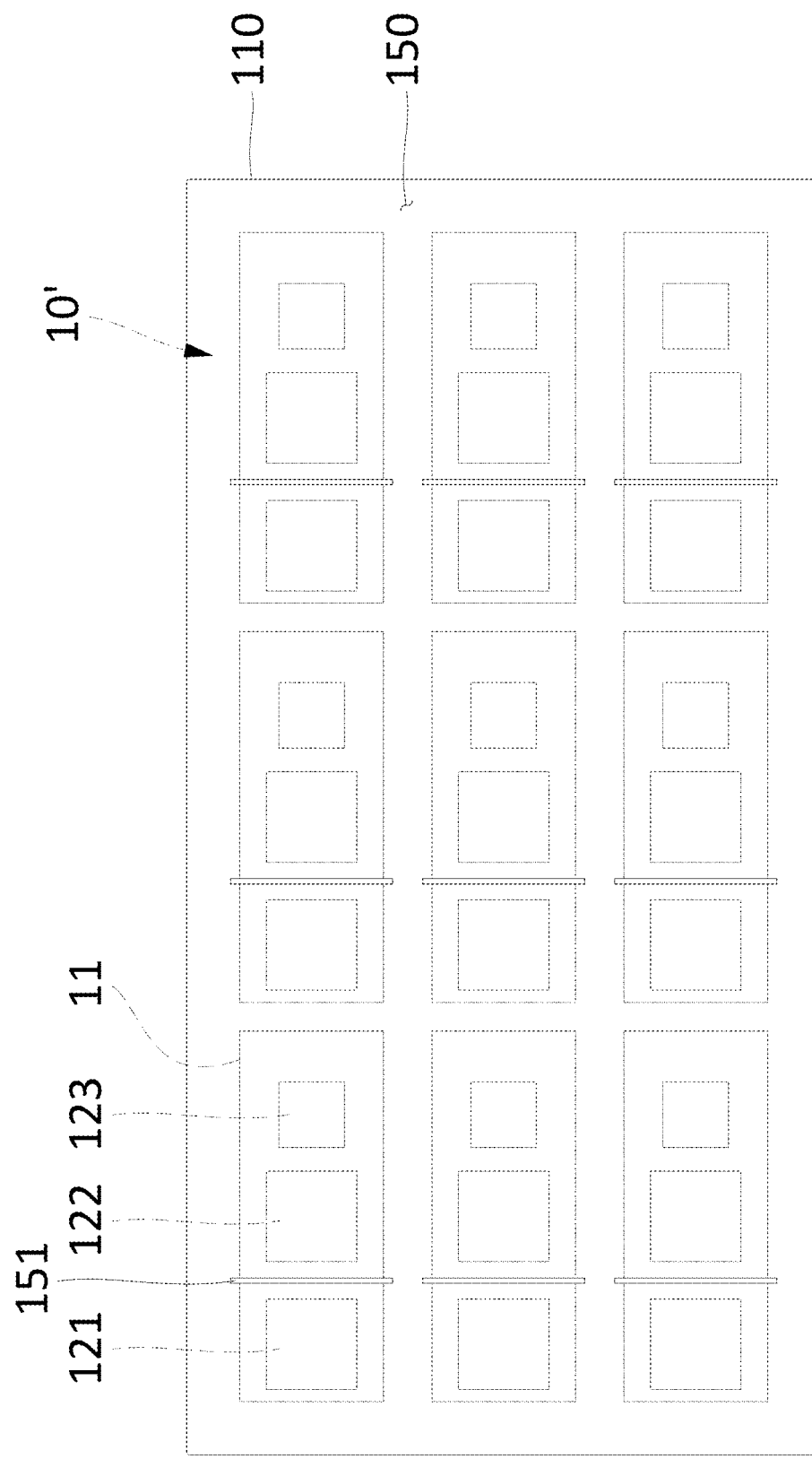
Figure 3C:
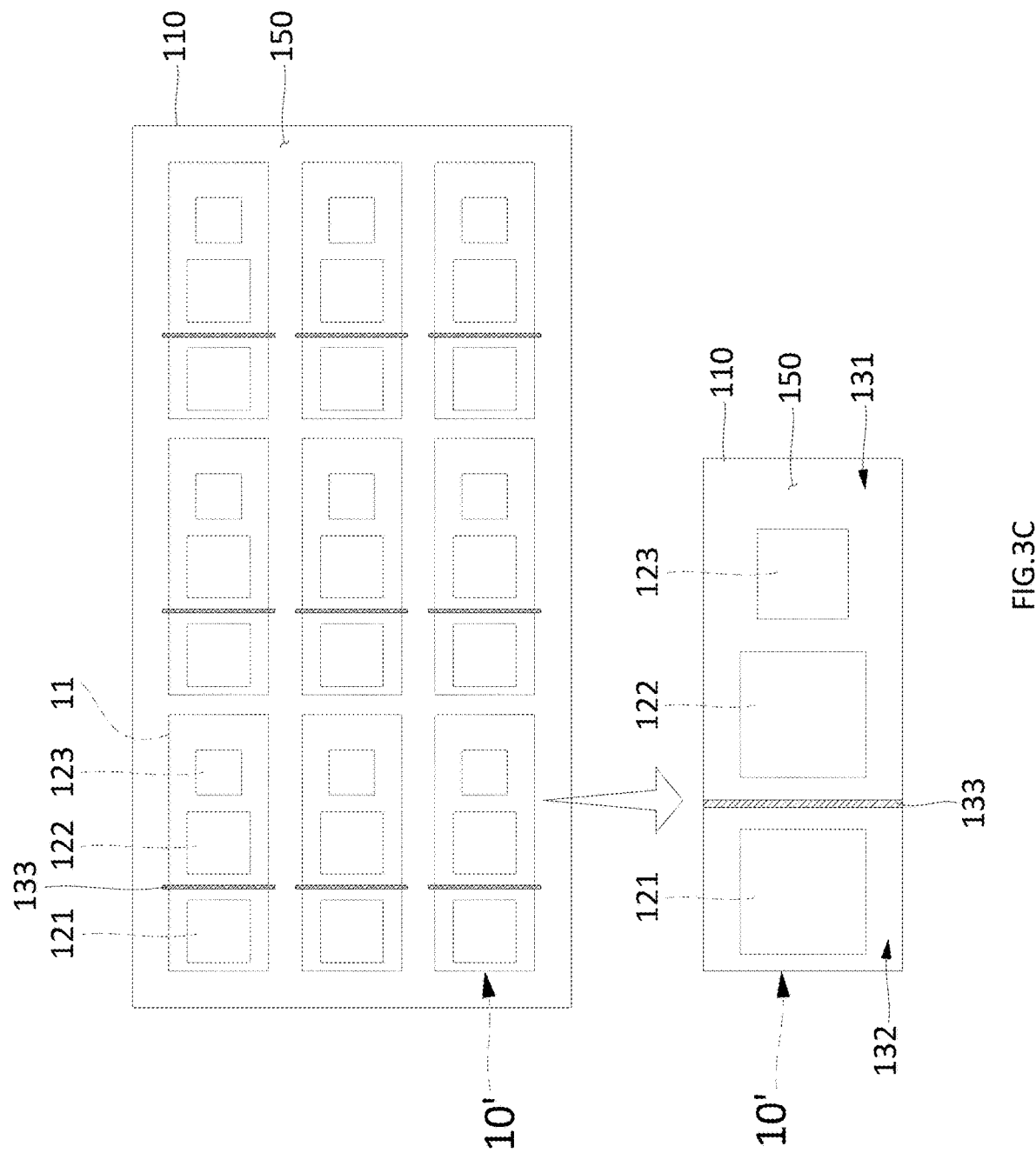

FIGS. 3A to 3C show plan views of an example method for manufacturing an example semiconductor device. FIG. 3A shows a plan view of semiconductor device at an early stage of manufacture.

In the example shown in FIG. 3A, electronic components 121, 122, or 123 can be arrayed in a matrix having rows and columns on substrate 110. FIG. 3A can correspond to the side cross-sectional view of FIG. 2A. In some examples, electronic components 121, 122, or 123 arrayed in matrix can be covered or molded by encapsulant 150. In some examples, individual semiconductor devices 10' can be singulated along singulation lines 11 in a subsequent process. While FIG. 3A illustrates 3×3 semiconductor devices 10', the number of semiconductor devices 10' is not limited by the present disclosure, and the number of semiconductor devices 10' formed on one substrate 110 can be greater or smaller than that disclosed.

FIG. 3B shows a plan view at a later stage of manufacture. In the example shown in FIG. 3B, trench 151 can be formed in encapsulant 150. FIG. 3B can correspond to the side cross-sectional view of FIG. 2B. Trench 151 can be mechanically formed using laser beam or a singulation wheel, or can be chemically etched using a chemical solution. Although FIG. 3B illustrates trench 151 having a substantially linear planar type, the illustrated trench 151 is provided just by way of example for a better understanding of the present disclosure. In some examples, trench 151 can comprise one or more bends, or can be curved.

FIG. 3C shows a plan view of semiconductor device at a later stage of manufacture. In the example shown in FIG. 3C, compartment wall 133 can be formed by filling trench 151 with conductive material, followed by curing. FIG. 3C can correspond to the side cross-sectional view of FIG. 2C. In some examples, when one semiconductor device 10' is singulated from the matrix, compartment wall 133 can fully traverse to be exposed at opposite sides of encapsulant 150. In some examples, compartment wall 133 can be exposed through opposite sides of encapsulant 150 as well as at top side of encapsulant 150. Compartment wall 133 can serve as boundary between compartments 131 and 132, and can divide encapsulant 150 into portions corresponding to respective compartments 131 and 132.

In some examples, a compartment wall similar to compartment wall 133 can be formed through multiple via holes, instead of a continuous trench. In some examples, the multiple via holes can be formed in encapsulant 150 using a laser beam, or can be filled with a conductive material, thereby defining a compartment wall of multiple adjacent conductive vias. In some examples, pitches between the multiple adjacent conductive vias can be smaller than wavelengths of electromagnetic waves to be shielded.

Figure 4A:
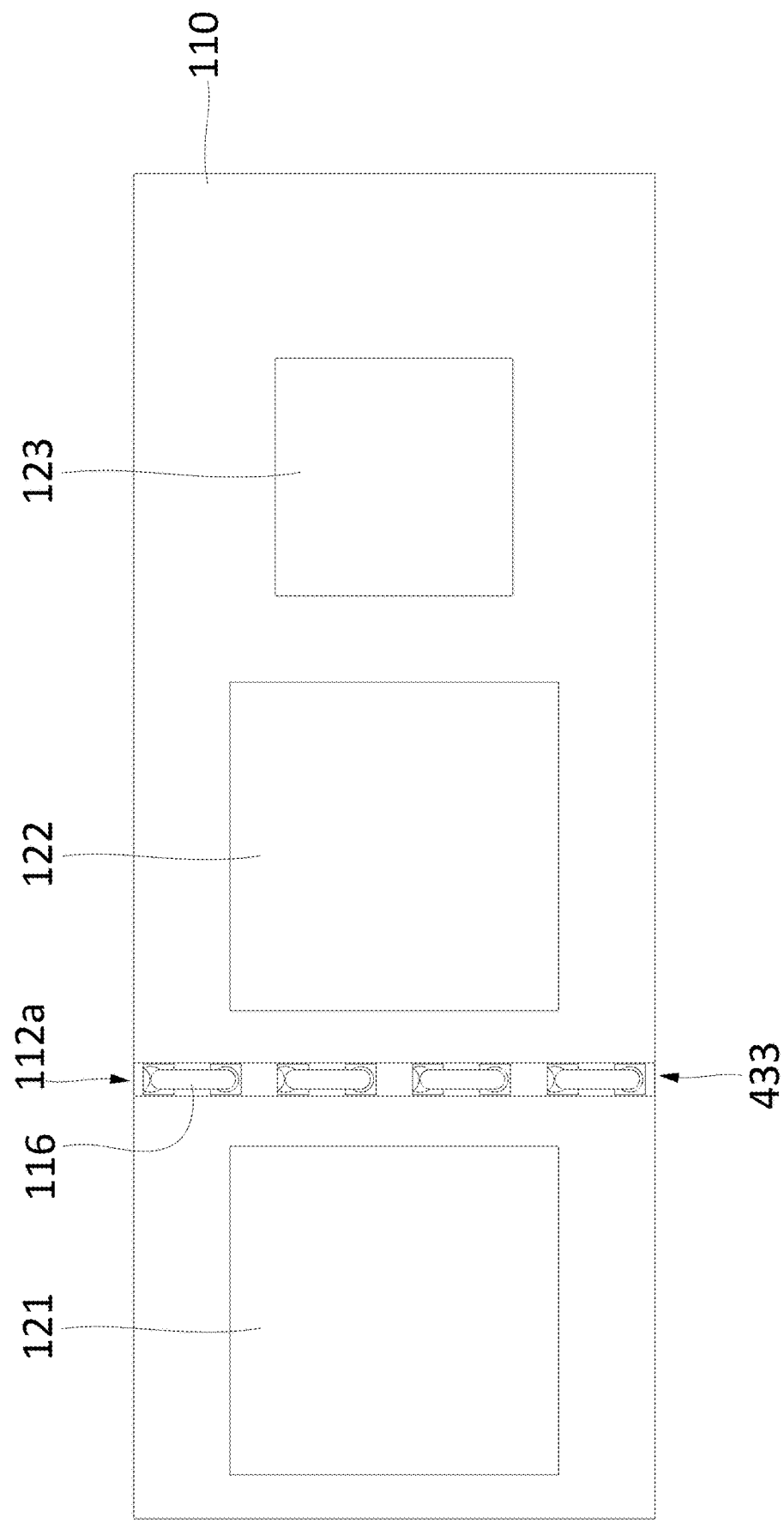
FIGS. 4A and 4B show a plan view and a cross-sectional view of an example method for manufacturing an example semiconductor device.
Figure 4B:
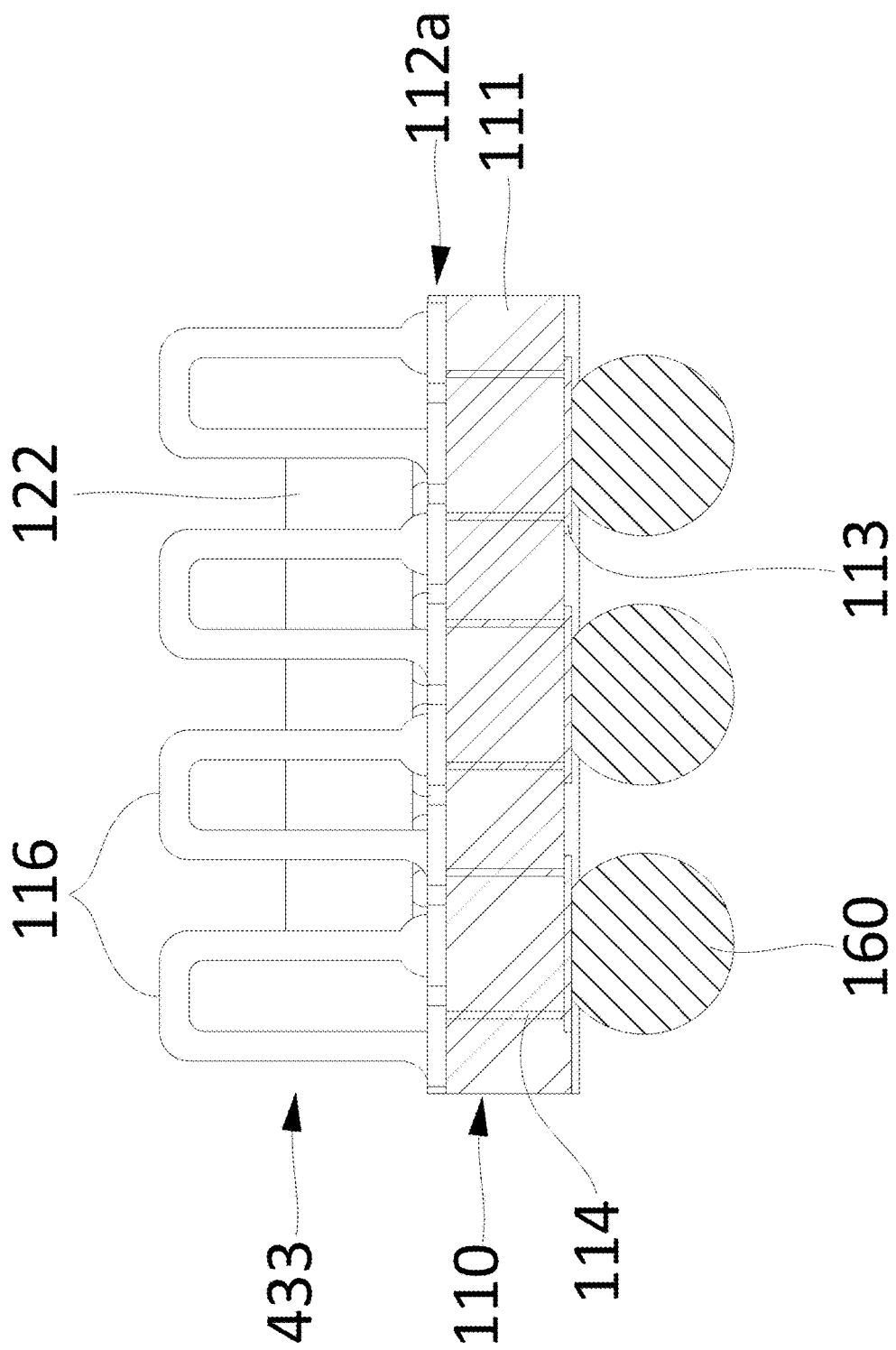

FIGS. 4A and 4B show plan view and cross-sectional view of an example method for manufacturing an example semiconductor device. In the example shown in FIGS. 4A and 4B, conductive wires 116 can be bonded to one or more conductors 112a (e.g., grounding conductive pads, traces, patterns) provided on substrate 110 to define compartment wall 433. In some examples, first ends of conductive wires 116 can be attached with a ball bond, and second ends of conductive wires 116 can be attached with a stitch bond. In some examples, multiple conductive wires 116 can be attached on substrate 110 in a substantially inverted U-pattern. In some examples, pitches between vertical portions of conductive wires 116 can be smaller than wavelengths of electromagnetic waves to be shielded. In some examples, a loop height of conductive wires 116 can be equal to or greater than a height of encapsulant 150, or conductive wires 116 can be electrically connected to conformal shield 140. In the example of FIG. 2C, trench 151 can be filled with a material to provide compartment wall 133 such that the compartment wall has a contiguous form or structure. In the example of FIG. 4B, the compartment wall 433 can comprise one or more conductive wires 116, where in some examples the conductive wires 116 can be discontinuous, separate wires that are connected via conductors 112, and in other examples one or more of the conductive wires 116 an comprise a continuous wire structure. In one example, a single, continuous conductive wire 116 can be provided that is arranged is a vertical zig-zag pattern to provide the compartment wall 433. In some examples, after conductive wires 116 are covered by encapsulant 150, the top ends of conductive wires 116 can be exposed through top surface of encapsulant 150, or the top surface of encapsulant 150 can be grinded to expose the top ends of conductive wires 116. Conformal shield 140 can be formed as previously described, and can contact and conform to the exposed portions of conductive wires 116 of compartment wall 433. Although compartment wall 433 is shown as comprising multiple adjacent wires, there can be examples where a single wire can be repeatedly looped and stitch-bonded in adjacent inverted U-patterns to one or more conductors 112a along the length of the wall to define compartment wall 433. Although compartment wall 433 is shown as comprising multiple adjacent bent wires with a substantially inverted-U pattern there can be examples where multiple vertical wires are bonded adjacent each other, each having a single substantially vertical leg instead of an inverted-U pattern with multiple vertical legs.

Figure 5:
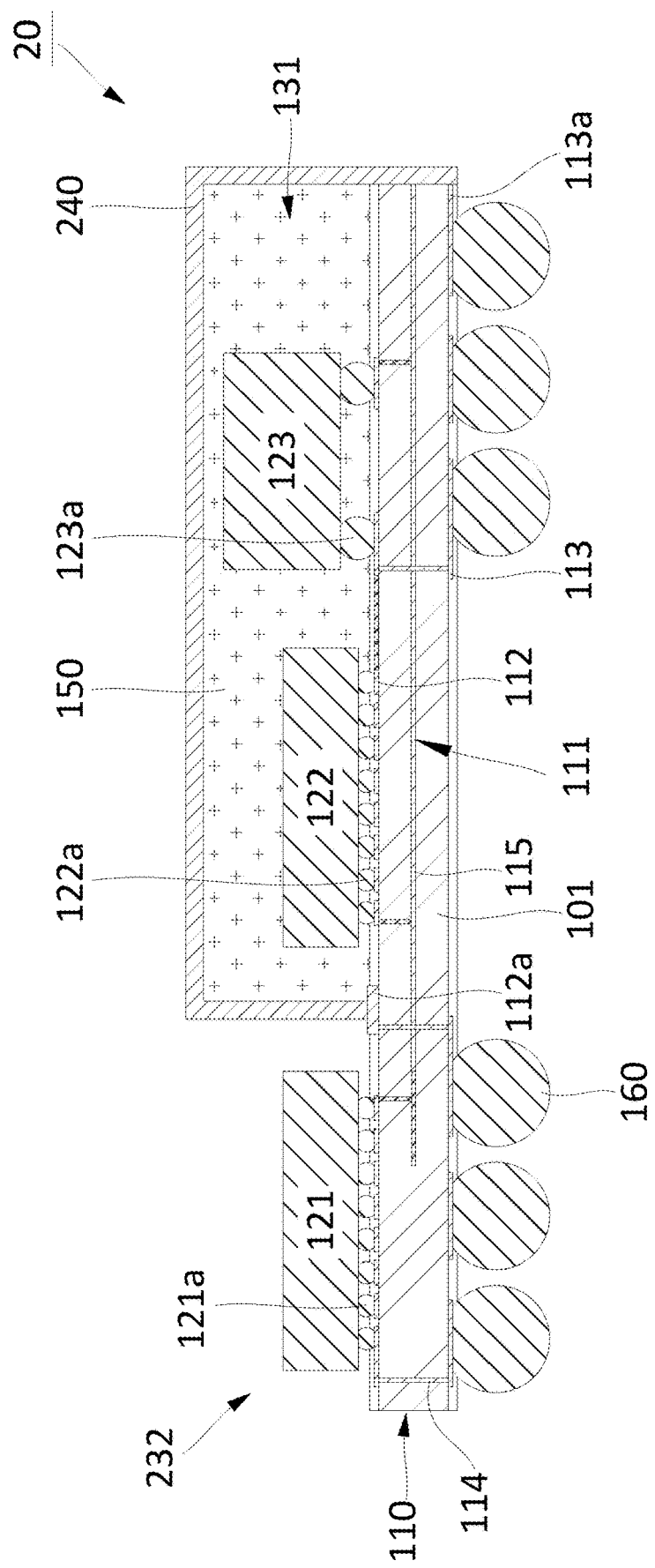
FIG. 5 shows a cross-sectional view of an example semiconductor device.

FIG. 5 shows a cross-sectional view of an example semiconductor device 20. Semiconductor device 20 shown in FIG. 5 can be similar to semiconductor device 10 shown in FIG. 1, but can be formed by partial encapsulation.

In the example shown in FIG. 5, semiconductor device 20 can comprise substrate 110, electronic components 121, 122, or 123, compartments 131 and 232, conformal shield 240, encapsulant 150, and external interconnects 160. In some examples, compartment 232 can comprise or be referred as the area or volume at or above the portion of substrate 110 not covered by encapsulant 150 or shield 240. In some examples, electronic component 121 can be positioned at compartment 232 remaining exposed from encapsulant 150 or shield 240. In some examples, electronic components 122 or 123 can be positioned in compartment 131 covered by encapsulant 150 and shield 240.

In some examples, conformal shield 240 can be positioned at compartment 131 including encapsulant 150. In some examples, conformal shield 240 can be positioned on the top and side surfaces of encapsulant 150, and on exposed sides of substrate 110.

FIGS. 6A to 6H show cross-sectional views of an example method for manufacturing an example semiconductor device 20. Example method for manufacturing semiconductor device 20 shown in FIGS. 6A to 6H can be similar to the example method for manufacturing semiconductor device 10 shown in FIGS. 2A to 2J, except that partial encapsulation is employed.

Figure 6A:
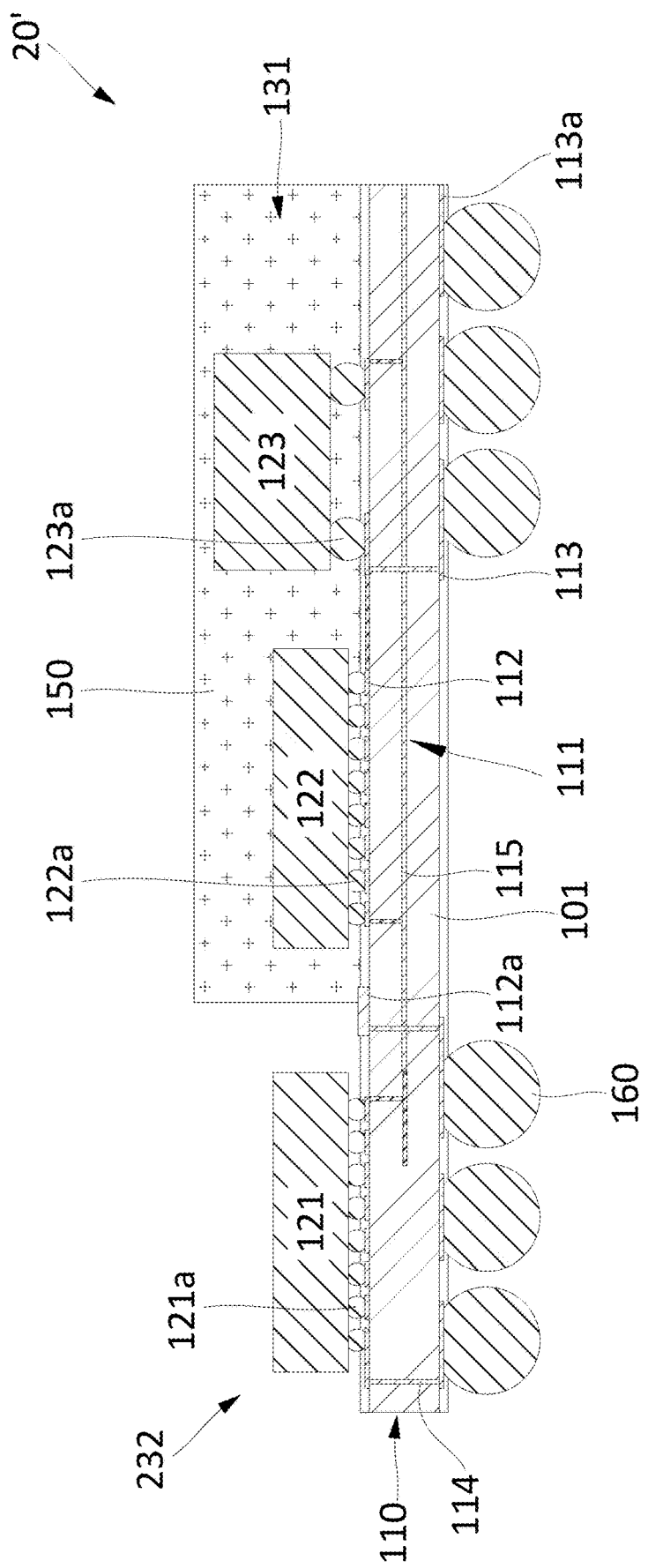
FIGS. 6A to 6H show cross-sectional views of an example method for manufacturing an example semiconductor device.

FIG. 6A shows a cross-sectional view of semiconductor device 20' at an early stage of manufacture. In some examples, the stage shown in FIG. 6A can be similar to the stage described above with respect to FIG. 2A. In the example shown in FIG. 6A, semiconductor device 20' can comprise substrate 110, electronic components 121, 122, or 123, compartments 131 and 232, encapsulant 150, and external interconnects 160. In some examples, electronic component 121 can be exposed, and electronic components 122 or 123 can be covered by encapsulant 150. Electronic component 121 can be provided at compartment 232, and electronic components 122 or 123, and encapsulant 150 can be provided at compartment 131. Encapsulant 150 can be provided by partial encapsulation, where the desired portion over substrate 110 corresponding to compartment 232 can be masked prior to application of encapsulant 150, such that encapsulant 150 covers only compartment 131 and compartment 232 is exposed. Encapsulant 150 can be provided on the top side of substrate 110 such that encapsulant can contact a lateral side of electronic component 122 or electronic component 123, but electronic component 121 can be free of encapsulant 140. In some examples, such masking can be achieved by a temporary lid or dielectric layer, or by a custom mold chase plate, that covers the area of compartment 232 over substrate 110 during the application of encapsulant 150.

Figure 6B:
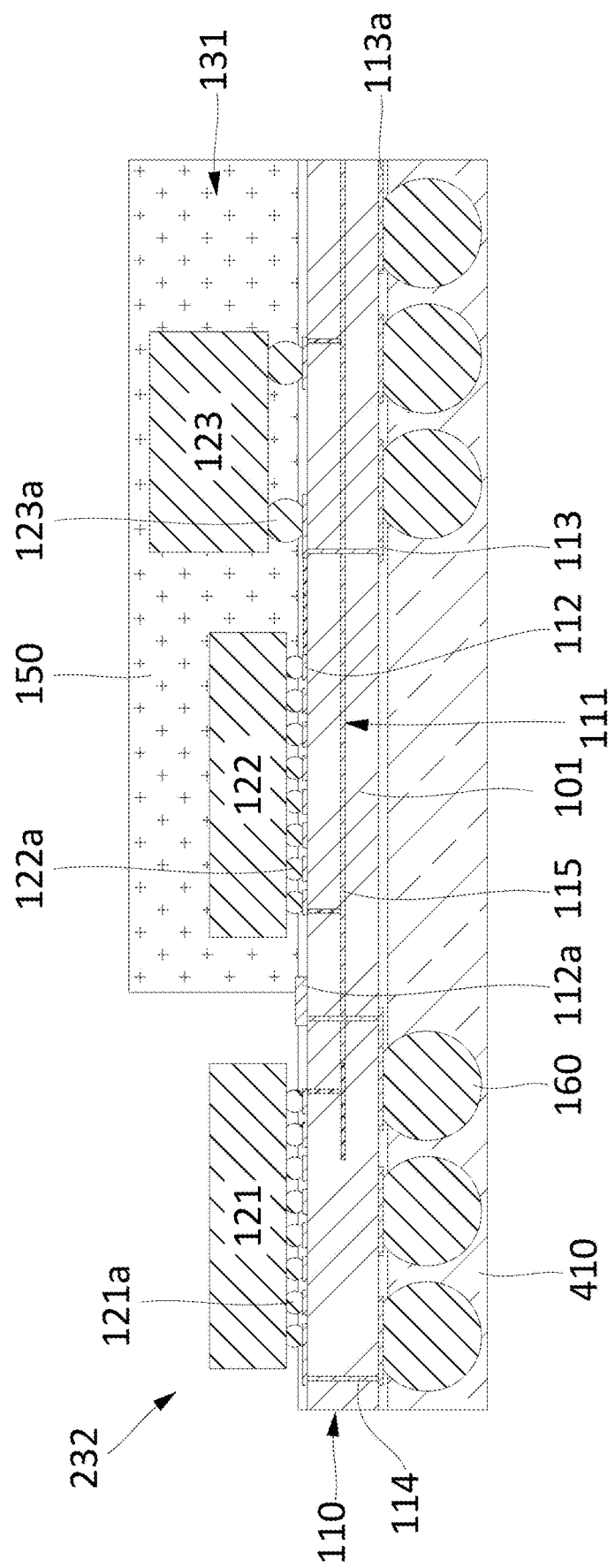

FIG. 6B shows a cross-sectional view of semiconductor device 20 at a later stage of manufacture. In some examples, the stage shown in FIG. 6B can be similar to the stage described above with respect to FIG. 2D. In the example shown in FIG. 6B, temporary film 410 can be adhered to substrate 110 and external interconnects 160. In some examples, temporary film 410 can enclose external interconnects 160.

Figure 6C:
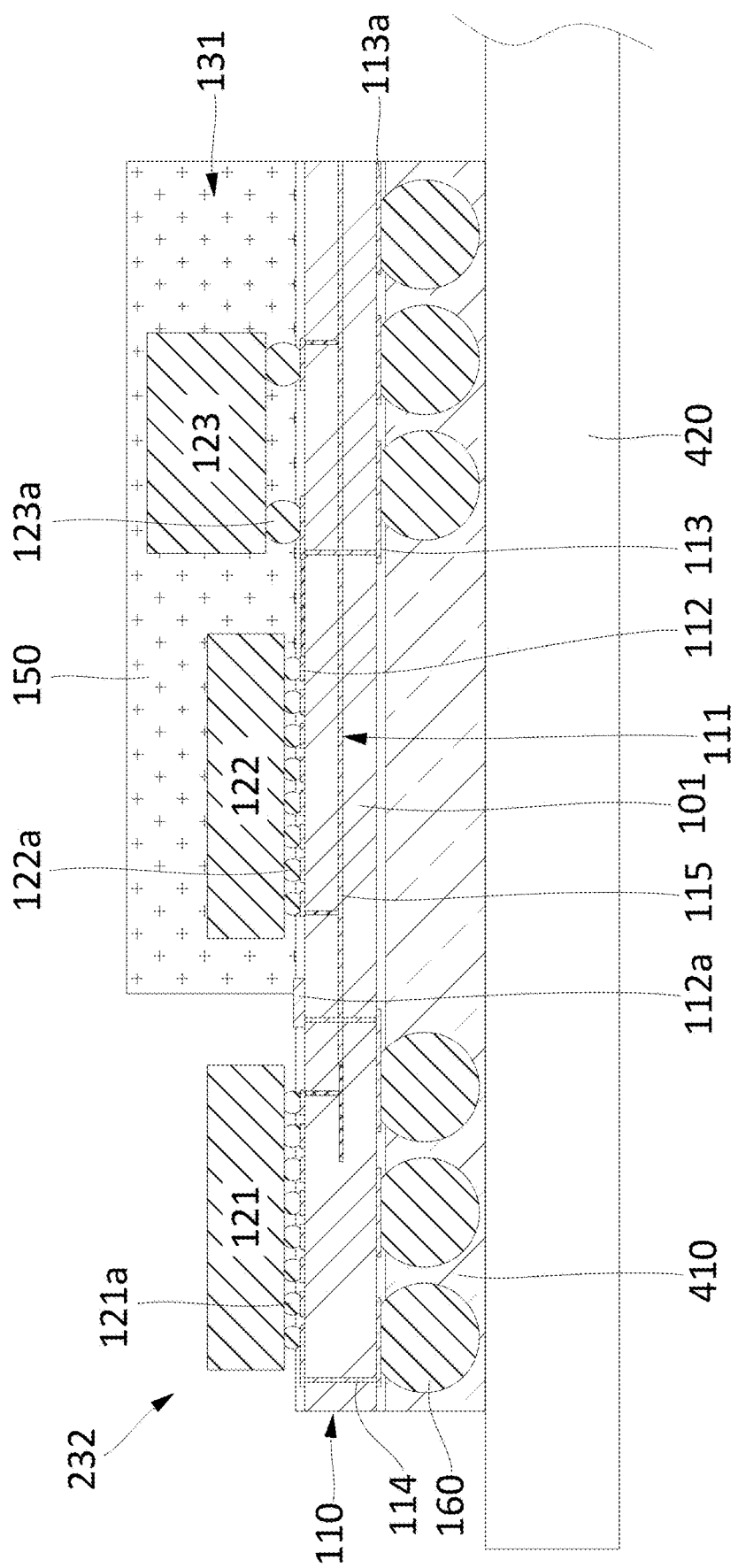

FIG. 6C shows a cross-sectional view of semiconductor device 20 at a later stage of manufacture. In some examples, the stage shown in FIG. 6C can be similar to the stage described above with respect to FIG. 2E. In the example shown in FIG. 6C, temporary film 410 can be mounted on carrier 420.

Figure 6D:
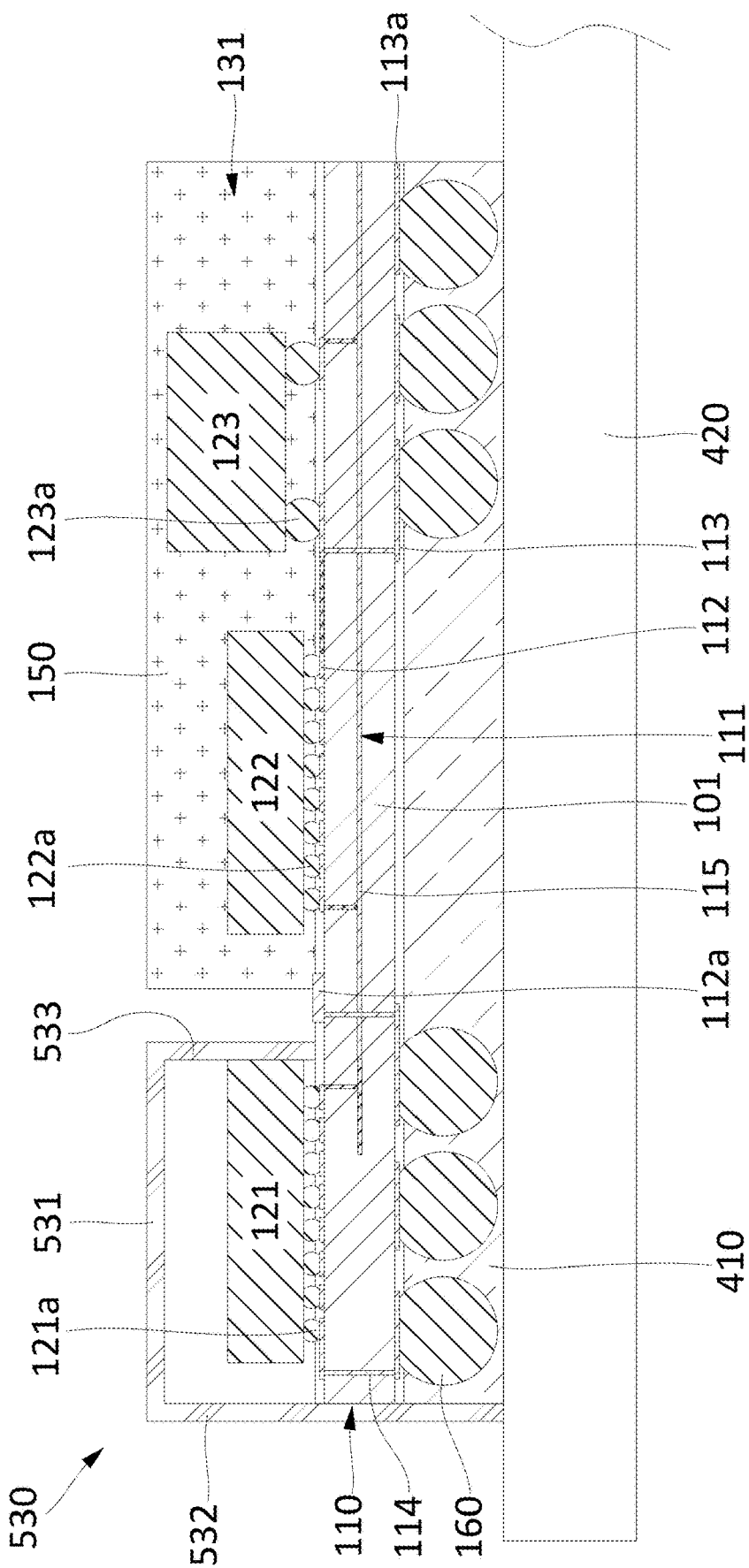

FIG. 6D shows a cross-sectional view of semiconductor device 20 at a later stage of manufacture. In some examples, the stage shown in FIG. 6D can be similar to the stage described above with respect to FIG. 2F. In the example shown in FIG. 6D, cover 530 can surround compartment 232, while encapsulant 150 over compartment 131 can remain exposed. Cover 530 can be similar to cover 430 described above. In some examples, cover 530 can comprise top cover 531 covering a top portion of compartment 232 and electronic component 121, and side covers 532 or 533 covering side portions of compartment 232 and electronic component 121. In some examples, a bottom end of side cover 532 can be adhered to carrier 420, and a bottom end of side cover 533 can be brought into contact with substrate 110.

Figure 6E:
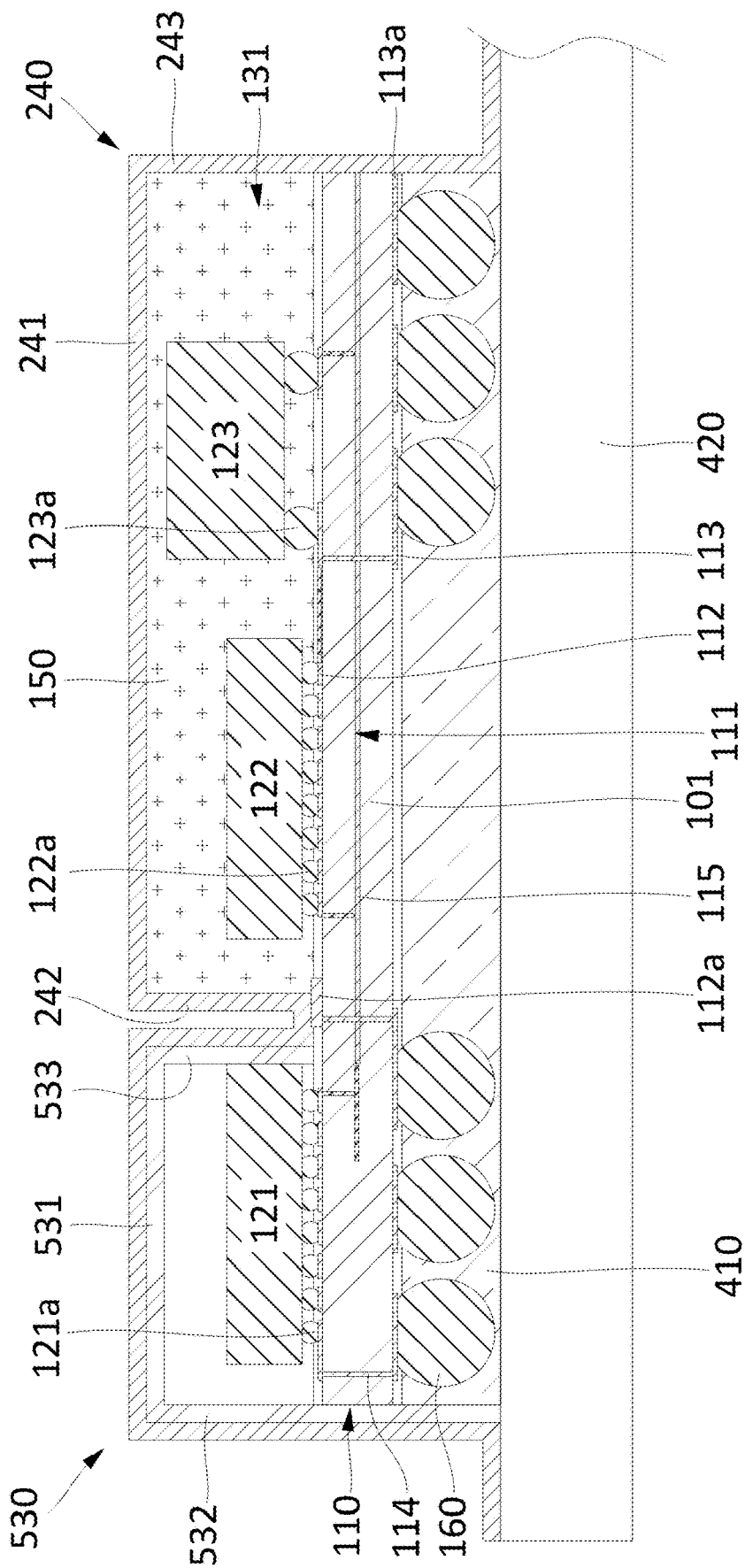

FIG. 6E shows a cross-sectional view of semiconductor device 20 at a later stage of manufacture. In some examples, the stage shown in FIG. 6E can be similar to the stage described above with respect to FIG. 2G. In the example shown in FIG. 6E, conformal shield 240 can be provided. Conformal shield 240 can be similar to conformal shield 140 described above. In some examples, conformal shield 240 can be formed on cover 530 and on compartment 131. In some examples, conformal shield 240 can be formed on top and side surfaces of compartment 131, on a side surface of substrate 110, and on a side surface of temporary film 410. In some examples, conformal shield 240 can comprise top shield 241 formed on top side of compartment 131, and side shields 242 and 243 formed on side surfaces of compartment 131. In some examples, top shield 241, side shield 242, or side shield 243 can be referred to as a compartment wall, or such compartment walls can share a single continuous conductive layer. In some examples, side shield 242 can be between electronic component 121 and electronic component 122 or electronic component 123. Side shield 242 can contact a lateral side of encapsulant 150, and encapsulant 150 can contact a lateral side of electronic component 122 or electronic component 123. In some examples, side shield 243 can contact another lateral side of encapsulant 150, and conformal shield 240 can define compartment 131 containing electronic device 122 or electronic device 123 and excluding electronic device 121. Side shield 243 can cover a lateral side of substrate 110. In some examples, conformal shield 240 can be electrically connected to conductors 112a or 113a (e.g., grounding conductive pads, traces, patterns) or ground plane 115 of substrate 110. Conformal shield 240 can prevent the electromagnetic waves generated from electronic components 122 or 123 provided within compartment 131 from being radiated to the exterior of compartment 131. Conformal shield 240 can prevent the electromagnetic waves exterior to the compartment 131 from affecting electronic components 122 or 123 provided within compartment 131. In some examples, ground plane conductor 115 can be below a majority of an area of compartment 131.

Figure 6F:
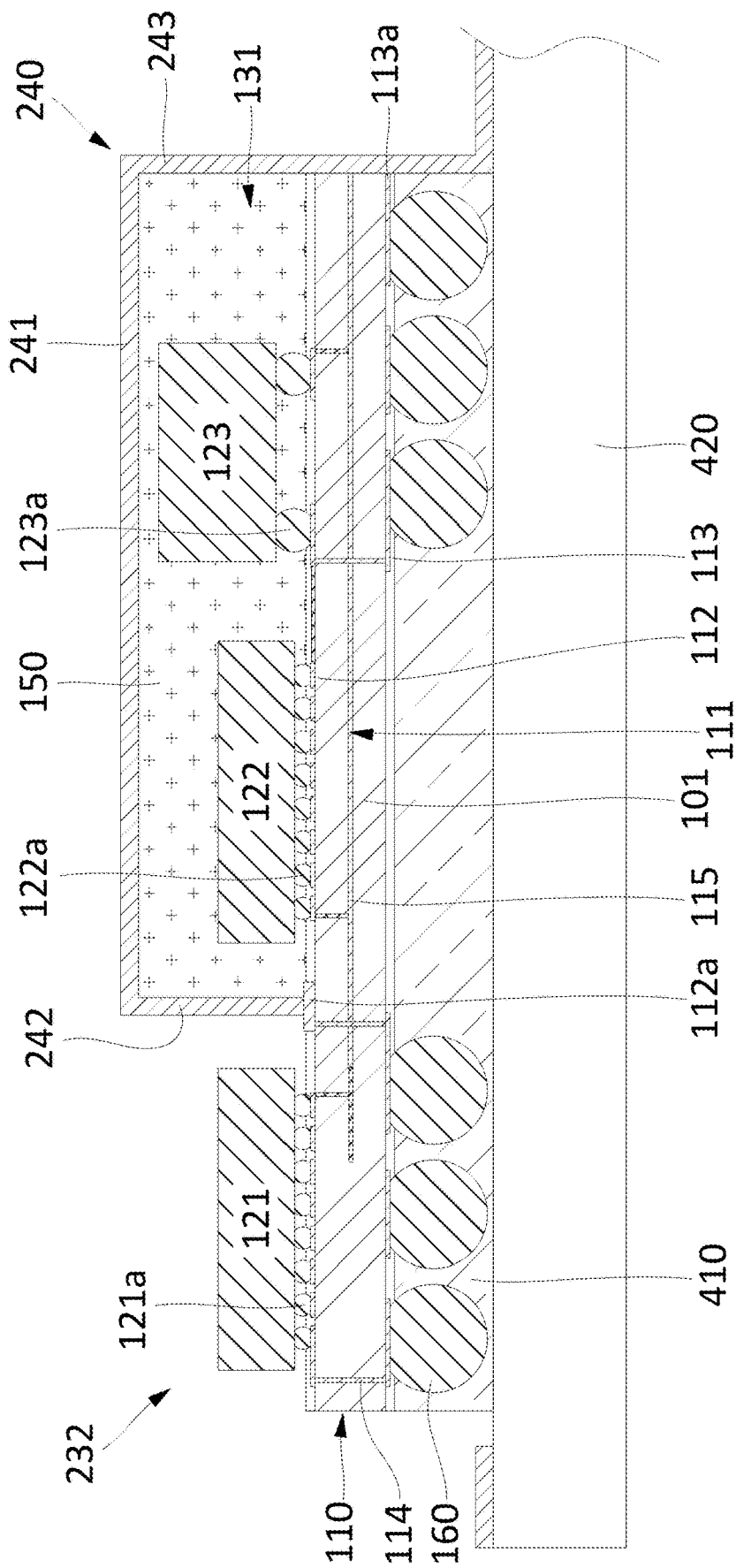

FIG. 6F shows a cross-sectional view of semiconductor device 20 at a later stage of manufacture. In some examples, the stage shown in FIG. 6F can be similar to the stage described above with respect to FIG. 2H. In the example shown in FIG. 6F, cover 530 can be removed. In some examples, the bottom of cover 530 can be separated from carrier 420 or from substrate 110 to expose compartment 232 with electronic component 121. Electronic component 121 can wirelessly communicate with an external device unobstructed by shield 240.

Figure 6G:
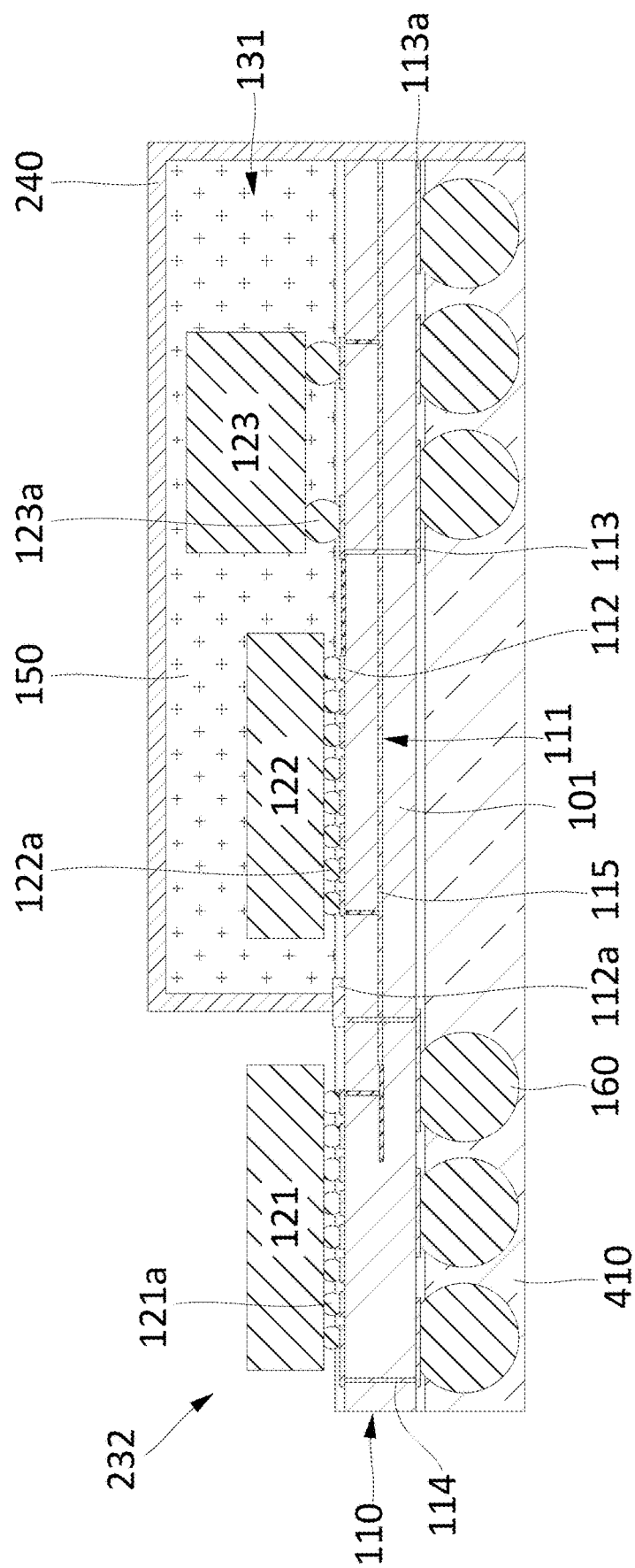

FIG. 6G shows a cross-sectional view of semiconductor device 20 at a later stage of manufacture. In some examples, the stage shown in FIG. 6G can be similar to the stage described above with respect to FIG. 2I. In the example shown in FIG. 6G, carrier 420 can be removed. In some examples, a pick-and-place tool can pick up semiconductor device 20 while lifting carrier 420 with a needle, thereby separating temporary film 410 from carrier 420.

Figure 6H:
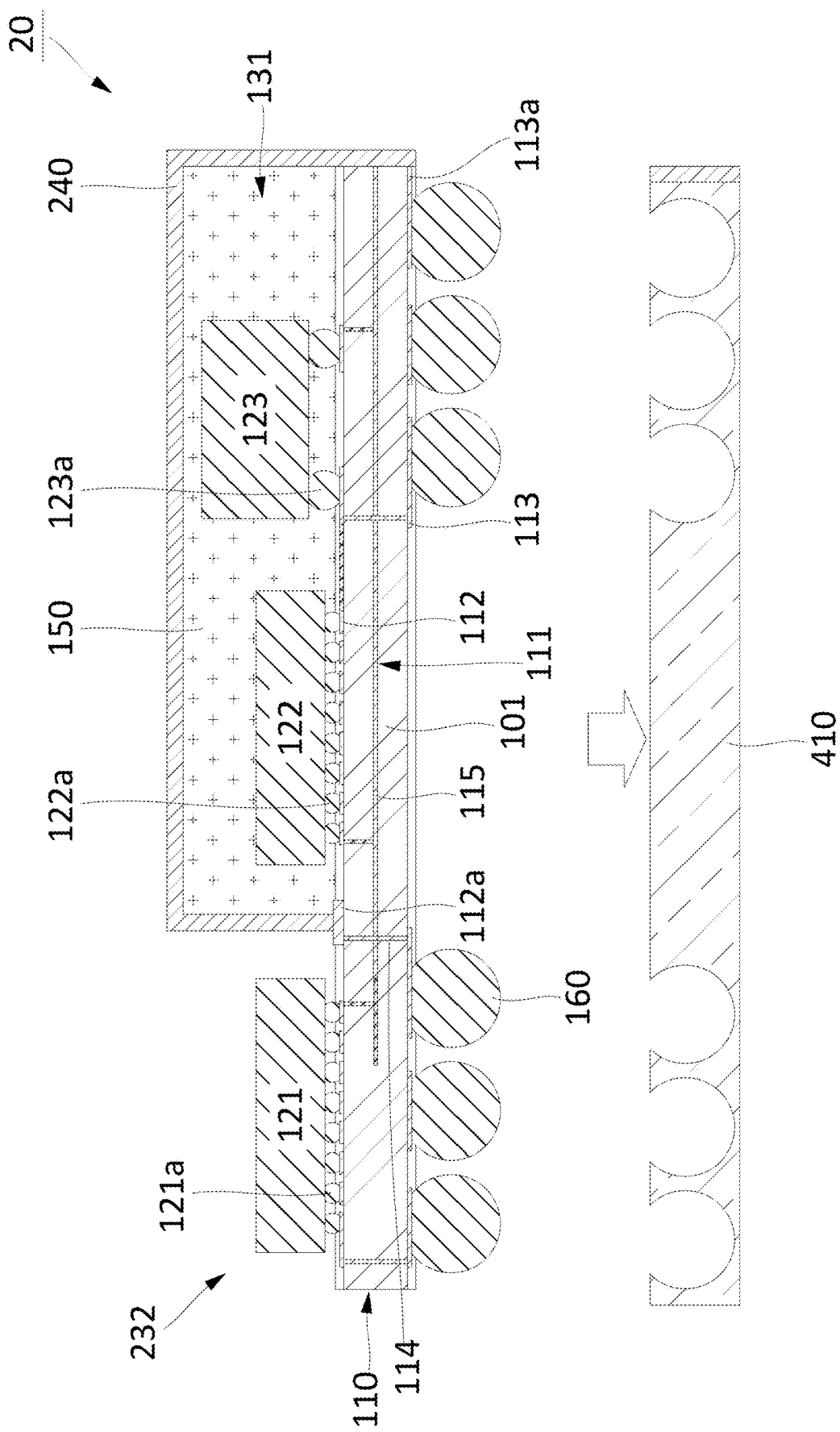

FIG. 6H shows a cross-sectional view of semiconductor device 20 at a later stage of manufacture. In some examples, the stage shown in FIG. 6H can be similar to the stage described above with respect to FIG. 2J. In the example shown in FIG. 6H, temporary film 410 can be removed. In some examples, temporary film 410 can be released from substrate 110 and external interconnects 160, thereby exposing external interconnects 160.

Figure 7:
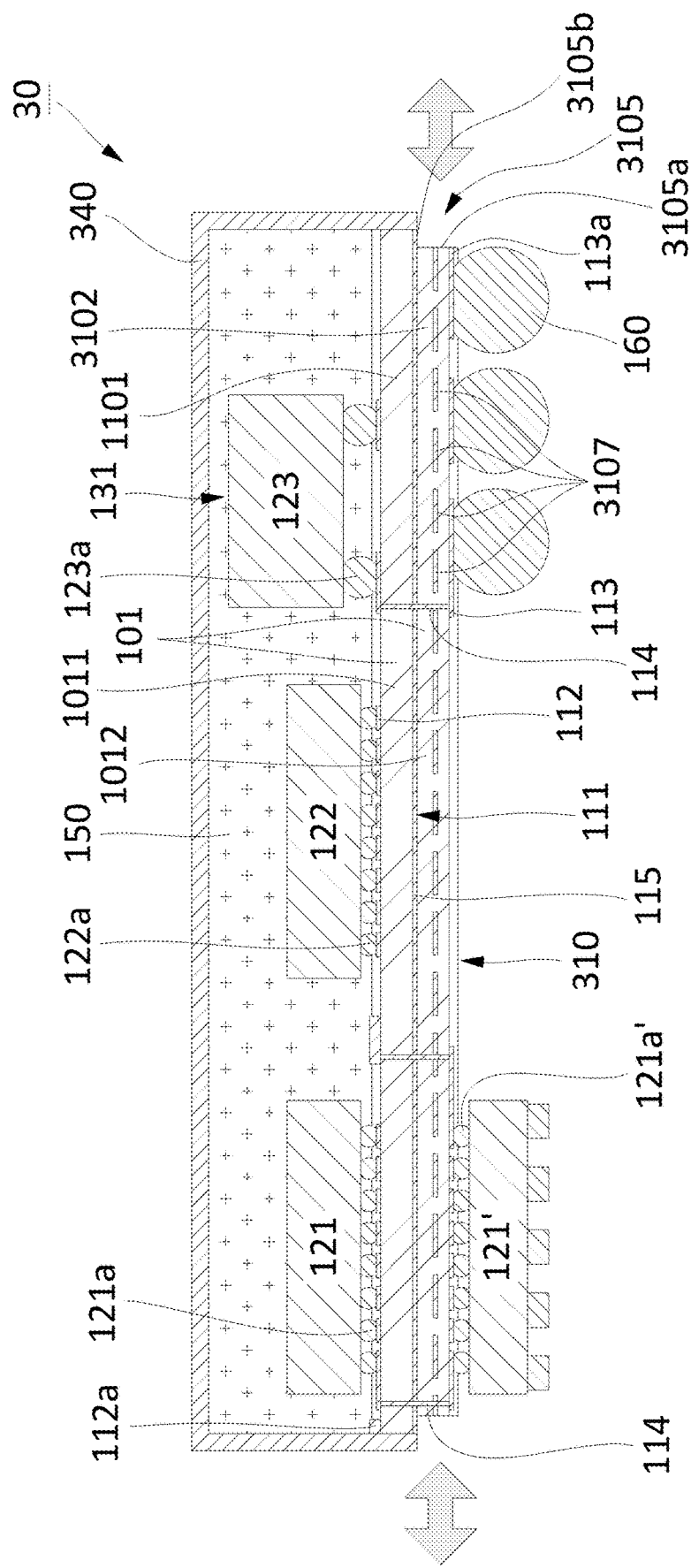
FIG. 7 shows a cross-sectional view of an example semiconductor device.

FIG. 7 shows a cross-sectional view of an example semiconductor device 30. Semiconductor device 30 shown in FIG. 7 can be similar to semiconductor devices 10 and 20 shown in FIG. 1 or FIG. 5, and can comprise substrate 310 having one or more communication structures 3107 or one or more grooves 3105.

In the example shown in FIG. 7, semiconductor device 30 can comprise substrate 310, one or more electronic components 121, 122, 123, or 121', compartment 131, conformal shield 340, encapsulant 150, and external interconnects 160. In some examples, substrate 310 can comprise shielded substrate section 1101, exposed substrate section 3102, substrate groove 3105, and one or more communication structures 3107. Communication structures 3107 can be coupled with substrate 310. In some examples, substrate can comprise substrate groove 3105 which can comprise vertical groove side 3105a and horizontal groove side 3105b. Communication structures 3107 can comprise an antenna in substrate 310. In some examples, communication structures 3107 can be laterally bound by the vertical groove side 3105a, and vertical groove side 3105a can be uncovered by shield 340.

Substrate 310 can comprise dielectric structure 101 having dielectric 1011 or dielectric 1012, each having one or more dielectric layers. Substrate 310 can comprise conductive structure 111. In some examples, electronic components 121, 122, or 123 can be positioned on the top side of substrate 310 and can be covered by encapsulant 150, and electronic component 121' can be positioned on the bottom side of substrate 310 and can be remain exposed. In some examples, encapsulant 150 can be over substrate 310 and can contact a lateral side of one or more of electronic components 121, 122, or 123. Electronic component 121' can be similar to electronic components 121, 122, or 123. For instance, electronic component 121' can comprise one or more antenna structures or one or more connectors for interfacing or communicating with an external device. In some examples, communication structure 3107 can comprise an antenna of electronic component 121'. Electronic component 121' can represent one or more electronic components 121' coupled with the bottom side of substrate 310. In some examples, electronic component 121' can comprise interconnects 121a' coupling electronic component 121' with substrate 310. Electronic component 121' can be coupled with substrate 310 external to encapsulant 150, for example opposite to the side of substrate 310 having encapsulant 150. Conformal shield 340 can cover compartment 131 or encapsulant 150. In some examples, shield 340 can be over encapsulant 150 and can contact a lateral side of encapsulant 150. Shield 340 can contact a portion of a lateral side of substrate 310. In some examples, a portion of groove 3105 can be uncovered by shield 340.

FIGS. 8A to 8F show cross-sectional views of an example method for manufacturing example semiconductor device 30. The manufacturing method of example semiconductor device 30 shown in FIGS. 8A to 8F can be similar to the manufacturing method of semiconductor devices 10 or 20 of FIGS. 2A-2J or FIGS. 6A-6H, and operations can be carried out to define groove 3105 or to provide one or more electronic components 121'.

Figure 8A:
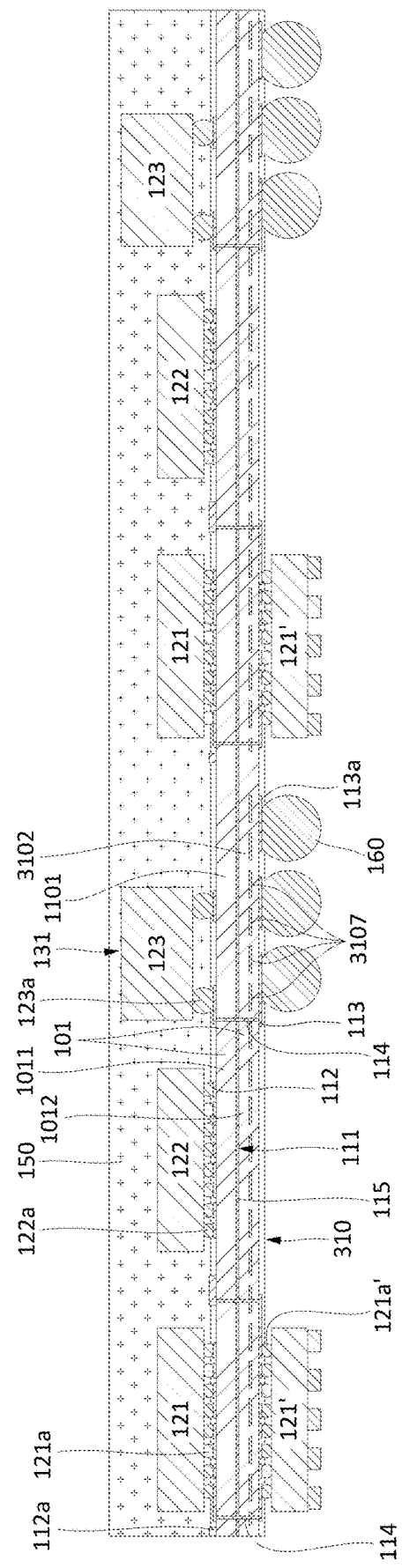
FIGS. 8A to 8F show cross-sectional views of an example method for manufacturing an example semiconductor device.

FIG. 8A shows a cross-sectional view of semiconductor device 30 at an early stage of manufacture. In the example shown in FIG. 8A, semiconductor device 30 can comprise substrate 310 having a top side and a bottom side, electronic components 121, 122, 123, or 121', compartment 131, encapsulant 150, and external interconnects 160. Substrate 310 can comprise shielded substrate section 1101 and exposed substrate section 3102. In some examples, conductor 115 can be interposed between shielded substrate section 1101 and exposed substrate section 3102. As will further be described below, during the manufacture of semiconductor device 30, conformal shield 340 can cover lateral sides of shielded substrate section 1101, leaving lateral sides of exposed substrate section 3102 exposed.

Substrate 310 can comprise conductive structure 111. In some examples, communication structures 3107 can be provided at or coupled with exposed substrate section 3102. In some examples, communication structures 3107 can be part of conductive structure 111. Accordingly, the material, thickness or width of communication structures 3107 can be similar to those of conductive structure 111. In some examples, communication structures 3107 can be provided adjacent or parallel to conductor 115. In some examples, communication structures 3107 can be fully or partially encapsulated by exposed substrate section 3102. In some examples, communication structures 3107 can be embedded into exposed substrate section 3102. In some examples, communication structures 3107 can be exposed at or coupled to the bottom side of exposed substrate section 3102. In some examples, communication structures 3107 can be coupled with substrate 310. In some examples communication structures 3107 can be referred to as antenna structures, antenna elements, antenna devices, radio-frequency (RF) devices, or embedded components. In some examples, communication structures 3107 or conductor 115 can define respective antenna elements. For instance, the antenna elements of communication structures 3107 and of ground plane conductor 115 can combine to provide antenna functionality. In some examples, communication structures 3107 can be electrically connected to at least one of electronic components 121, 122, 123, or 121' to transmit or receive wireless signals to or from an external device.

In some examples, dielectric 1011 or dielectric 1012 can each comprise one or more dielectric layers. In some examples, communication structures 3107 can be fully or partially encapsulated by dielectric 1012. In some examples, communication structures 3107 can be embedded into dielectric 1012. In some examples, communication structures 3107 can be exposed at or coupled to the bottom side of dielectric 1012.

In some examples, electronic component 121' can be coupled to conductors 113 at the bottom side of substrate 310 through interconnects 121a'. As previously noted, electronic component 121' can be similar to electronic components 121, 122, or 123. In some examples, however, electronic component 121' can be optional. For instance, in some examples electronic component 121' can be replaced by additional external interconnects 160. In some examples, electronic component 121' can be positioned between external interconnects 160.

In some examples, electronic components 121, 122, or 123 can be positioned in compartment 131 on the top side of substrate 310 to then be covered by encapsulant 150. Encapsulant 150 can contact a lateral side of electronic components 121, 122, or 123. In some examples, encapsulant 150 can be formed by compression molding, transfer molding, liquid-phase encapsulant molding, vacuum lamination, paste printing, or film assist molding. Encapsulant 150 can cover electronic components 121, 122, or 123 to protect these components in the package from external elements or environmental exposure.

In some examples, semiconductor devices 30 can be provided in a strip or a matrix having rows and/or columns. Accordingly, encapsulant 150 can fully mold a plurality of neighboring semiconductor devices 30. In some examples, for formation of conformal shield 340, encapsulant 150, or substrate 310 can be fully or partially sawed or singulated.

Figure 8B:
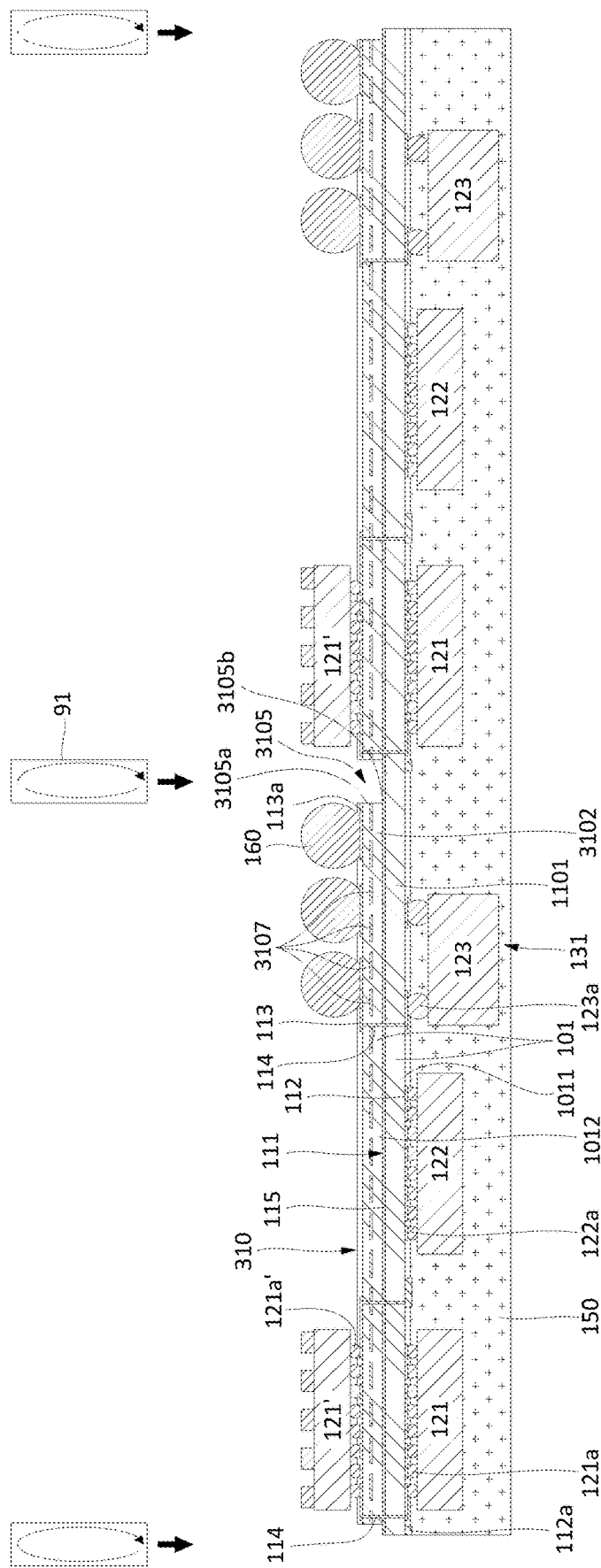

FIG. 8B shows a cross-sectional view of semiconductor device 30 at a later stage of manufacture. In the example shown in FIG. 8B, a grooving process. or a partial sawing or singulation process, can be performed on substrate 310. In some examples, exposed substrate section 3102 or dielectric 1012 of substrate 310 can be cut using singulation tool 91 to form substrate groove 3105 in substrate 310 on the bottom side of substrate 310. It is noted that substrate 310 is shown as inverted in FIG. 8B so that the singulation tool 91 cuts substrate groove 3105 on the bottom side of substrate 310. Substrate groove 3105 can comprise vertical groove side 3105a substantially parallel with the thickness direction of substrate 310 and horizontal groove side 3105b substantially parallel with the width direction of substrate 310. In some examples, sawing tool 91 can comprise a diamond wheel or a laser beam. In some examples, communication structures 3107 or conductor 115 can be exposed through substrate groove 3105 or horizontal groove side 3105b. In some examples, one or more of communication structures 3107 or conductor 115 can also be cut using sawing tool 91.

In some examples, grooving can be performed by a step cutting process or a bevel cutting process. For example, exposed substrate section 3102 can be cut or exposed using a first sawing tool having a first width, and shielded substrate section 1101 can be cut using a second sawing tool having a second width different or smaller than the first width. Accordingly, first groove 3105 having a relatively large first width can be formed through exposed substrate section 3102, and a second groove having a relatively small second width can be formed through shielded substrate section 1101. If bevel-cutting process is employed, the first groove formed through exposed substrate section 3102 can be inclined with respect to the thickness direction of the substrate. In some examples, the grooving performed as described with respect to FIG. 8B can be referred to as "dead bug" side sawing.

Figure 8C:
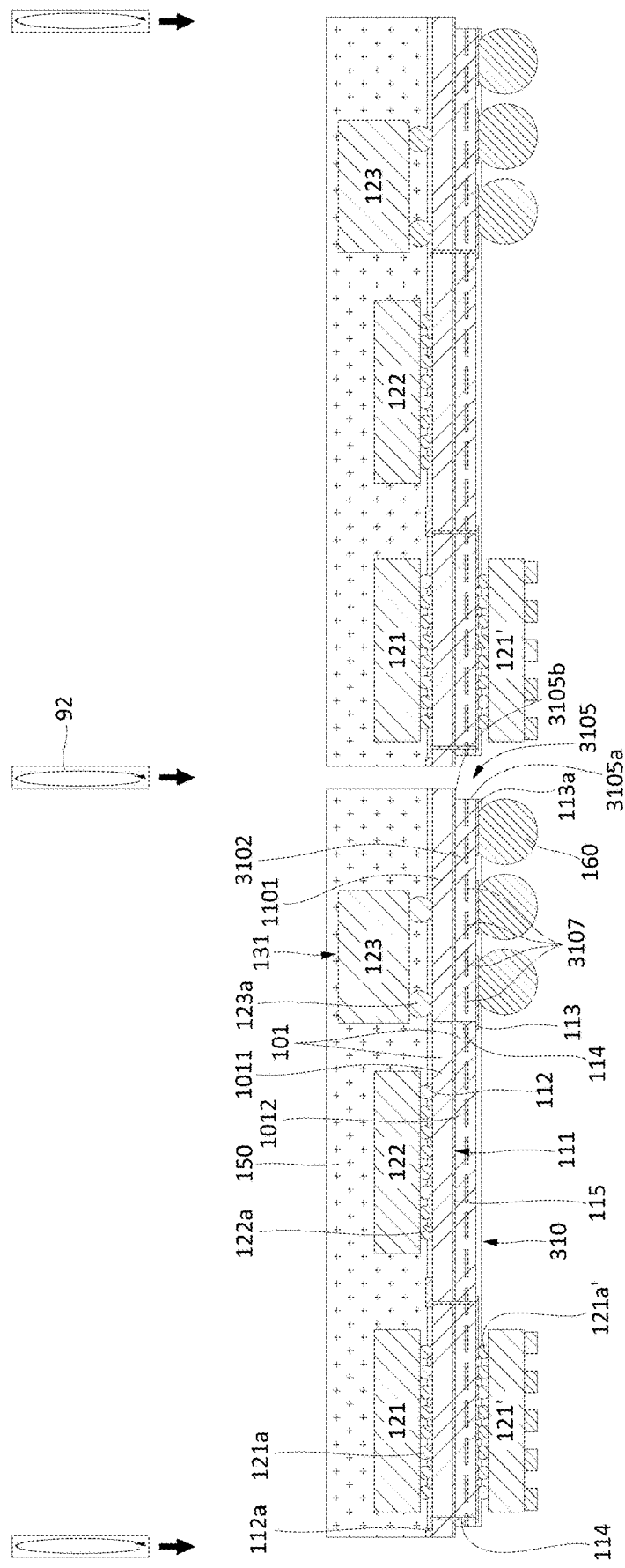

FIG. 8C shows a cross-sectional view of semiconductor device 30 at a later stage of manufacture. In the example shown in FIG. 8C, a singulation process, or full singulation process, can be performed through encapsulant 150 and shielded substrate section 1101 of substrate 310. In some examples, the cutting sawing can be performed by a full singulation or cutting process to obtain individual assemblies. In some examples, encapsulant 150 and shielded substrate section 1101 can be cut using sawing tool 92. Sawing tool 92 can have a smaller width than sawing tool 91 of FIG. 8B.

In some examples, as the result of sawing encapsulant 150 and shielded substrate section 1101, lateral sides of encapsulant 150, of shielded substrate section 1101, of dielectric 1011, or of conductors 112a or 115, can be exposed. In some examples, sawing performed as described with respect to FIG. 8C can be referred to as "live bug" side sawing.

In some examples, since the width of sawing tool 91 used for FIG. 8C is wider than that of sawing tool 92 used for FIG. 8B, substrate groove 3105 can still remain at a lateral side of the singulated individual assembly, for example at a lateral side of substrate 310.

Figure 8D:
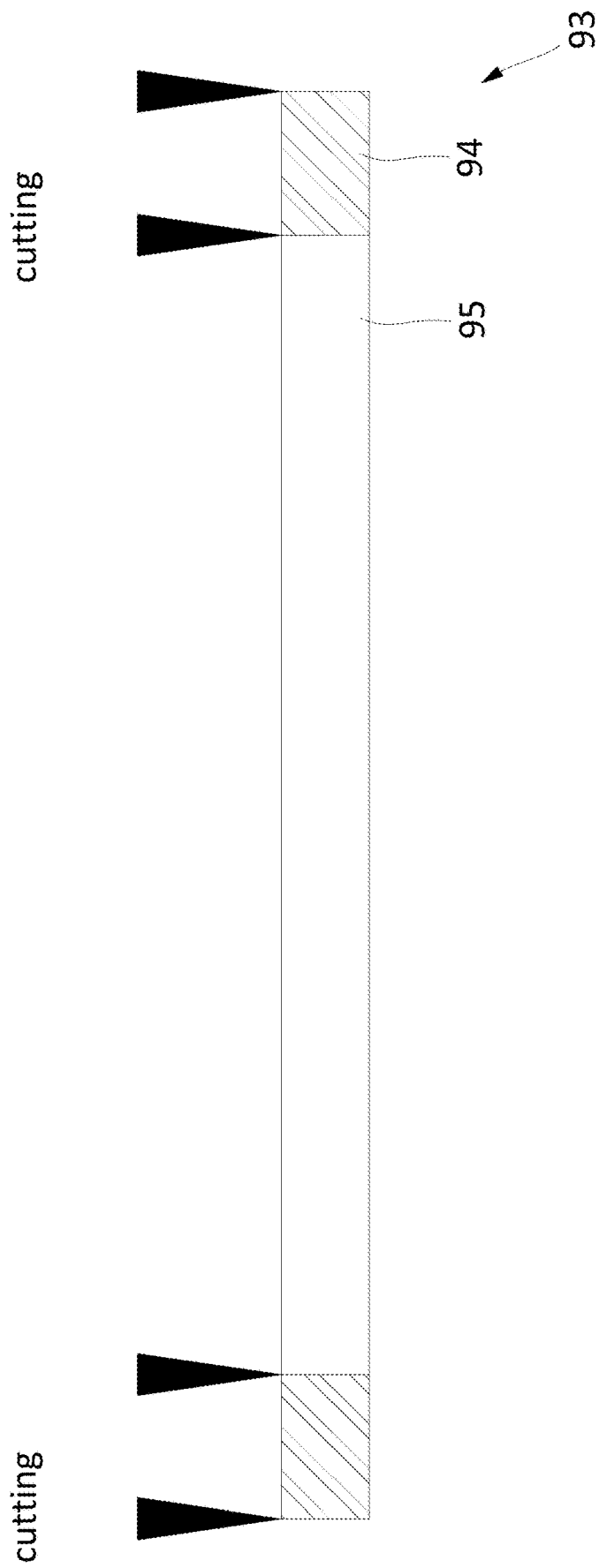

FIG. 8D shows a cross-sectional view of carrier film. Carrier 93 can comprise carrier base 94 and cavity 95 formed in carrier base 94. The width of cavity 95 can be equal to or similar to that of singulated substrate 310 or semiconductor device 30 of FIG. 8C. In some examples, cavity 95 can be formed by cutting some regions of carrier base 94 using a laser beam, a punch, or a cutter. In some examples carrier 93 can comprise a film such as polyethylene, polypropylene, polyethylene terephthalate, or polyimide. In some examples, multiple cavities 95 can be formed in one carrier 93 so that multiple individual assemblies can be coupled to carrier 93 for simultaneous processing.

Figure 8E:
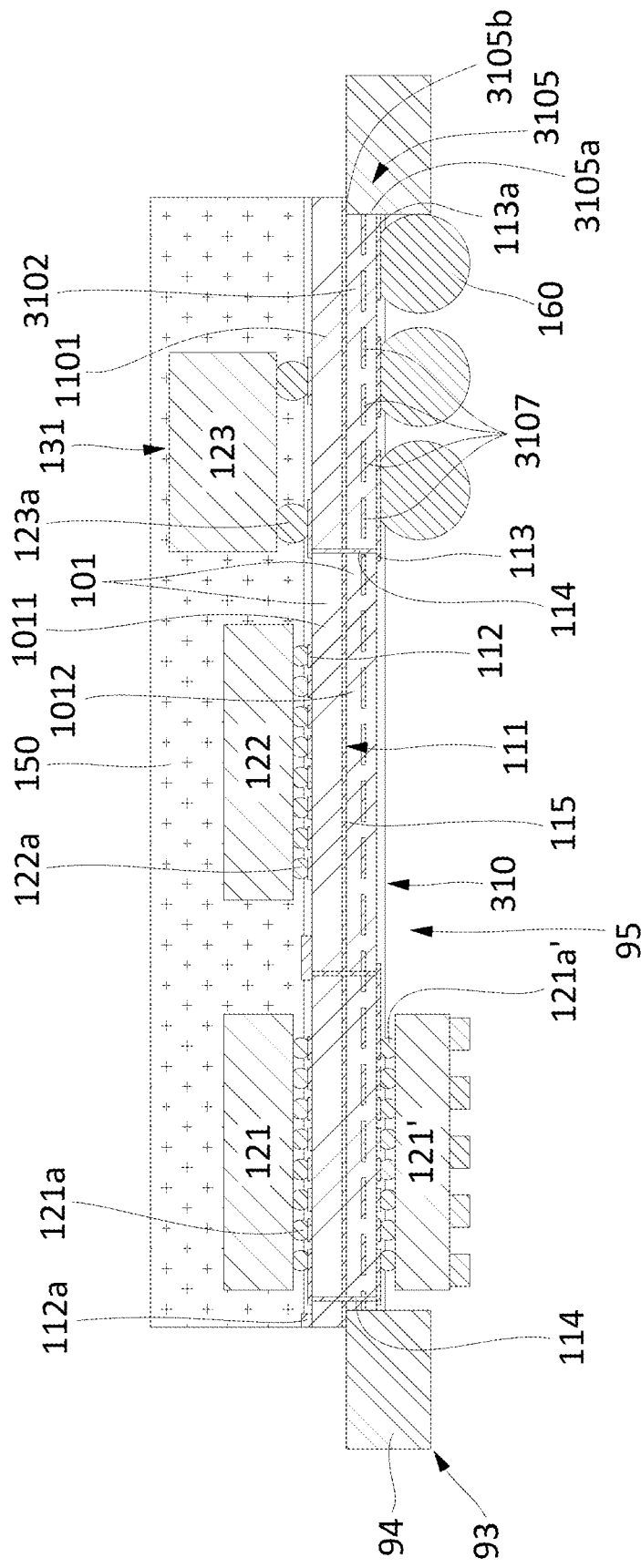

FIG. 8E shows a cross-sectional view of semiconductor device 30 at a later stage of manufacture. In the example shown in FIG. 8E, singulated semiconductor device can be mounted on carrier 93. In some examples, substrate 310 can be coupled to cavity 95 of carrier 93. In some examples, electronic component 121' or groove 3105 can be in the cavity 95 of carrier 94 on the bottom side of substrate 310. In some examples, vertical groove side 3105a of substrate groove 3105 in substrate 310 can couple or be adjacent with the inner wall of cavity 95, and horizontal groove side 3105b of substrate groove 3105 can couple or be adjacent to the top side of carrier base 94 located outside cavity 95. In some examples, carrier 94 can cover vertical groove side 3015a or horizontal groove side 3105b of groove 3105.

Figure 8F:
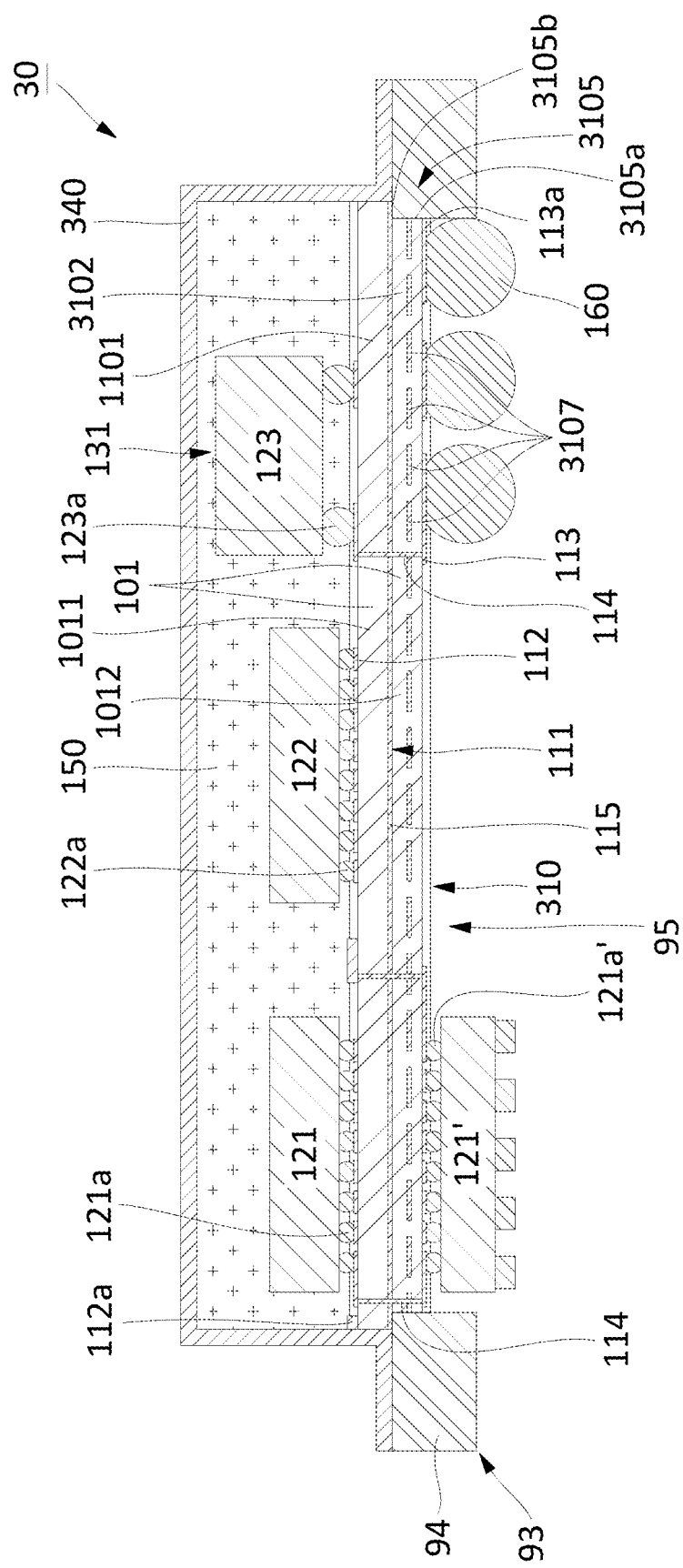

FIG. 8F shows a cross-sectional view of semiconductor device 30 at a later stage of manufacture. In the example shown in FIG. 8F, conformal shield 340 can be provided. In some examples, conformal shield 340 can be similar to conformal shield 140 or 240. Conformal shield 340 can be initially formed to cover encapsulant 150, shielded substrate section 1101 of substrate 310, and the top of carrier 93.

In some examples, conformal shield 340 can comprise a top shield portion formed on the top side of encapsulant 150, and side shield portions formed on the lateral sides of encapsulant 150 and on the lateral sides of shielded substrate section 1101 of shielded substrate section 1101. In some examples, conformal shield 340 can be formed by sputtering, plating, spray coating, or plasma deposition. After formation of conformal shield 340, semiconductor device 30 and carrier 93 can be separated from each other to finalize semiconductor device 30 as shown in FIG. 7. In some examples, shield 340 can be provided when electronic component 121' or groove 3105 is in cavity 95. When carrier 93 is removed, vertical groove side 3105a and horizontal groove side 3105b can be exposed.

In some examples, conformal shield 340 can be electrically connected to conductors 112a, for example grounding conductive patterns, provided on substrate 110, or to conductor 115 or a ground plane. In some examples, electromagnetic waves generated from electronic components 121, 122 and 123 provided inside compartment 131 or encapsulant 150 can be restricted from being radiated outside compartment 131. In some examples, electromagnetic waves outside compartment 131 can be restricted from reaching electronic components 121, 122, or 123.

Because lateral sides of substrate 310 exposed by groove 3105 at exposed substrate section 3102 remain uncovered by conformal shield 340, lateral wireless communication to or from communication structures 3107, or to or from electronic components 121', can be enabled or enhanced.

FIGS. 9A to 9E show cross-sectional views of an example method for manufacturing an example semiconductor device. Aspects of the example method for manufacturing semiconductor device 30 shown in FIGS. 9A-9E can be similar to the example method for manufacturing semiconductor device 30 shown in FIGS. 8A-8F, and temporary film 410 can be used.

Figure 9A:
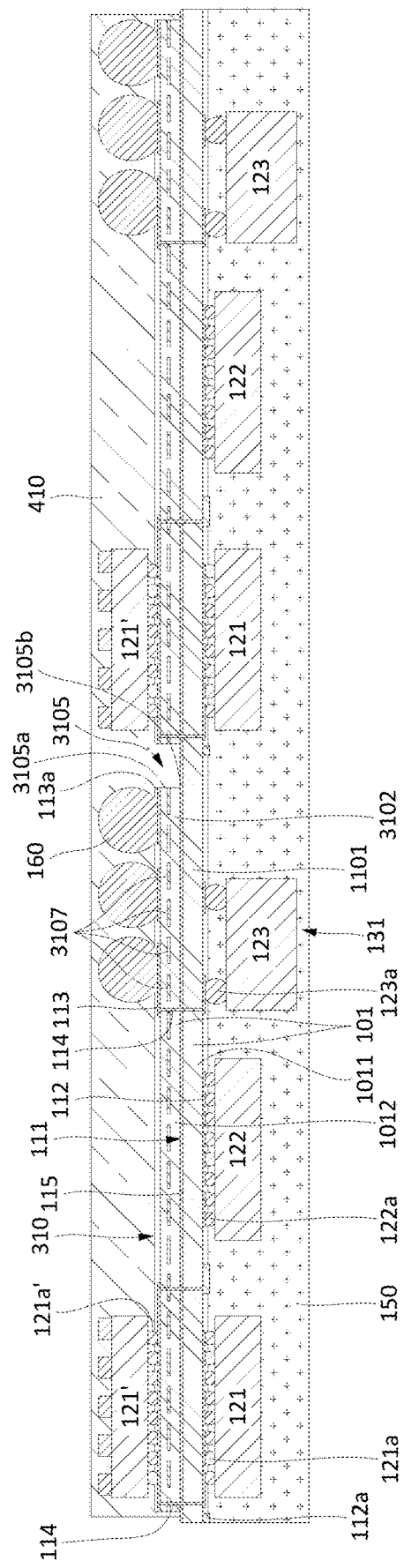
FIGS. 9A to 9E show cross-sectional views of an example method for manufacturing an example semiconductor device.

FIG. 9A shows a cross-sectional view of semiconductor device 30 at a later stage of manufacture. In some examples, the stage of FIG. 9A can occur after the stage described for FIG. 8B. In the example shown in FIG. 9A, temporary film 410 can be provided coupled to substrate 310, electronic component 121', or external interconnects 160. In some examples, substrate 310 is inverted as shown in FIG. 9A, and temporary film 410 is provided on the bottom side of substrate 310. In some examples, temporary film 410 can cover exposed substrate section 3102 of substrate 310. In some examples, temporary film 410 can cover or fill groove 3105 and can cover vertical groove side 3105a and horizontal groove side 3105b. In some examples, horizontal groove side 3105b of substrate groove 3105 can be exposed from temporary film 410.

Figure 9B:
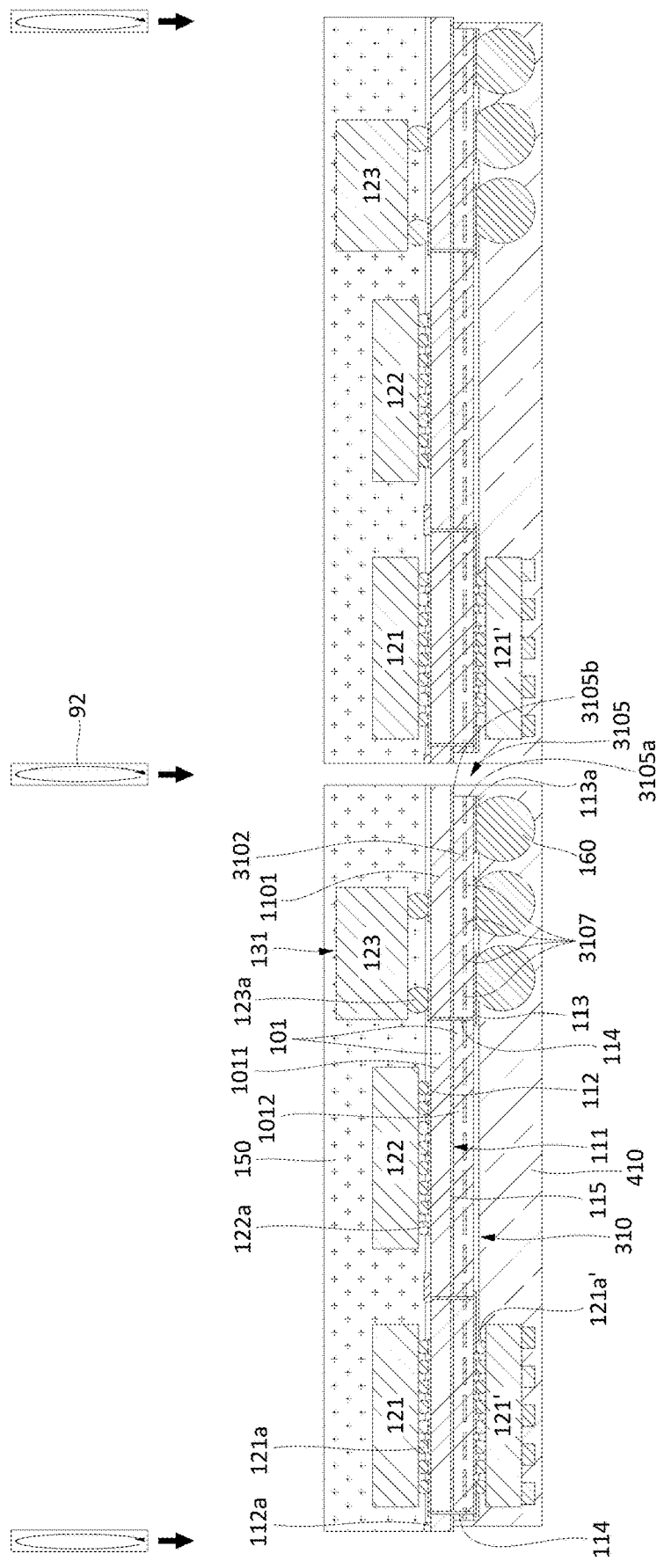

FIG. 9B shows a cross-sectional view of semiconductor device 30 at a later stage of manufacture. In some examples, the stage of FIG. 9B can be similar to the stage described for FIG. 8C. In the example shown in FIG. 9B, cutting can be performed through encapsulant 150, through shielded substrate section 1101 of substrate 310, or through temporary film 410.

Figure 9C:
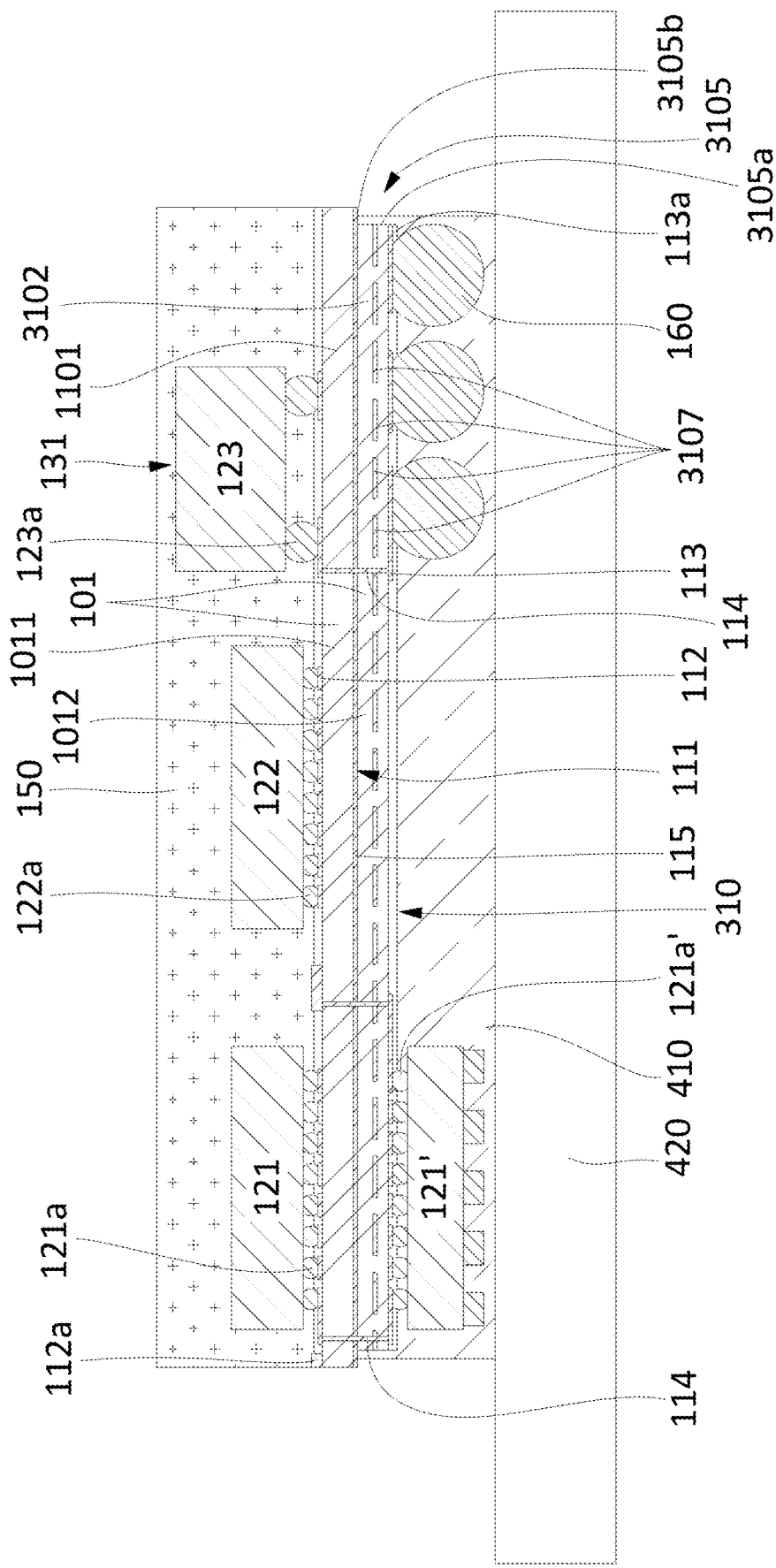

FIG. 9C shows a cross-sectional view of semiconductor device 30 at a later stage of manufacture. In some examples, the stage of FIG. 9C can be similar to the stage described for FIG. 8E or FIG. 2E. In the example shown in FIG. 9C, temporary film 410 can be mounted on carrier 420. In some examples, multiple singulated individual assemblies can be mounted on carrier 420 through respective temporary films 410. In some examples, the individual assemblies can be placed on carrier 420 after fully singulating as shown in FIG. 9B, and temporary film 410 can contact carrier 420.

Figure 9D:
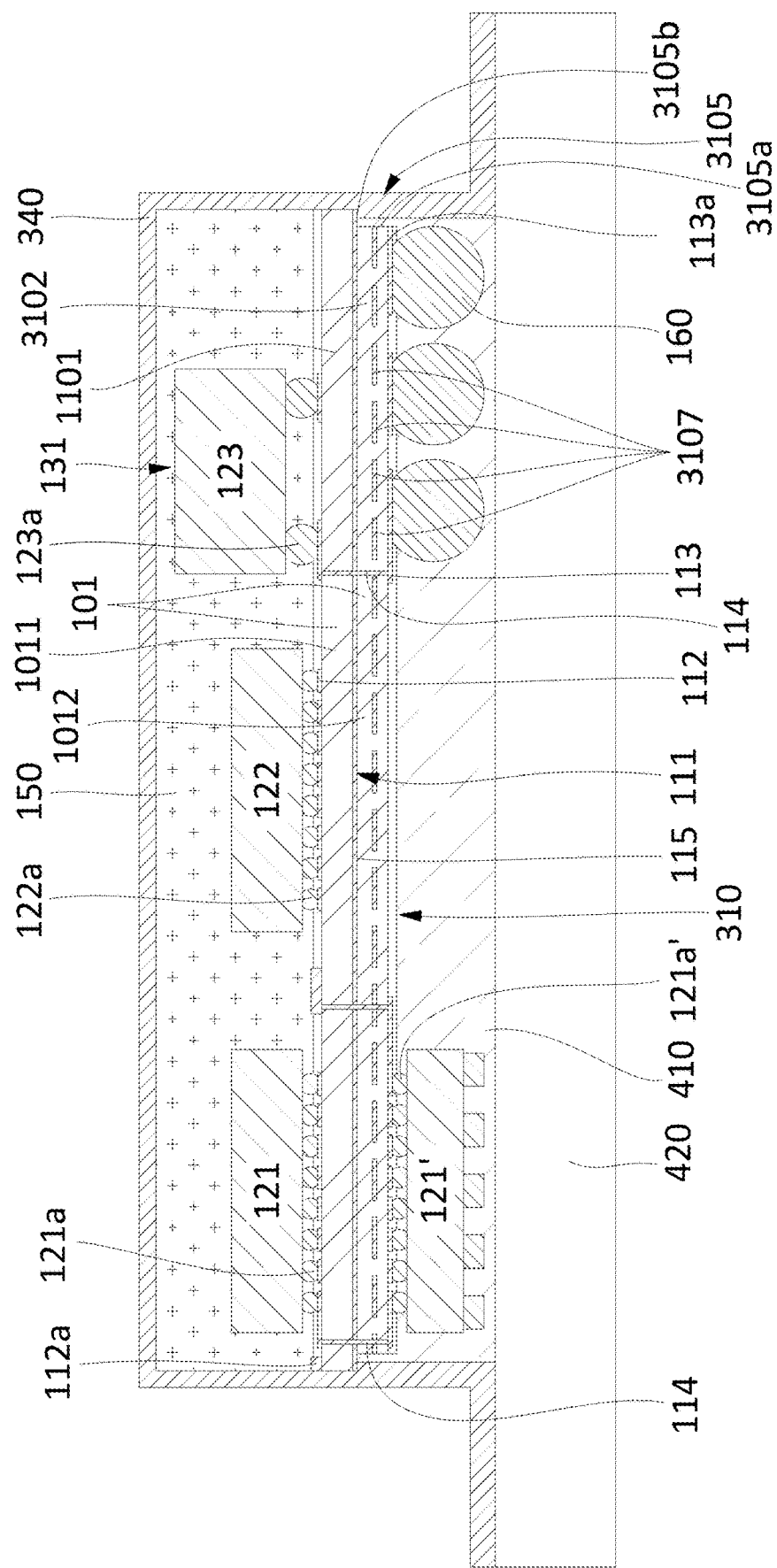

FIG. 9D shows a cross-sectional view of semiconductor device 30 at a later stage of manufacture. In some examples, the stage of FIG. 9D can be similar to the stage described for FIG. 8F or FIG. 2G. In the example shown in FIG. 9D, conformal shield 340 can be formed. In some examples, conformal shield 340 can be formed on encapsulant 150, on shielded substrate section 1101 of substrate 310, or on lateral sides of temporary film 410. In some examples, conformal shield 340 can be formed on lateral sides of shielded substrate section 1101 and can be coupled to conductors 115 or conductors 112a. In some examples, shield 340 can be formed when the individual assemblies are on carrier 420. In some examples, since the lateral sides of exposed substrate section 3102 are covered by temporary film 410, conformal shield 340 can remain separated from exposed substrate section 3102 of substrate 310.

Figure 9E:
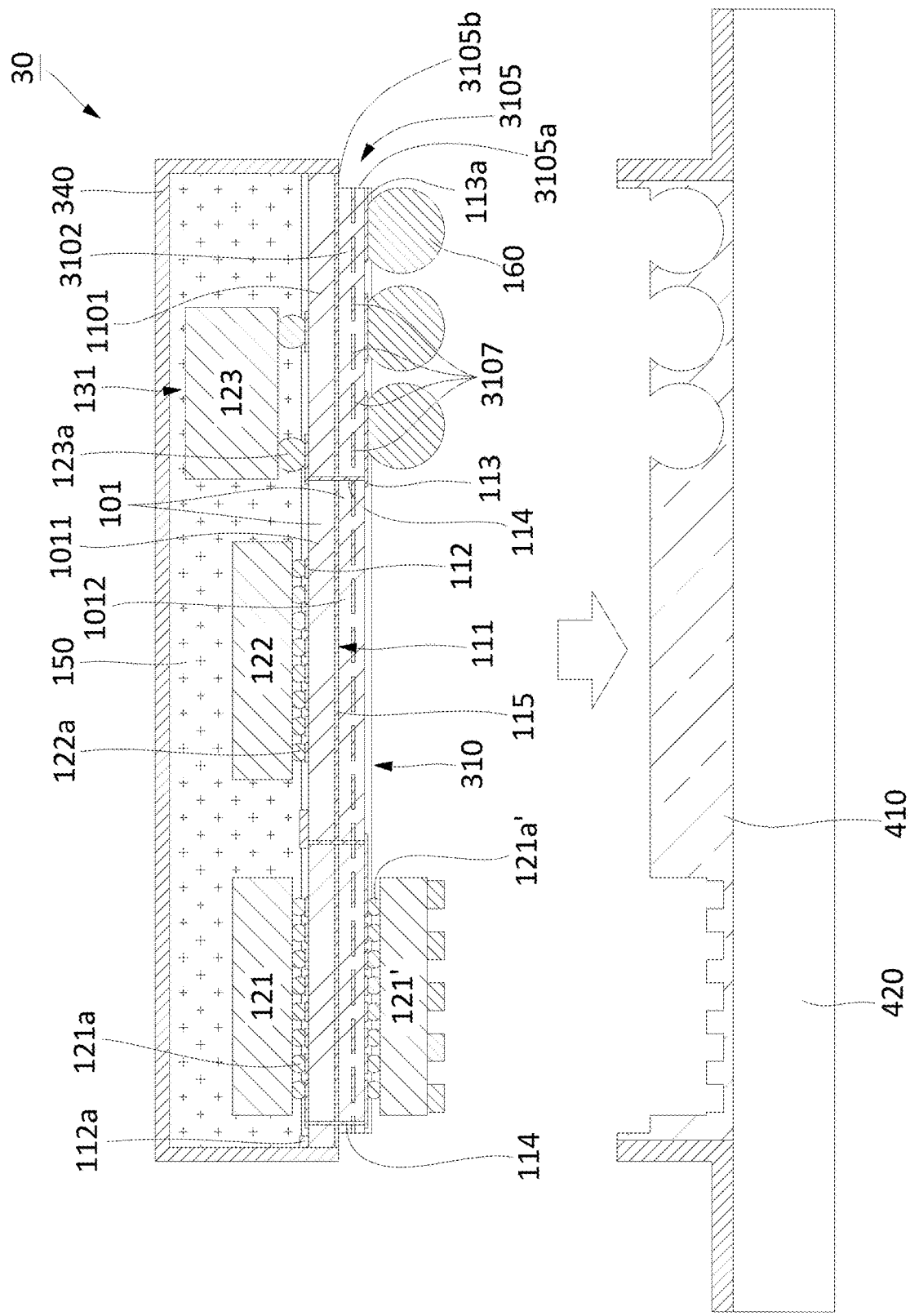

FIG. 9E shows a cross-sectional view of semiconductor device 30 at a later stage of manufacture. In some examples, the stage of FIG. 9E can be similar to the stage described for FIG. 2J.

In the example shown in FIG. 9E, temporary film 410 can be removed. In some examples, temporary film 410 can be released from substrate 310, electronic component 121' or external interconnects 160, and a bottom side of substrate 310, electronic component 121' and external interconnects 160 can be exposed. In some examples, conformal shield 340 can remain on top and lateral sides of encapsulant 150, or on lateral sides of shielded substrate section 1101, and can leave lateral sides of exposed substrate section 3102 exposed. In some examples, substrate groove 3105, for example, vertical groove side 3105a and horizontal groove side 3105b, can be exposed. In some examples, a portion of groove 3105 can be uncovered by shield 340.

FIGS. 10A to 10E show cross-sectional views of an example method for manufacturing an example semiconductor device. Aspects of the example method for manufacturing semiconductor device 30 shown in FIGS. 10A to 10E can be similar to the manufacturing method shown in FIGS. 8A-8F or the manufacturing method shown in FIGS. 9A-9E.

Figure 10A:
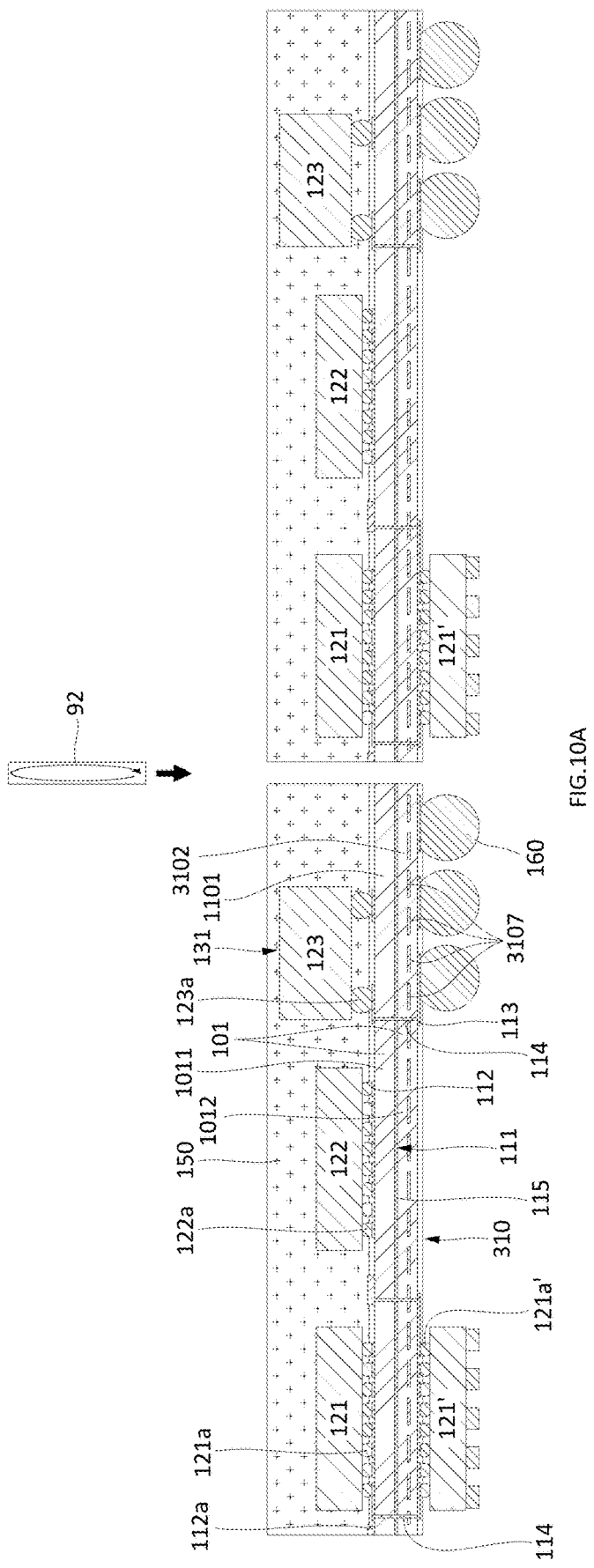
FIGS. 10A to 10E show cross-sectional views of an example method for manufacturing an example semiconductor device.

FIG. 10A shows a cross-sectional view of semiconductor device 30 at an early stage of manufacture. In some examples, the stage of FIG. 10A can occur after the stage described for FIG. 8A. In the example shown in FIG. 10A, cutting can be performed through encapsulant 150 and substrate 310. In some examples, the cutting can be performed by a full singulation process to obtain individual assemblies. As the result of the full-singulation process, lateral sides of encapsulant 150 and lateral sides of substrate 310 can be coplanar. In some examples, as the result of the full-singulation process, groove 3105 can be omitted, or lateral sides of shielded substrate section 1101 can be coplanar with lateral sides of exposed substrate section 3102, at this stage.

Figure 10B:
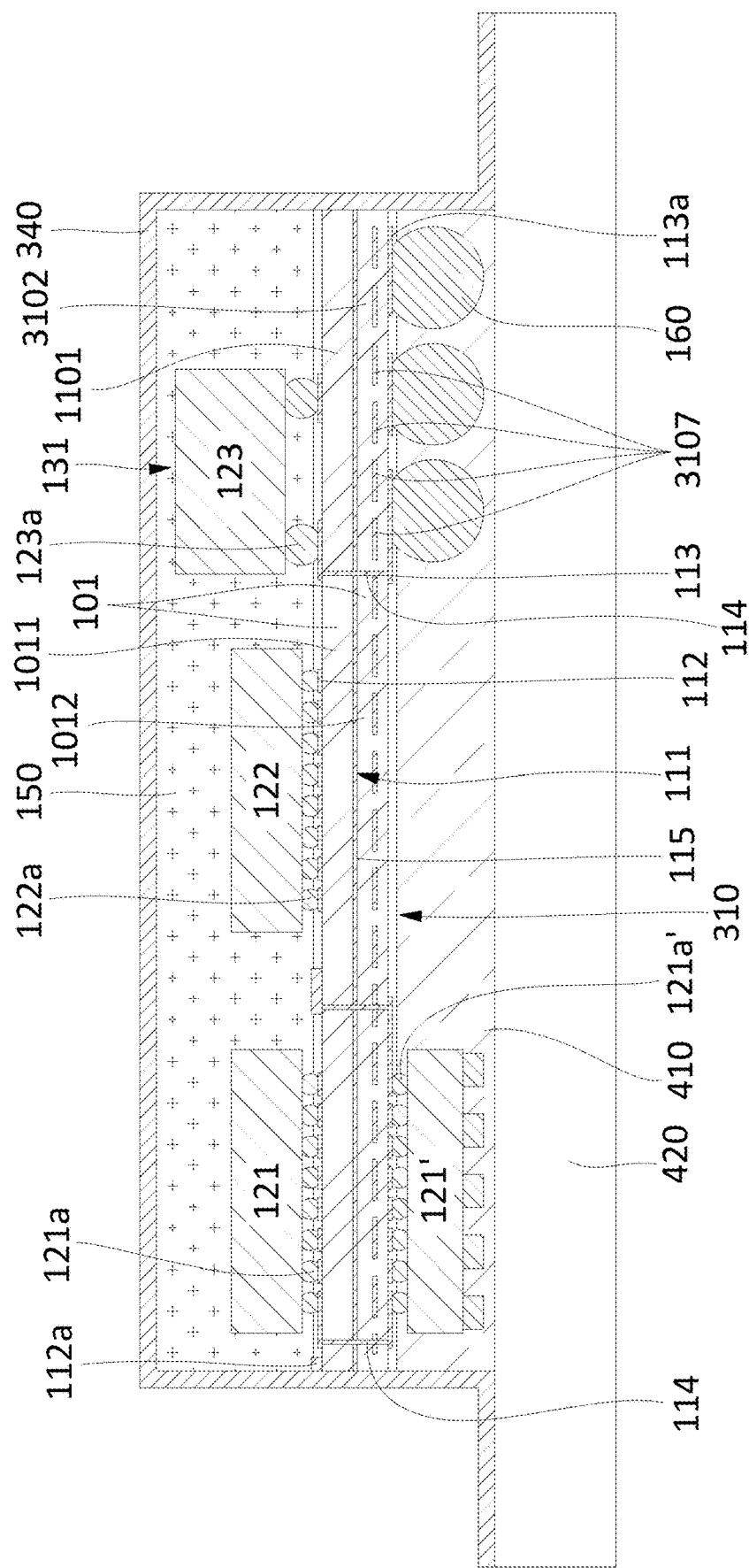

FIG. 10B shows a cross-sectional view of semiconductor device 30 at a later stage of manufacture. In the example shown in FIG. 10B, temporary film 410 is shown adhered to substrate 310, electronic component 121' and external interconnects 160. In some examples, temporary film 410 can be adhered prior to the singulation stage of FIG. 10A. The semiconductor device can be mounted to carrier 420 through temporary film 410. Multiple singulated individual assemblies can be mounted on carrier 420 through temporary film 410. Subsequently, conformal shield 340 can be formed on top and lateral sides of encapsulant 150, lateral sides of substrate 310, and lateral sides of temporary film 410. Conformal shield 340 can be formed to initially cover lateral sides of shielded substrate section 1101 and lateral sides of exposed substrate section 3102 of substrate 310.

Figure 10C:
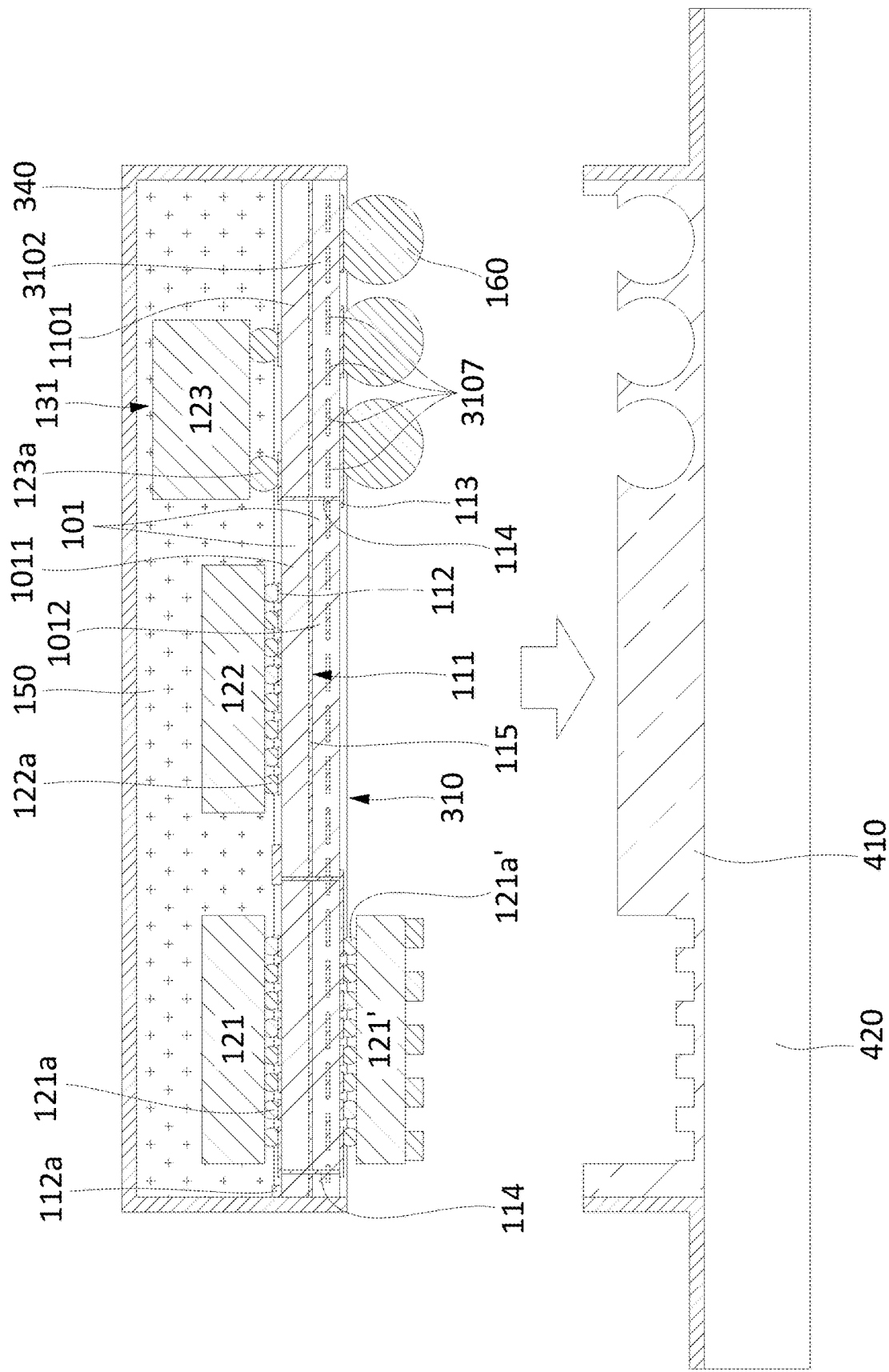

FIG. 10C shows a cross-sectional view of semiconductor device 30 at a later stage of manufacture. In the example shown in FIG. 10C, temporary film 410 can be released from substrate 310, electronic component 121' and external interconnects 160. In some examples, conformal shield 340 can remain on top and lateral sides of encapsulant 150, and lateral sides of substrate 310. In some examples, conformal shield 340 can remain still covering lateral sides of shielded substrate section 1101 and lateral sides of exposed substrate section 3102.

Figure 10D:
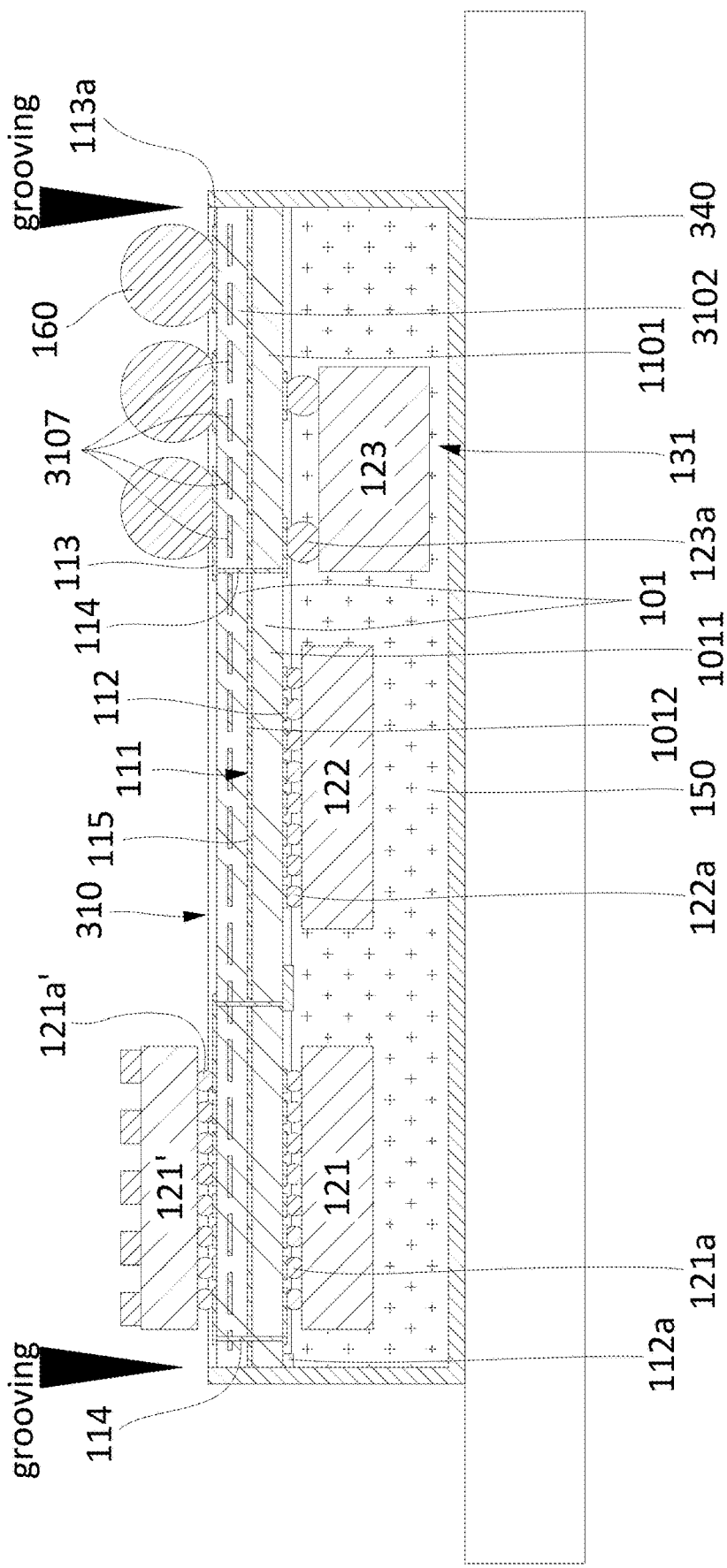
Figure 10E:
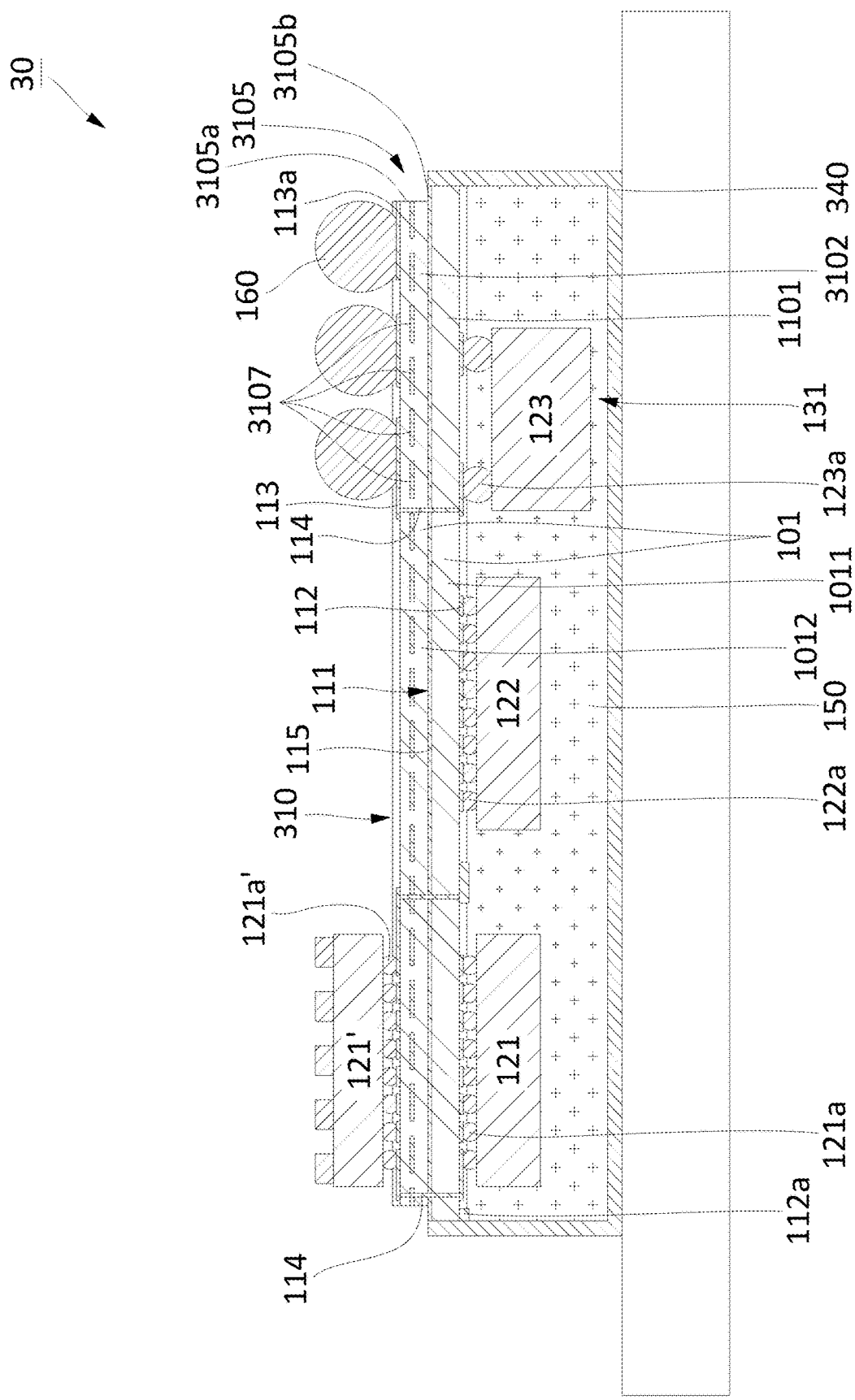

FIGS. 10D and 10E show cross-sectional views of semiconductor device 30 at a later stage of manufacture. In the example shown in FIGS. 10D and 10E, a grooving process can remove portions of substrate 310, such as by sawing or by laser beam. In some examples, lateral sides of exposed substrate section 3102, or portions of conformal shield 340 coupled to the lateral sides of exposed substrate section 3102, can be removed. After such removal, exposed substrate section 3102 can have a width smaller than that of shielded substrate section 1101. In addition, substrate groove 3105 can be formed adjacent the lateral side of exposed substrate section 3102.

In some examples, communication structures 3107 or conductor 113a can be exposed through vertical groove side 3105a. In some examples, conductor 115 can be exposed through horizontal groove side 3105b. In some examples, some regions of conductor 115 positioned on horizontal groove side 3105b can also be removed.

Laser ablation performed for removing an edge of such a semiconductor device can reduce the number of processes and/or devices required for manufacturing the semiconductor device. In some examples, even a semiconductor device's edge, which is quite difficult to be achieved by employing a sawing tool, can be achieved by employing the laser ablation. In some examples, when planarly viewed, the laser ablation can achieve a streamlined or round outline on substrate 310. In some examples, the laser ablation can achieve a streamlined or round substrate groove 3105.

Figure 11:
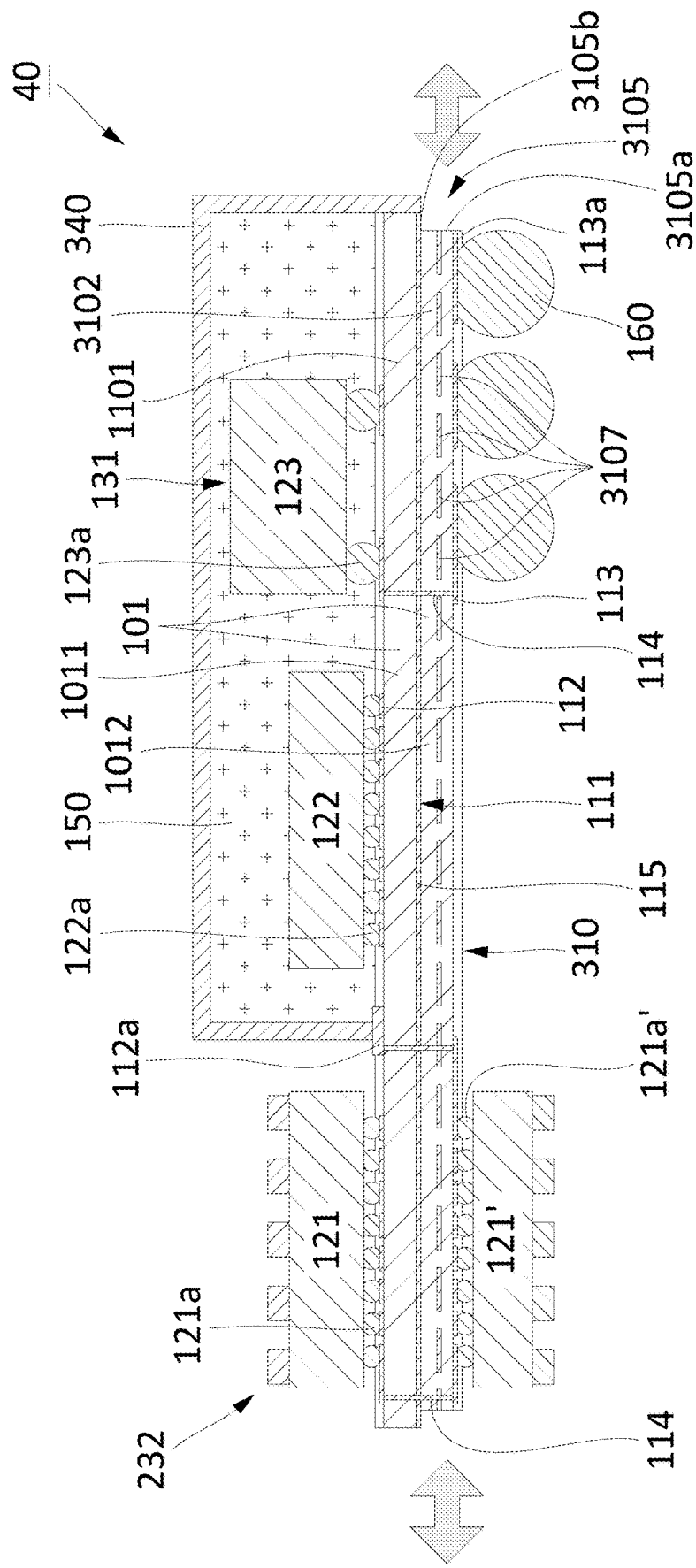
FIG. 11 shows a cross-sectional view of an example semiconductor device.

FIG. 11 shows a cross-sectional view of an example semiconductor device. Semiconductor device 40 shown in FIG. 11 can be similar to other semiconductor devices described here, such as semiconductor device 20 shown in FIG. 5 or semiconductor device 30 shown in FIG. 7. Semiconductor device 40 can be manufactured through methods or stages similar to those described here, such as those described with respect to FIG. 6, FIG. 8, FIG. 9, or FIG. 10. Semiconductor device 40 comprises a partial molding.

In the example shown in FIG. 11, semiconductor device 40 comprises substrate 310 having lateral sides of shielded substrate section 1101 covered by conformal shield 340, and lateral sides of exposed substrate section 3102 exposed by groove 3105 from conformal shield 340. Substrate 310 can comprise conductive structure 111 and can have top side and a bottom side opposite to the top side. Substrate 310 can comprise groove 3105 in the bottom side at a lateral side of substrate 310. Electronic component 121 positioned on the top side of substrate 310 and electronic component 121' positioned on the bottom side of substrate 310 can be exposed. Electronic component 121 can be on the top side of substrate 310 external to shield 340. Electronic components 122 and 123 positioned on the top side of substrate 310 can be covered by encapsulant 150. Encapsulant 150 can be over the top side of substrate 310 and can contact a latera side of electronic component 122 or electronic component 123. Conformal shield 340 can be positioned on top and lateral sides of encapsulant 150. In some examples, conformal shield 340 can be defined to be cover compartment 131 but leave compartment 232 exposed. In some examples, shield 340 can contact a lateral side of substrate 310 and can be coupled with conductive structure 111. Electronic components 121 or 121' can be coupled with substrate 310 external to encapsulant 150, for example electronic component 121 can be on the same side as encapsulant 150, or electronic component 121' can be on the side of substrate 310 opposite to the side of substrate 310 having encapsulant 150. In some examples, electronic component 121 or electronic component 121' can comprise an antenna.

Figure 12:
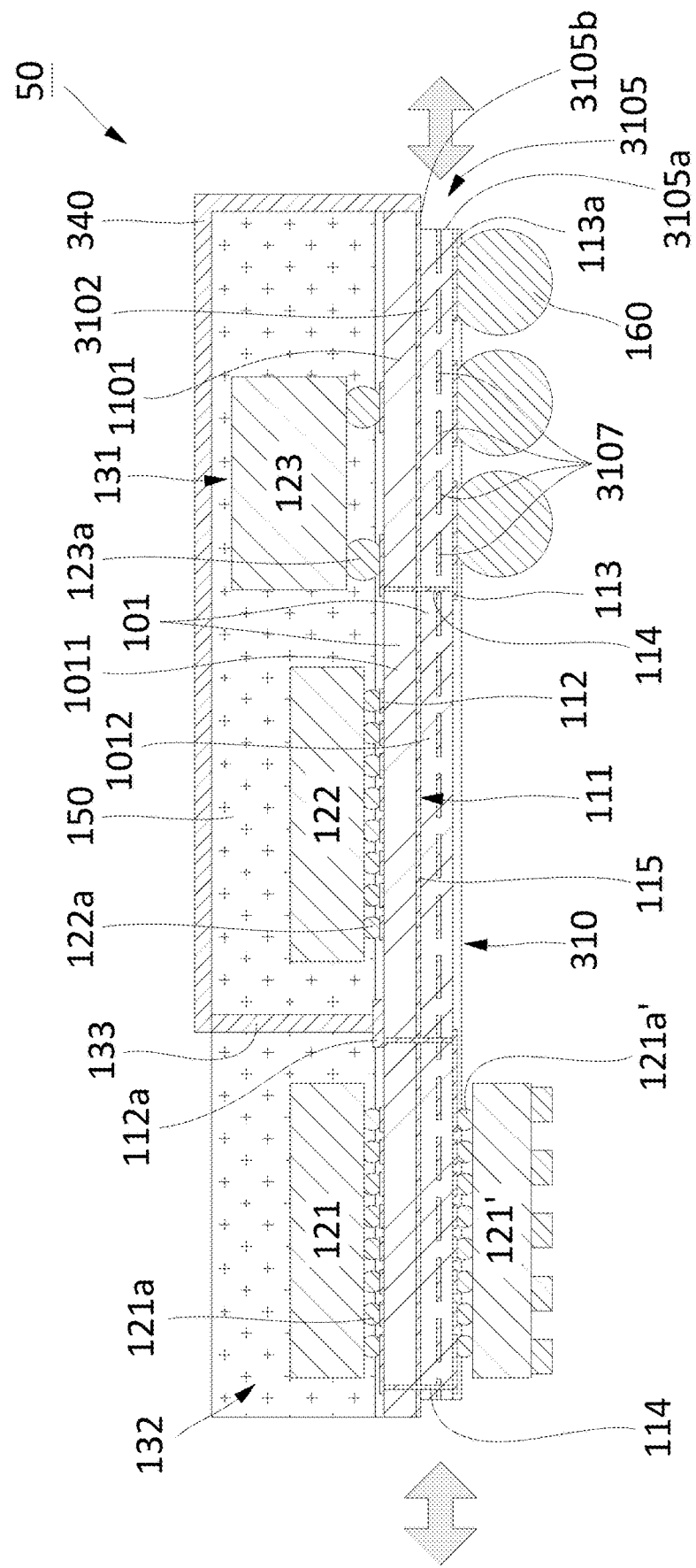
FIG. 12 shows a cross-sectional view of an example semiconductor device.

FIG. 12 shows a cross-sectional view of an example semiconductor device. Semiconductor device 50 shown in FIG. 12 can be similar to other semiconductor devices described here, such as semiconductor device 10 shown in FIG. 1 or semiconductor device 30 shown in FIG. 7. Semiconductor device 50 can be manufactured through methods or stages similar to those described here, such as those described with respect to FIGS. 2-4, FIG. 8, FIG. 9, or FIG. 10. Semiconductor device 50 comprises a partial shielding comprising conformal shield 340 and compartment wall 133. In some examples, encapsulant 150 can contact lateral sides of electronic component 121 and electronic component 122, and compartment wall 133 of shield can be between electronic component 121 and electronic component 122.

In the example shown in FIG. 12, semiconductor device 50 comprises substrate 310 having lateral sides of shielded substrate section 1101 covered by conformal shield 340, and lateral sides of exposed substrate section 3102 exposed by groove 3105 from conformal shield 340. Electronic components 121, 122, or 123 positioned on the top side of substrate 310 can be molded by encapsulant 150, wherein conformal shield 340 covers compartment 131 with electronic components 122 and 123, leaving uncovered compartment 132 with electronic component 121. In some examples, compartment wall 133 can extend through encapsulant 150, can be connected to conductor 112a of substrate 310 and to conformal shield 340, and can divide compartments 131 and 132 from each other.

Figure 13:
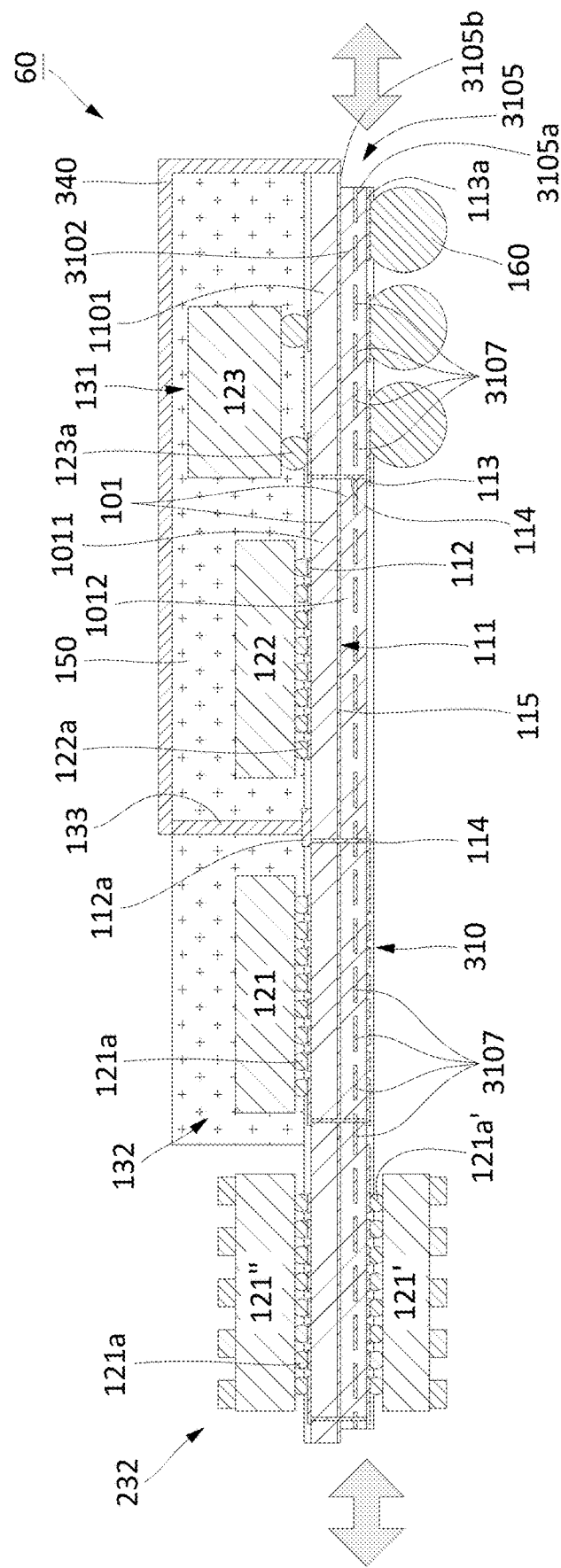
FIG. 13 shows a cross-sectional view of an example semiconductor device.

FIG. 13 shows a cross-sectional view of an example semiconductor device. Semiconductor device 60 shown in FIG. 13 can be similar to other semiconductor devices described here, such as semiconductor device 10 shown in FIG. 1, semiconductor device 20 shown in FIG. 5, semiconductor device 30 shown in FIG. 7, semiconductor device 40 shown in FIG. 11, or semiconductor device 50 shown in FIG. 12. Semiconductor device 60 can be manufactured through methods or stages similar to those described here, such as those described with respect to FIGS. 2-4, FIG. 6, FIG. 8, FIG. 9, or FIG. 10. Semiconductor device 60 can comprise a combination of aspects of semiconductor devices 40 and 50.

In the example shown in FIG. 11, semiconductor device 60 comprises substrate 310 having lateral sides of shielded substrate section 1101 covered by conformal shield 340, and lateral sides of exposed substrate section 3102 exposed by groove 3105 from conformal shield 340.

Electronic component 121" can be electrically connected to the top side of substrate 310 through interconnects 121a. Electronic component 121" can be positioned exposed from encapsulant 150, similar to electronic component 121 in FIG. 11. Electronic component 121" can be spaced apart from conformal shield 340 without being covered by conformal shield 340. Electronic component 121" can be similar to electronic components 121, 122, 123, or 121'.

In some examples, a width or a length of grounded conductor 111 can be equal to or smaller than that of substrate 310 or of shielded substrate section 1101. In some examples, the width or the length of conductor 111 can be substantially similar to that of a region of conformal shield 340 positioned on the top side of encapsulant 150. Accordingly, external electromagnetic waves can be restricted from being radiated outwards from or inwards to compartment 131 covered by conformal shield 340.

In some examples, the width or the length of each of one or more of communication structures 3107 can be equal to or less than that of substrate 310 or of exposed substrate section 3102. Communication structures 3107 can be positioned external to the electromagnetic wave shielding area formed by conformal shield 340 or grounded conductor 111 to increase the efficiency of transmitting or receiving electromagnetic waves for the semiconductor device. As an example, the semiconductor device can have increased transmitting or receiving efficiency at a frequency band of 3.5 gigahertz (GHz) to 28 GHz, or in conjunction with a Fifth Generation (5G) communication service.

The present disclosure includes reference to certain examples. It will be understood by those skilled in the art that various changes may be made, and equivalents may be substituted without departing from the scope of the disclosure. In addition, modifications may be made to the disclosed examples without departing from the scope of the present disclosure.

For instance, some embodiments can comprise a combination of different features, compartments, or components of the different examples disclosed here. As an example, a semiconductor device can comprise substrate 110 having shielded compartment 131 and covered compartment 132 as shown or discussed for FIGS. 1-4, and also having exposed compartment 232 as shown or disclosed with respect to FIGS. 5-6. It is intended that the present disclosure is not limited to the examples disclosed, but that the disclosure will include all examples falling within the scope of the appended claims.

The invention claimed is:

1. A semiconductor device, comprising:
a substrate comprising a conductive structure;
a first electronic component over the substrate;
an encapsulant over the substrate and contacting a lateral side of the first electronic component;
a shield over the encapsulant and contacting a lateral side of the encapsulant and a portion of a lateral side of the substrate; and
a communication structure coupled with the substrate;
wherein the substrate comprises a vertical groove side and a horizontal groove side defining a groove in the substrate, wherein a portion of the groove is uncovered by the shield.

2. The semiconductor device of claim 1, wherein the communication structure comprises an antenna in the substrate.

3. The semiconductor device of claim 1, wherein the communication structure is in the substrate laterally bounded by the vertical groove side, and the vertical groove side is uncovered by the shield.

4. The semiconductor device of claim 1, comprising a second electronic component coupled with the substrate, wherein the encapsulant contacts a lateral side of the second electronic component.

5. The semiconductor device of claim 1, comprising a second electronic component coupled with the substrate, wherein the second electronic component is external to the encapsulant.

6. The semiconductor device of claim 1, comprising a second electronic component coupled with the substrate, wherein the second electronic component is on a side of the substate opposite to the encapsulant.

7. The semiconductor device of claim 1, comprising a second electronic component coupled with the substrate, the second electronic component having an antenna as the communication structure.

8. The semiconductor device of claim 1, comprising a second electronic component coupled with the substrate, the second electronic component having a connector to connect with an external device.

9. A semiconductor device, comprising:
a substrate comprising a conductive structure and having a first side and a second side opposite to the first side, wherein the substrate comprises a groove in the second side at a lateral side of the substrate;
a first electronic device over the first side of the substrate;
an encapsulant over the first side of the substrate and contacting a lateral side of the electronic device;
a shield over the encapsulant and contacting a lateral side of the substrate and coupled with the conductive structure; and
a second electronic component external to the shield.

10. The semiconductor device of claim 9, wherein the second electronic component comprises an antenna.

* * * * *